US012809260B2

(12) United States Patent
Enomoto et al.

(10) Patent No.: US 12,809,260 B2
(45) Date of Patent: Nov. 24, 2026

(54) ON-PRESS DEVELOPMENT TYPE LITHOGRAPHIC PRINTING PLATE PRECURSOR, METHOD OF PREPARING LITHOGRAPHIC PRINTING PLATE, AND LITHOGRAPHIC PRINTING METHOD

(71) Applicant: FUJIFILM Corporation, Tokyo (JP)

(72) Inventors: Kazuaki Enomoto, Shizuoka (JP); Yusuke Namba, Shizuoka (JP); Keisuke Nogoshi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 561 days.

(21) Appl. No.: 18/359,391

(22) Filed: Jul. 26, 2023

(65) Prior Publication Data

US 2023/0400771 A1 Dec. 14, 2023

Related U.S. Application Data

(63) Continuation of application No. PCT/JP2022/003168, filed on Jan. 27, 2022.

(30) Foreign Application Priority Data

Jan. 28, 2021 (JP) ................................ 2021-012032
Mar. 31, 2021 (JP) ................................ 2021-061164

(51) Int. Cl.
*G03F 7/11* (2006.01)
*B41C 1/10* (2006.01)
(Continued)

(52) U.S. Cl.
CPC .............. *G03F 7/11* (2013.01); *B41C 1/1075* (2013.01); *B41F 5/00* (2013.01); *G03F 7/029* (2013.01)

(58) Field of Classification Search
CPC ......... G03F 7/11; G03F 7/029; B41C 1/1075; B41C 2210/04; B41C 2210/08;
(Continued)

(56) References Cited

U.S. PATENT DOCUMENTS 5,516,620 A 5/1996 Cheng et al.
9,366,962 B1 6/2016 Kamiya et al.
(Continued)

FOREIGN PATENT DOCUMENTS

CN 110809521 A 2/2020
EP 1011030 A1 6/2000
(Continued)

OTHER PUBLICATIONS

Extended European Search Report dated May 31, 2024 in Application No. 22745996.3.
(Continued)

*Primary Examiner* — Caleen O Sullivan
(74) *Attorney, Agent, or Firm* — Sughrue Mion, PLLC

(57) ABSTRACT

Provided are: an on-press development type planographic printing plate precursor having a support, an image-recording layer, and an overcoat layer in this order, in which a content of an inorganic compound in the overcoat layer is zero or is more than 0% by mass or less than 1% by mass with respect to a total mass of the overcoat layer, and the image-recording layer contains an infrared absorber, a polymerization initiator, a polymerizable compound, and an oil agent; and a method of preparing a planographic printing plate and a planographic printing method in which the on-press development type planographic printing plate precursor is used.

18 Claims, 2 Drawing Sheets

(51) Int. Cl.
*B41F 5/00* (2006.01)
*G03F 7/029* (2006.01)

(58) Field of Classification Search
CPC ............ B41C 2210/22; B41C 2210/24; B41C 1/1016; B41F 5/00
USPC ................................ 430/270.1, 271.1, 272.1
See application file for complete search history.

(56) References Cited

U.S. PATENT DOCUMENTS

| | | | | |
|---|---|---|---|---|
| 12,117,729 | B2 * | 10/2024 | Nogoshi | G03F 7/004 |
| 12,122,177 | B2 * | 10/2024 | Namba | C08F 220/285 |
| 12,214,582 | B2 * | 2/2025 | Enomoto | B41C 1/1016 |
| 12,365,173 | B2 * | 7/2025 | Namba | G03F 7/028 |
| 2006/0216642 | A1 | 9/2006 | Oohashi et al. | |
| 2011/0265673 | A1 | 11/2011 | Tagawa et al. | |
| 2017/0123315 | A1 | 5/2017 | Mizuno et al. | |
| 2019/0217651 | A1 | 7/2019 | Ikeyama et al. | |
| 2020/0117086 | A1 | 4/2020 | Nogoshi et al. | |
| 2020/0276851 | A1 | 9/2020 | Ikeyama et al. | |
| 2020/0353768 | A1 | 11/2020 | Ikeyama et al. | |

FOREIGN PATENT DOCUMENTS

| | | | |
|---|---|---|---|
| EP | 1 170 123 | A2 | 1/2002 |
| EP | 1 669 194 | A1 | 6/2006 |
| EP | 3 875 282 | A1 | 9/2021 |
| JP | 8-506191 | A | 7/1996 |
| JP | 2007-45144 | A | 2/2007 |
| JP | 2007-090564 | A | 4/2007 |
| JP | 2012-192724 | A | 10/2012 |
| JP | 2016-155271 | A | 9/2016 |
| JP | 2019-64269 | A | 4/2019 |
| JP | 2020-160348 | A | 10/2020 |
| WO | 2016/027886 | A1 | 2/2016 |
| WO | 2020/090996 | A1 | 5/2020 |

OTHER PUBLICATIONS

Communication issued Jul. 22, 2025 in Japanese Application No. 2022-578489.

Communication issued Jul. 10, 2025 in Chinese Application No. 202280011901.3.

Communication issued May 12, 2025 in European Application No. 22745996.3.

International Preliminary Report on Patentability (with translation of Written Opinion) dated Jul. 31, 2023, issued in International Application No. PCT/JP2022/003168.

International Search Report dated Apr. 12, 2022, issued in International Application No. PCT/JP2022/003168.

Written Opinion dated Apr. 14, 2022 issued in International Application No. PCT/JP2022/003168.

Office Action issued Nov. 10, 2025 in Chinese Patent Application No. 202280011901.3.

* cited by examiner

ON-PRESS DEVELOPMENT TYPE LITHOGRAPHIC PRINTING PLATE PRECURSOR, METHOD OF PREPARING LITHOGRAPHIC PRINTING PLATE, AND LITHOGRAPHIC PRINTING METHOD

CROSS-REFERENCE TO RELATED APPLICATION

This application is a Continuation of International Application No. PCT/JP2022/003168, filed Jan. 27, 2022, which claims priority to Japanese Patent Application No. 2021-012032, filed Jan. 28, 2021, and Japanese Patent Application No. 2021-061164, filed Mar. 31, 2021. Each of the above applications is hereby expressly incorporated by reference, in its entirety, into the present application.

BACKGROUND OF THE INVENTION

1. Field of the Invention

The present disclosure relates to an on-press development type planographic printing plate precursor, a method of preparing a planographic printing plate, and a planographic printing method.

2. Description of the Related Art

Generally, a planographic printing plate consists of a lipophilic image area that receives ink in a printing process and a hydrophilic non-image area that receives dampening water. Planographic printing (lithographic printing) is a method exploiting the mutual repulsion of water and oil-based ink, in which the lipophilic image area and the hydrophilic non-image area of a planographic printing plate are used as an ink-receiving portion and a dampening water-receiving portion (non-ink-receiving portion) respectively, the adhesiveness of ink is varied within the surface of the planographic printing plate such that only the image area receives the ink, and then printing is performed by the transfer of the ink to a printing substrate such as paper.

In the related art, in order to prepare this planographic printing plate, a planographic printing plate precursor (PS plate) has been widely used which is obtained by providing a lipophilic photosensitive resin layer (image-recording layer) on a hydrophilic support. Generally, a planographic printing plate is obtained by a plate making method of exposing a planographic printing plate precursor through an original picture such as a lith film, then keeping a portion of an image-recording layer that will be an image area while removing other unnecessary portions of the image-recording layer by dissolving such portions in an alkaline developer or an organic solvent, and forming a non-image area by exposing a surface of the hydrophilic support.

In response to the intensifying interest in the global environment, an environmental issue of waste liquid generated by wet treatments such as a development treatment has gathered more attention.

Regarding the environmental issue described above, an attempt is made to simplify development or plate making or to remove treatments. As one of simple-preparation methods, a method called "on-press development" is being carried out. That is, on-press development is a method of exposing a planographic printing plate precursor, then immediately mounting the precursor on a printer without performing development of the related art, and removing an unnecessary portion of the image-recording layer at an early stage of the ordinary printing step.

In the present disclosure, a planographic printing plate precursor that can be used for such on-press development is called "on-press development type planographic printing plate precursor"

Examples of the planographic printing plate precursors in the related art include those described in JP2019-64269A or JP2016-155271A.

JP2019-64269A describes a planographic printing plate precursor that has a water-soluble or water-dispersible negative tone image-recording layer on a hydrophilized aluminum support, in which the surface of an overcoat layer on a side opposite to a side where the image-recording layer is provided has an arithmetic mean height Sa of 0.3 μm or more and 20 μm or less, and the image-recording layer contains an infrared absorber and thermoplastic polymer particles.

JP2016-155271A describes a planographic printing plate precursor comprising a substrate and an image forming layer on the substrate, in which the image forming layer is removable with either or both of ink and dampening water and contains (A) at least one radical polymerization initiator and (B) radically polymerizable compound having at least one radically polymerizable group, at least one urethane bond, and at least two different urea bonds or having at least one radically polymerizable group, at least one urea bond, and at least two different urethane bonds.

Examples of the method of preparing a planographic printing plate of the related art include the method described in JP2020-160348A.

JP2020-160348A describes a method of preparing a planographic printing plate including, in the following order, an exposure step of exposing a positive tone planographic printing plate precursor having an image-recording layer on a support in the shape of an image, and a development step of developing the exposed positive tone planographic printing plate precursor by using a developer to form an image area and a non-image area, in which the image-recording layer contains an infrared absorber together with a polymer A having an acid group and a base group or with both a polymer B having an acid group and a polymer C having a base group, a content of the polymer A or a total content of the polymer B and the polymer C is 10% by mass or more with respect to a total mass of polymers contained in the image-recording layer, pKa of the acid group that the polymer A or the polymer B has is 9 or less, and the method does not include a rinsing step of rinsing the developed planographic printing plate precursor with water after the development step.

SUMMARY OF THE INVENTION

An object of an embodiment of the present disclosure is to provide on-press development type planographic printing plate precursor excellent in ultraviolet-curable ink (UV ink) printing durability, on-press developability, and dampening water turbidity suppressiveness.

An object of another embodiment of the present disclosure is to provide a method of preparing a planographic printing plate and a planographic printing method in which the on-press development type planographic printing plate precursor is used.

Means for achieving the above objects include the following aspects.

<1> An on-press development type planographic printing plate precursor having, in the following order, a support, an image-recording layer, and an overcoat layer, in which a content of an inorganic compound in the overcoat layer is zero or is more than 0% by mass and less than 1% by mass with respect to a total mass of the overcoat layer, and the image-recording layer contains an infrared absorber, a polymerization initiator, a polymerizable compound, and an oil agent.

<2> The on-press development type planographic printing plate precursor described in <1>, in which the oil agent includes an oil agent having a boiling point of 300 °C or higher.

<3> The on-press development type planographic printing plate precursor described in <1> or <2>, in which the oil agent includes two or more oil agents having different structures from each other.

<4> The on-press development type planographic printing plate precursor described in any one of <1> to <3>, in which a clog P value of the oil agent is 5.0 or more.

<5> The on-press development type planographic printing plate precursor described in any one of <1> to <4>, in which the oil agent includes an oil agent having an aromatic ring.

<6> The on-press development type planographic printing plate precursor described in any one of <1> to <5>, in which the oil agent includes an oil agent having a phosphorus atom.

<7> The on-press development type planographic printing plate precursor described in any one of <1> to <6>, in which the polymerization initiator includes an electron-donating polymerization initiator.

<8> The on-press development type planographic printing plate precursor described in <7>, in which the electron-donating polymerization initiator is a borate compound.

<9> The on-press development type planographic printing plate precursor described in <7> or <8>, wherein the value calculated by [HOMO of the infrared absorber]−[HOMO of the electron-donating polymerization initiator] is 0.70 eV or less.

<10> The on-press development type planographic printing plate precursor described in any one of <1> to <9>, in which the polymerization initiator includes an electron-accepting polymerization initiator, and the value calculated by [LUMO of the electron-accepting polymerization initiator]−[LUMO of the infrared absorber] is 0.70 eV or less.

<11> The on-press development type planographic printing plate precursor described in any one of <1> to <10>, in which the polymerizable compound includes a polymerizable compound having functionalities of 7 or more.

<12> The on-press development type planographic printing plate precursor described in any one of <1> to <11>, in which the polymerizable compound includes a polymerizable compound having functionalities of 10 or more.

<13> The on-press development type planographic printing plate precursor described in anyone of <1> to <12>, in which the image-recording layer further contains polymer particles.

<14> The on-press development type planographic printing plate precursor described in any one of <1> to <13>, in which the overcoat layer contains a hydrophilic polymer.

<15> The on-press development type planographic printing plate precursor described in <14>, in which the hydrophilic polymer includes a cellulose derivative.

<16> The on-press development type planographic printing plate precursor described in any one of <1> to <15>, in which the polymerizable compound includes a polymerizable compound having functionalities of 2 or less.

<17> The on-press development type planographic printing plate precursor described in <10>, in which the electron-accepting polymerization initiator includes a compound represented by Formula (II).

(II)

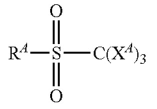

In Formula (II), $X^A$ represents a halogen atom, and $R^A$ represents an aryl group.

<18> The on-press development type planographic printing plate precursor described in any one of <1> to <17>, in which the image-recording layer further contains polyvinyl butyral.

<19> The on-press development type planographic printing plate precursor described in any one of <1> to <18>, in which the overcoat layer contains a hydrophobic polymer.

<20> The on-press development type planographic printing plate precursor described in <19>, in which the hydrophobic polymer is hydrophobic polymer particles.

<21> The on-press development type planographic printing plate precursor described in any one of <1> to <20>, in which the overcoat layer further contains a color-altering compound.

<22> The on-press development type planographic printing plate precursor described in <21>, in which the color-altering compound includes a decomposable compound that decomposes due to exposure to infrared.

<23> The on-press development type planographic printing plate precursor described in <21> or <22>, in which the color-altering compound is a cyanine dye.

<24> The on-press development type planographic printing plate precursor described in any one of <21> to <23>, in which the color-altering compound is a compound represented by Formula 1-1.

Formula 1-1

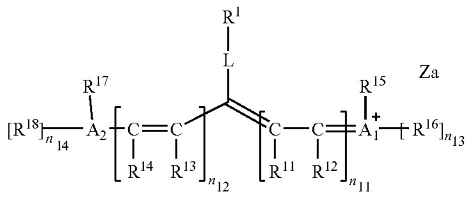

In Formula 1-1, $R^1$ represents a group that is represented by any one of Formula 2-1 to Formula 4-1, $R^{11}$ to $R^{18}$ each independently represent a hydrogen atom, a halogen atom, $—R^a$, $—OR^b$, $—SR^c$, or $—NR^dR^e$, $R^a$ to $R^e$ each independently represent a hydrocarbon group, $A_1$, $A_2$, and a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, a sum of $n_{11}$ and $n_{12}$ is 2 or more, $n_{13}$ and $n_{14}$ each independently represent 0 or 1, L represents an oxygen atom, a sulfur atom, or $—NR^{10}—$, $R^{10}$ represents a hydrogen atom, an alkyl group, or an aryl group, and Za represents a counterion that neutralizes charge.

Formula 2-1

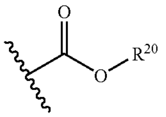

Formula 3-1

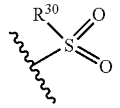

Formula 4-1

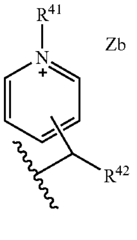

In Formula 2-1 to Formula 4-1, $R^{20}$, $R^{30}$, $R^{41}$, and $R^{42}$ each independently represent an alkyl group or an aryl group, Zb represents a counterion that neutralizes charge, a wavy line represents a bonding site with a group represented by L in Formula 1-1.

<25> The on-press development type planographic printing plate precursor described in any one of <21> to <24>, in which the color-altering compound is a compound represented by Formula 1-2.

Formula 1-2

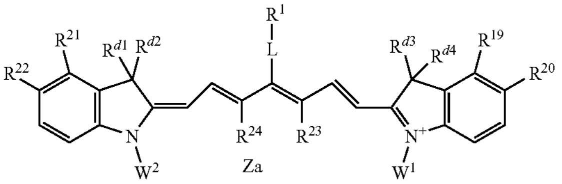

In Formula 1-2, $R^1$ represents a group that is represented by any one of Formula 2-1 to Formula 4-1, $R^{19}$ to $R^{22}$ each independently represent a hydrogen atom, a halogen atom, $—R^a$, $—OR^b$, —CN, $—SR^c$, or $—NR^dR^e$, $R^{23}$ and $R^{24}$ each independently represent a hydrogen atom or $—R^a$, $—R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or $—NR^{10}—$, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

<26> The on-press development type planographic printing plate precursor described in any one of <21> to <25>, in which the color-altering compound is a compound represented by any one of Formula 1-3, Formula 1-4, Formula 1-5, Formula 1-6, or Formula 1-7.

Formula 1-3

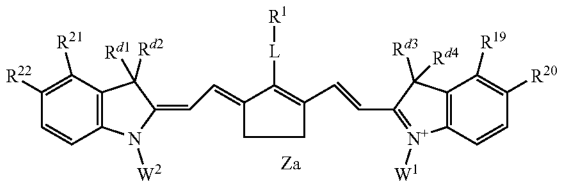

Formula 1-4

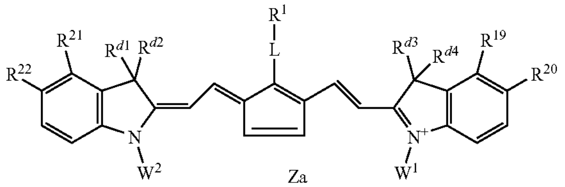

Formula 1-5

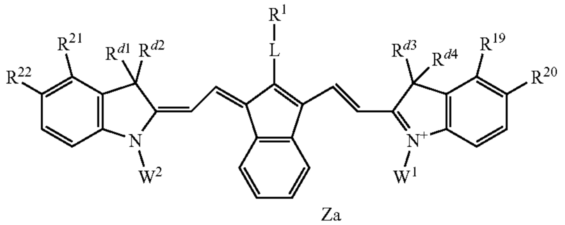

Formula 1-6

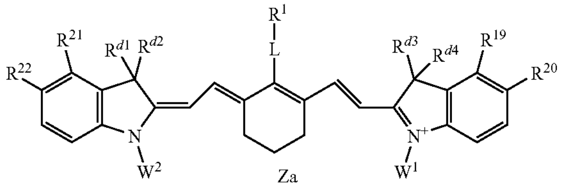

Formula 1-7

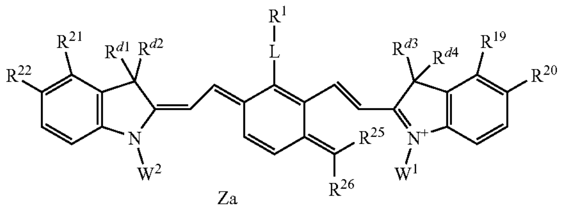

In Formula 1-3 to Formula 1-7, $R^1$ represents a group that is represented by any one of Formula 2-1 to Formula 4-1, $R^{19}$ to $R^{22}$ each independently represent a hydrogen atom, a halogen atom, $—R^a$, $—OR^b$, —CN, $—SR^c$, or $—NR^dR^e$, $R^{25}$ and $R^{26}$ each independently represent a hydrogen atom, a halogen atom, or $—R^a$, $R^a$ to $R^e$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or $—NR^{10}—$, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

<27> The on-press development type planographic printing plate precursor described in <25> or <26>, in which $W^1$ and $W^2$ in Formula 1-2 to Formula 1-7 each independently represent an alkyl group having a substituent and have at least $—OCH_2CH_2—$, a sulfo group, a salt of a sulfo group, a carboxy group, or a salt of a carboxy group as the substituent.

<28> A method of preparing a planographic printing plate, including: a step of imagewise exposing the on-press development type planographic printing plate precursor described in any one of <1> to <27>; and a step of supplying at least one selected from the group consisting of a printing ink and dampening water on a printer to remove the image-recording layer in a non-image area.

<29> A planographic printing method including: a step of imagewise exposing the on-press development type planographic printing plate precursor described in any one of <1> to <27>; a step of supplying at least one selected from the group consisting of a printing ink and dampening water to remove the image-recording layer in a non-image area to prepare a planographic printing plate on a printer; and a step of performing printing by using the obtained planographic printing plate.

According to an embodiment of the present disclosure, it is possible to provide an on-press development type planographic printing plate precursor which is excellent in UV ink printing durability, on-press developability, and dampening water turbidity suppressiveness.

According to another embodiment of the present disclosure, it is possible to provide a method of preparing a planographic printing plate and a planographic printing method using a planographic printing plate in which the on-press development type planographic printing plate precursor is used.

DESCRIPTION OF THE PREFERRED EMBODIMENTS

Figure 1:
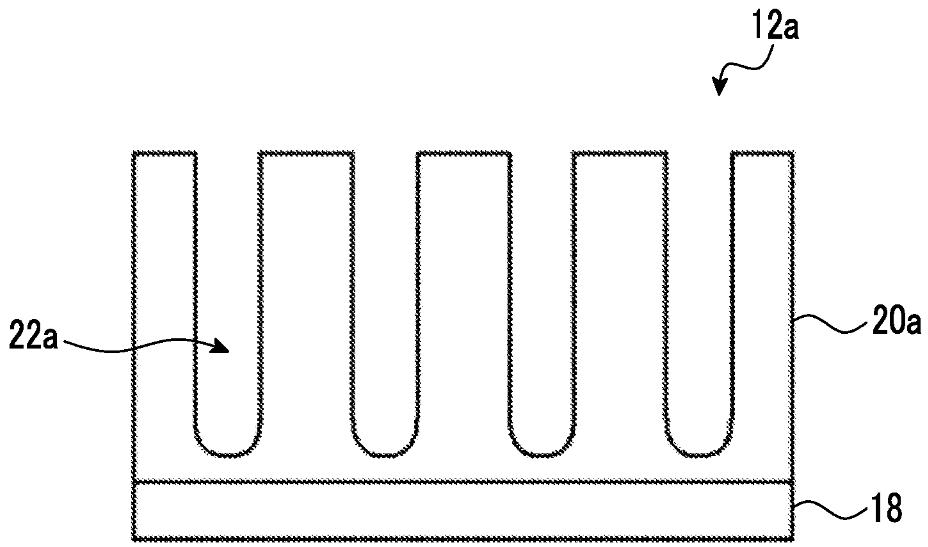
FIG. 1 is a schematic cross-sectional view of an embodiment of an aluminum support suitably used in the present disclosure.

Hereinafter, the contents of the present disclosure will be specifically described. The following configuration requirements will be described on the basis of typical embodiments of the present disclosure, but the present disclosure is not limited to such embodiments.

In the present specification, a numerical range expressed using "to" includes numerical values listed before and after "to" as the lower limit and the upper limit.

In addition, in the present specification, in a case where there is no description regarding whether a group (atomic group) is substituted or unsubstituted, such a group includes both a group having no substituent and a group having a substituent. For example, "alkyl group" includes not only an alkyl group having no substituent (unsubstituted alkyl group) but also an alkyl group having a substituent (substituted alkyl group).

In the present specification, "(meth)acryl" is a term used to explain a concept including both the acryl and methacryl, and "(meth)acryloyl" is a term used to explain a concept including both the acryloyl and methacryloyl.

In addition, the term "step" in the present specification means not only an independent step but also a step that cannot be clearly differentiated from other steps as long as the intended goal of the step is achieved. In the present disclosure, "% by mass" has the same definition as "% by weight", and "part by mass" has the same definition as "part by weight".

In the present disclosure, unless otherwise specified, as each component contained in a composition or each constitutional unit contained in a polymer, one component or one constitutional unit may be used alone, or two or more components or two or more constitutional units may be used in combination.

Furthermore, in the present disclosure, in a case where there is a plurality of substances corresponding to each component in a composition, or in a case where there is a plurality of constitutional units corresponding to each constitutional unit in a polymer, unless otherwise specified, the amount of each component in the composition or the amount of each constitutional unit in the polymer means the total amount of the plurality of corresponding substances present in the composition or the total amount of the plurality of corresponding constitutional units present in the polymer.

In the present disclosure, a combination of two or more preferred aspects is a more preferred aspect.

In addition, in the present disclosure, unless otherwise specified, each of the weight-average molecular weight (Mw) and number-average molecular weight (Mn) is a molecular weight that is detected using a gel permeation chromatography (GPC) analysis device using TSKgel GMHxL, TSKgel G4000HxL, and TSKgel G2000HxL (trade names, manufactured by Tosoh Corporation) as columns, tetrahydrofuran (THF) as a solvent, and a differential refractometer, and expressed in terms of polystyrene as a standard substance.

In the present disclosure, the term "planographic printing plate precursor" refers not only to a planographic printing plate precursor but also to a key plate precursor. In addition, the term "planographic printing plate" refers not only to a planographic printing plate prepared by performing operations such as exposure and development as necessary on a planographic printing plate precursor but also to a key plate. The key plate precursor is not necessarily subjected to the operations such as exposure and development. The key plate refers to a planographic printing plate precursor to be mounted on a plate cylinder that is not used, in a case where monochromatic or dichromatic printing is carried out on a part of paper during, for example, color newspaper printing.

In the present disclosure, "excellent in printing durability" means that a large number of sheets can be printed using a planographic printing plate, and printing durability exhibited in a case where an ultraviolet-curable ink (UV ink) used as a printing ink will be also described as "UV ink printing durability" or simply described as "UV printing durability" hereinafter.

Hereinafter, the present disclosure will be specifically described.

(On-Press Development Type Planographic Printing Plate Precursor)

The on-press development type planographic printing plate precursor (also simply called "planographic printing plate precursor") according to the present disclosure has a support, an image-recording layer, and an overcoat layer in this order, in which a content of an inorganic compound in the overcoat layer is zero or is more than 0% by mass or less than 1% by mass with respect to a total mass of the overcoat layer, and the image-recording layer contains an infrared absorber, a polymerization initiator, a polymerizable compound, and an oil agent.

The on-press development type planographic printing plate precursor according to the present disclosure may be a negative tone planographic printing plate precursor or a positive tone planographic printing plate precursor, and is preferably a negative tone planographic printing plate precursor.

The inventors of the present invention have found that sometimes the on-press development type planographic printing plate precursor of the related art is poor in at least one of UV ink printing durability, on-press developability, or dampening water turbidity suppressiveness.

As a result of intensive studies, the inventors of the present invention have found that adopting the above constitution makes it possible to provide an on-press development type planographic printing plate precursor excellent in UV ink printing durability, on-press developability, and dampening water turbidity suppressiveness.

The detailed mechanism that brings about the aforementioned effect is unclear, but is assumed to be as below.

Presumably, in a case where the content of an inorganic compound in the overcoat layer is zero or is more than 0% by mass and less than 1% by mass with respect to the total mass of the overcoat layer, and the image-recording layer contains an oil agent, dampening water turbidity caused by an inorganic compound in the overcoat layer may be suppressed, the image-recording layer could be made more hydrophobic by the oil agent, the image-recording layer and the components thereof could be inhibited from being dissolved and dispersed in the dampening water, and the image-recording layer may allow the dampening water to be more efficiently permeate into the image-recording layer by a plasticizing effect while staying hydrophobic by containing the oil agent, which may result in high UV ink printing durability and excellent on-press developability.

Hereinafter, each of the configuration requirements in the planographic printing plate precursor according to the present disclosure will be specifically described.

<Image-Recording Layer>

The planographic printing plate precursor according to the present disclosure includes a support, an image-recording layer, and an overcoat layer in this order, and the image-recording layer contains an infrared absorber, a polymerization initiator, a polymerizable compound, and an oil agent.

[Oil Agent]

The image-recording layer contains an oil agent.

In the present disclosure, an oil agent refers to a hydrophobic compound that is in a liquid state at 80 °C and is not mixed with water and separates in a case where the compound is mixed with water of the same mass.

In a case where two or more oil agents are used, the oil agents may include a compound having a melting point of 80 °C or higher as long as the two or more oil agents are in a liquid state at 80 °C in a mixed state.

In addition, from the viewpoint of on-press developability and dampening water turbidity suppressiveness, the oil agent is preferably a compound having a molecular weight less than 1,000, more preferably a compound having a molecular weight of 200 to 800, and particularly preferably a compound having a molecular weight of 300 to 500.

Furthermore, from the viewpoint of on-press developability and dampening water turbidity suppressiveness, the oil agent is preferably a compound having a boiling point of 200 °C or higher at 1 atm, more preferably a compound having a boiling point of 250 °C or higher at 1 atm, even more preferably a compound having a boiling point of 300 °C or higher at 1 atm, and particularly preferably a compound having a boiling point of 400 °C or higher and 500 °C or lower at 1 atm.

In the present disclosure, unless otherwise specified, "boiling point" means a boiling point at 1 atm.

In addition, from the viewpoint of on-press developability and dampening water turbidity suppressiveness, the melting point of the oil agent at 1 atm is preferably 50 °C or lower, more preferably 30 °C or lower, and particularly preferably −200 °C or higher and 25 °C or lower.

In the present disclosure, unless otherwise specified, "melting point" means a melting point at 1 atm.

Examples of the oil agent include a phosphoric acid ester compound, an aromatic hydrocarbon compound, a glyceride compound, a fatty acid compound, an aromatic ester compound, and the like.

Among the above, from the viewpoint of UV printing durability, receptivity, on-press developability, and dampening water turbidity suppressiveness, at least one compound selected from the group consisting of a phosphoric acid ester compound, an aromatic hydrocarbon compound, a glyceride compound, and an aromatic ester compound is preferable, at least one compound selected from the group consisting of a phosphoric acid ester compound, an aromatic hydrocarbon compound, and a glyceride compound is more preferable, at least one compound selected from the group consisting of a phosphoric acid ester compound and an aromatic hydrocarbon compound is even more preferable, and a phosphoric acid ester compound is particularly preferable.

As the phosphoric acid ester compound, from the viewpoint of UV printing durability, receptivity, on-press developability, and dampening water turbidity suppressiveness, a phosphoric acid triester compound is preferable, a phosphoric acid triaryl ester compound is more preferable, tricresyl phosphate is even more preferable, and a mixture of two or more isomers among ortho, meta, and para isomers of tricresyl phosphate is particularly preferable.

As the aromatic hydrocarbon compound, from the viewpoint of on-press developability and dampening water turbidity suppressiveness, a compound having two or more aromatic rings is preferable, and a compound having two or more unfused benzene rings is more preferable.

As the glyceride compound, from the viewpoint of on-press developability and dampening water turbidity suppressiveness, a triglyceride compound is preferable, a fatty oil is more preferable, and a fatty oil which is a liquid at 25 °C, such as castor oil, is particularly preferable.

As the fatty acid compound, from the viewpoint of on-press developability and dampening water turbidity suppressiveness, an unsaturated fatty acid is preferable, an unsaturated fatty acid having a carbon number of 8 to 30 is more preferable, and an unsaturated fatty acid having a carbon number of 12 to 24 is particularly preferable.

As the aromatic ester compound, from the viewpoint of on-press developability and dampening water turbidity suppressiveness, an aromatic diester compound is preferable, and an aromatic diester compound having an aliphatic ring is more preferable.

As the aliphatic ester compound, from the viewpoint of on-press developability and dampening water turbidity suppressiveness, an aliphatic ester compound having a branched alkyl group is preferable, and an aliphatic ester compound having a branched alkyl group and a carbon number of 10 to 24 is more preferable.

From the viewpoint of UV printing durability, receptivity, on-press developability, and dampening water turbidity suppressiveness, the oil agent preferably includes an oil agent having a phosphorus atom, and is more preferably an oil agent having a phosphorus atom.

In addition, from the viewpoint of on-press developability and dampening water turbidity suppressiveness, the oil agent preferably includes an oil agent having an aromatic ring, more preferably includes an oil agent having two or more aromatic rings, and particularly preferably includes an oil agent having two or more unfused benzene rings.

From the viewpoint of UV printing durability, receptivity, on-press developability, and dampening water turbidity suppressiveness, a Clog P value of the oil agent is preferably 5.0 or more, more preferably 5.50 or more, even more preferably 5.50 or more and 10.0 or less, and particularly preferably 5.60 or more and 7.00 or less.

The Clog P value is a value obtained by calculating the common logarithm log P of the 1-octanol/water partition coefficient P. For calculating the Clog P value, known methods and software can be used. In the present invention, unless otherwise specified, the Clog P program incorporated into ChemBioDraw Ultra 12.0 from CambridgeSoft is used.

Specific examples of the oil agent include tricresyl phosphate, dimethyl(1-phenylethyl) benzene, 2,4-diphenyl-4-methyl-1-pentene, dicyclohexylphthalate, castor oil, α-linolenic acid, tri(2-ethylhexyl) phosphate, and the like.

One oil agent may be used alone, or two or more oil agents may be used in combination. From the viewpoint of on-press developability and dampening water turbidity suppressiveness, it is preferable that the image-recording layer contain two or more oil agents having different structures.

The content of the oil agent with respect to the total mass of the image-recording layer is preferably 0.0001% by mass to 10.0% by mass, more preferably 0.0002% by mass to 1.0% by mass, even more preferably 0.0005% by mass to 0.5% by mass, and particularly preferably 0.001% by mass to 0.05% by mass.

[Infrared Absorber]

The image-recording layer in the present disclosure contains an infrared absorber.

The infrared absorber is not particularly limited, and examples thereof include pigments and dyes.

As the dye that is used as the infrared absorber, it is possible to use commercially available dyes and known dyes described in publications, for example, "Dye Handbooks" (edited by the Society of Synthetic Organic Chemistry, Japan, 1970). Specific examples thereof include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex.

Among these dyes, for example, a cyanine dye, a squarylium colorant, a pyrylium salt, a nickel thiolate complex, and an indolenine cyanine dye are preferable, and a cyanine dye or an indolenine cyanine dye is more preferable. Among these, a cyanine dye is particularly preferable.

The aforementioned infrared absorber is preferably a cationic polymethine colorant having an oxygen atom, a nitrogen atom, or a halogen atom at the meso-position. Preferred examples of the cationic polymethine colorant include a cyanine dye, a pyrylium colorant, a thiopyrylium colorant, an azulenium colorant, and the like. From the viewpoint of ease of availability, solubility in a solvent during an introduction reaction, and the like, a cyanine dye is preferable.

Specific examples of the cyanine dye include the compounds described in paragraphs "0017" to "0019" of JP2001-133969A and the compounds described in paragraphs "0016" to "0021" of JP2002-023360A and paragraphs "0012" to "0037" of JP2002-040638A. As the cyanine dye, for example, the compounds described in paragraphs "0034" to "0041" of JP2002-278057A and paragraphs "0080" to "0086" of JP2008-195018A are preferable, and the compounds described in paragraphs "0035" to "0043" of JP2007-90850A and the compounds described in paragraphs "0105" to "0113" of JP2012-206495A are particularly preferable.

Furthermore, the compounds described in paragraphs "0008" and "0009" of JP1993-5005A (JP-H05-5005A) and paragraphs "0022" to "0025" of JP2001-222101A can also be preferably used. As pigments, the compounds described in paragraphs "0072" and "0076" of JP2008-195018A are preferable.

In addition, as the aforementioned infrared absorber, a decomposable compound that decomposes due to exposure to infrared, which will be described later as a color-altering compound of the overcoat layer, is also suitably used.

From the viewpoint of printing durability and visibility, the highest occupied molecular orbital (HOMO) of the infrared absorber is preferably −5.250 eV or less, more preferably −5.30 eV or less, even more preferably −5.80 eV or more and −5.35 eV or less, and particularly preferably −5.65 eV or more and −5.40 eV or less.

From the viewpoint of temporal stability, sensitivity improvement, and UV printing durability, the lowest unoccupied molecular orbital (LUMO) of the infrared absorber is preferably less than −3.70 eV, more preferably less than −3.80 eV, even more preferably −4.20 eV or more and less than −3.80 eV, and particularly preferably −4.00 eV or more and less than −3.80 eV.

One infrared absorber may be used alone, or two or more infrared absorbers may be used in combination. From the viewpoint of UV printing durability, on-press developability, and dampening water turbidity suppressiveness, the image-recording layer preferably contains two or more infrared absorbers, more preferably contains two to four infrared absorbers, and particularly preferably contains two infrared absorbers.

In addition, as the infrared absorber, a pigment and a dye may be used in combination.

The content of the infrared absorber with respect to the total mass of the image-recording layer is preferably 0.1% by mass to 10.0% by mass, and more preferably 0.5% by mass to 5.0% by mass.

[Polymerization Initiator]

The image-recording layer in the planographic printing plate precursor according to the present disclosure contains a polymerization initiator.

The polymerization initiator preferably includes an electron-donating polymerization initiator, and more preferably includes an electron-accepting polymerization initiator and an electron-donating polymerization initiator.

From the viewpoint of visibility of exposed portions and tone reproducibility, the image-recording layer preferably further contains a polymerization initiator and the decomposition product generated by the exposure is preferably a decomposition product generated by exposure of the polymerization initiator, and the image-recording layer more preferably further contains an electron-donating polymerization initiator and the decomposition product generated by the exposure is more preferably a decomposition product generated by exposure of the electron-donating polymerization initiator.

[Electron-Donating Polymerization Initiator (Polymerization Aid)]

It is preferable that the image-recording layer in the planographic printing plate precursor according to the present disclosure further contain an electron-donating polymerization initiator (also called "polymerization aid") as a polymerization initiator.

The electron-donating polymerization initiator is a compound which donates one electron by intermolecular electron migration to an orbit of an infrared absorber that has lost one electron in a case where electrons of the infrared absorber are excited or perform intramolecular migration by exposure to infrared, and thus generates polymerization initiation species such as radicals.

The electron-donating polymerization initiator is preferably an electron-donating radical polymerization initiator.

From the viewpoint of visibility of exposed portions and tone reproducibility, the electron-donating polymerization initiator preferably includes a boron compound, more preferably includes a borate compound, even more preferably includes a tetraaryl borate compound, and particularly preferably includes a tetraphenylborate compound.

From the viewpoint of printing durability and visibility, the borate compound is preferably a tetraaryl borate compound or a monoalkyl triaryl borate compound, and more preferably a tetraaryl borate compound.

From the viewpoint of printing durability and visibility, the borate compound is preferably a tetraaryl borate compound having one or more electron-donating groups or electron withdrawing groups, and more preferably a tetraaryl borate compound having one electron-donating group or electron withdrawing group in each aryl group.

From the viewpoint of printing durability and visibility, the aforementioned electron-donating group is preferably an alkyl group or an alkoxy group, and more preferably an alkoxy group.

From the viewpoint of decomposition properties and visibility, examples of the electron withdrawing group include a halogen atom, an alkyl halide group, an acyl group, a carboxy group, and the like.

A countercation that the borate compound has is not particularly limited, but is preferably an alkali metal ion or a tetraalkyl ammonium ion and more preferably a sodium ion, a potassium ion, or a tetrabutylammonium ion.

The countercation that the borate compound has may also be a cationic polymethine colorant in the infrared absorber described in the present specification. For example, the aforementioned borate compound may be used as the countercation of the cyanine dye.

Specifically, preferred examples of the borate compound include sodium tetraphenyl borate.

Specifically, as the electron-donating polymerization initiator, for example, the following B-1 to B-9 are preferable. It goes without saying that the present disclosure is not limited thereto. In the following chemical formulas, Ph represents a phenyl group, and Bu represents an n-butyl group.

B-1

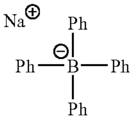

-continued

B-2

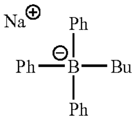

B-3

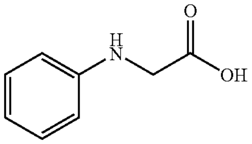

B-4

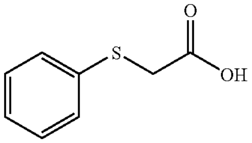

B-5

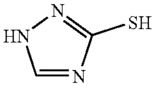

B-6

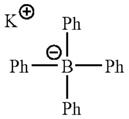

B-7

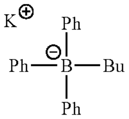

B-8

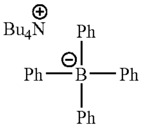

B-9

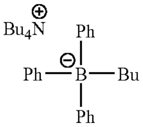

From the viewpoint of sensitivity improvement, the highest occupied molecular orbital (HOMO) of the electron-donating polymerization initiator is preferably −6.00 eV or more, more preferably −5.95 eV or more, even more preferably −5.93 eV or more, and particularly preferably more than −5.90 eV.

The upper limit of HOMO is preferably −5.00 eV or less, and more preferably −5.40 eV or less.

One electron-donating polymerization initiator may be used alone, or two or more electron-donating polymerization initiators may be used in combination.

From the viewpoint of sensitivity and printing durability, the content of the electron-donating polymerization initiator with respect to the total mass of the image-recording layer is preferably 0.01% by mass to 30% by mass, more preferably 0.05% by mass to 25% by mass, and even more preferably 0.1% by mass to 20% by mass.

From the viewpoint of UV printing durability, the content of the electron-donating polymerization initiator in the image-recording layer is preferably higher than the content of the infrared absorber, more preferably 1.1 to 5 times the content of the infrared absorber, and particularly preferably 1.5 to 3 times the content of the infrared absorber.

In the present disclosure, the polymerization initiator may be a compound in the form of conjugate salt of an electron-donating polymerization initiator and an electron-accepting polymerization initiator.

For example, in the present disclosure, the polymerization initiator is preferably a compound in the form of a conjugate salt of an anion in the electron-donating polymerization initiator and a cation in the electron-accepting polymerization initiator, more preferably a compound in the form of a conjugate salt of an onium cation and a borate anion, even more preferably a compound in the form of a conjugate salt of an iodonium cation or sulfonium cation and a borate anion, and particularly preferably a compound in the form of a conjugate salt of a diaryliodonium cation or a triarylsulfonium cation and a tetraarylborate anion.

Preferred aspects of the anion in the electron-donating polymerization initiator and the cation in the electron-accepting polymerization initiator are the same as the preferred aspects of the anion in the aforementioned electron-donating polymerization initiator and the cation in the aforementioned electron-accepting polymerization initiator.

In a case where the image-recording layer contains an anion as an electron-donating polymerization initiator and a cation as an electron-accepting polymerization initiator (that is, in a case where the image-recording layer contains a compound in the form of a conjugate salt described above), the image-recording layer is regarded as containing an electron-accepting polymerization initiator and an electron-donating polymerization initiator.

The compound in the form of a conjugate salt of an electron-donating polymerization initiator and an electron-accepting polymerization initiator may be used as an electron-donating polymerization initiator or an electron-accepting polymerization initiator.

The compound in the form of a conjugate salt of an electron-donating polymerization initiator and an electron-accepting polymerization initiator may be used in combination with the aforementioned electron-donating polymerization initiator or used in combination with the aforementioned electron-accepting polymerization initiator.

The image-recording layer of the present disclosure further contains an infrared absorber and an electron-donating polymerization initiator. From the viewpoint of sensitivity improvement and printing durability, HOMO of the infrared absorber−HOMO of the electron-donating polymerization initiator is preferably 0.70 eV or less, more preferably 0.60 eV or less, even more preferably 0.50 eV or less, and particularly preferably 0.50 eV to −0.10 eV.

The negative sign means that HOMO of the electron-donating polymerization initiator is higher than HOMO of the infrared absorber.

In the present disclosure, the energy of molecular orbital (MO) such as the highest occupied molecular orbital (HOMO) and the lowest unoccupied molecular orbital (LUMO) is calculated by the following methods.

First, free counterions in the compound as a calculation object are excluded from the calculation object. For example, for a cationic electron-accepting polymerization initiator and a cationic infrared absorber, counteranions are excluded from the calculation object, and for an anionic electron-donating polymerization initiator, countercations are excluded from the calculation object. "Free" mentioned herein means that the compound as an object and the counterions thereof are not covalently linked to each other.

The structural optimization is carried out by DFT (B3LYP/6-31G(d)) using quantum chemical calculation software Gaussian 16.

The MO energy is calculated by DFT (B3LYP/6-31+G (d,p)/PCM (solvent=methanol)) with quantum chemical calculation software Gaussian16 by using the optimum structure obtained by the structural optimization. For an iodine-containing compound, the MO energy is calculated under the condition of DFT (B3LYP/DGDZVP/PCM (solvent=methanol)).

The optimum structure mentioned herein means a structure in which the total energy obtained by DFT calculation is the most stable. The most stable structure is found by repeating the structural optimization as necessary.

By the following formula, the MO energy Ebare (unit: hartree) obtained by the above MO energy calculation is converted into Escaled (unit: eV) used as the values of HOMO and LUMO in the present disclosure.

$$\text{Escaled}=0.823168\times 27.2114\times \text{Ebare}-1.07634 \quad \text{[Calculation formula for HOMO]}$$

$$\text{Escaled}=0.820139\times 27.2114\times \text{Ebare}-1.086039 \quad \text{[Calculation formula for LUMO]}$$

27.2114 is simply a coefficient for converting hartree into eV, and 0.823168 and −1.07634 used for calculating HOMO and 0.820139 and −1.086039 used for calculating LUMO are adjustment coefficients. These are determined such that the calculated values of HOMO and LUMO of the compound as a calculation object match the measured values.

[Electron-Accepting Polymerization Initiator]

It is preferable that the image-recording layer in the present disclosure further contain an electron-accepting polymerization initiator as a polymerization initiator.

The electron-accepting polymerization initiator is a compound which accepts an electron by intermolecular electron migration in a case where electrons of an infrared absorber are excited by exposure to infrared, and generates a polymerization initiation species such as radicals.

The electron-accepting polymerization initiator is a compound that generates a polymerization initiation species such as a radical or a cation by either or both of light energy and heat energy, and can be appropriately selected from known thermal polymerization initiators, compounds having a bond that requires low bond dissociation energy, photopolymerization initiators, and the like.

The electron-accepting polymerization initiator is preferably a radical polymerization initiator and more preferably an onium salt compound.

In addition, as the electron-accepting polymerization initiator, an infrared-ray-sensitive polymerization initiator is preferable.

From the viewpoint of sensitivity improvement and UV printing durability, the electron-accepting polymerization initiator is preferably an iodonium salt compound or a compound having an alkyl halide group, and more preferably a compound having an alkyl halide group.

In addition, from the viewpoint of sensitivity improvement and UV printing durability, the compound having an alkyl halide group is preferably a compound having a perhalogenoalkylsulfonyl group, more preferably a compound having a trihalogenomethylsulfonyl group, and particularly preferably a compound having a tribromomethylsulfonyl group.

Among the above electron-accepting polymerization initiators, from the viewpoint of curing properties, an oxime ester compound and an onium salt compound are preferable. Particularly, from the viewpoint of printing durability, an iodonium salt compound, a sulfonium salt compound, or an azinium salt compound is preferable, an iodonium salt compound or a sulfonium salt compound is more preferable, and an iodonium salt compound is particularly preferable.

Specific examples of these compounds will be shown below, but the present disclosure is not limited thereto.

As the iodonium salt compound, for example, a diaryliodonium salt compound is preferable. Particularly, an electron-donating group, for example, a diphenyl iodonium salt compound substituted with an electron-donating group such as an alkyl group or an alkoxyl group is more preferable. Furthermore, an asymmetric diphenyl iodonium salt compound is preferable. Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis (4-t-butylphenyl)iodonium=hexafluorophosphate.

Examples of counteranions of the iodonium salt compound and the sulfonium salt compound include a sulfonate anion, a carboxylate anion, a tetrafluoroborate anion, a hexafluorophosphate anion, a p-toluene sulfonate anion, a tosylate anion, a sulfonamide anion, and a sulfonimide anion.

Among the above, a sulfonamide anion or a sulfonimide anion is preferable, and a sulfonimide anion is more preferable.

As the sulfonamide anion, an aryl sulfonamide anion is preferable.

As the sulfonimide anion, a bisaryl sulfonimide anion is preferable.

Specific examples of the sulfonamide anion and the sulfonimide anion include those described in WO2019/013268A.

From the viewpoint of temporal visibility after exposure, developability, and UV printing durability of the planographic printing plate to be obtained, the aforementioned electron-accepting polymerization initiator preferably includes a compound represented by Formula (II) or Formula (III), and particularly preferably includes a compound represented by Formula (II).

(II)

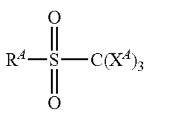

(III)

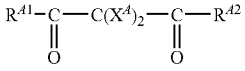

In Formula (II) and Formula (III), $X^A$ represents a halogen atom, and $R^A$, $R^{A1}$, and $R^{A2}$ each independently represent a monovalent hydrocarbon group having 1 to 20 carbon atoms.

$R^A$ in Formula (II) is preferably an aryl group.

Examples of $X^A$ in Formula (II) and Formula (III) include a fluorine atom, a chlorine atom, a bromine atom, and an iodine atom. Among these, a chlorine atom or a bromine atom is preferable because these have excellent sensitivity, and a bromine atom is particularly preferable.

$R^A$, $R^{A1}$, and $R^{A2}$ in Formula (II) and Formula (III) preferably each independently represent an aryl group. Particularly, from the viewpoint of excellent balance between sensitivity and storage stability, $R^A$, $R^{A1}$, and $R^{A2}$ more preferably each independently represent an aryl group substituted with an amide group.

The aforementioned electron-accepting polymerization initiator particularly preferably includes a compound represented by Formula (IV).

(IV)

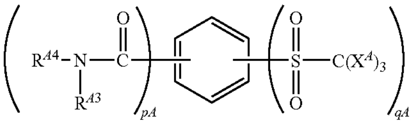

In Formula (IV), $X^A$ represents a halogen atom, $R^{A3}$ and $R^{A4}$ each independently represent a hydrogen atom or a monovalent hydrocarbon group having 1 to 20 carbon atoms, and pA and qA each independently represent an integer of 1 to 5. Here, pA+qA=2 to 6.

Specific examples of the electron-accepting polymerization initiator include compounds represented by the following formulas. However, the present disclosure is not limited thereto.

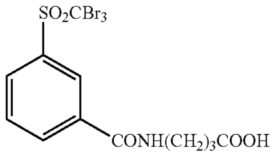

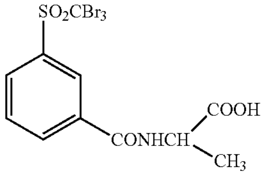

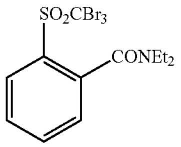

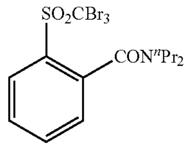

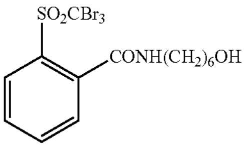

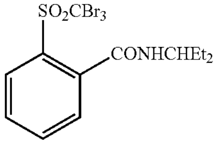

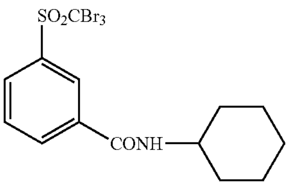

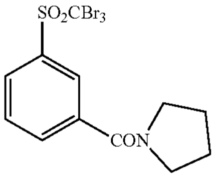

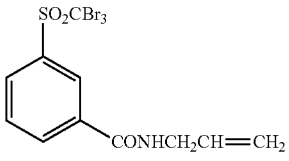

-continued
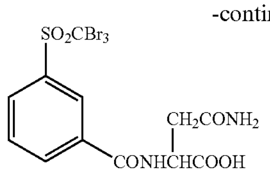
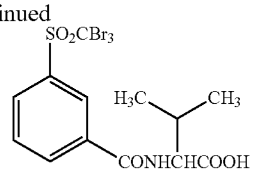
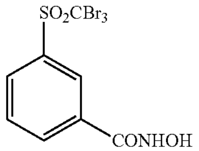
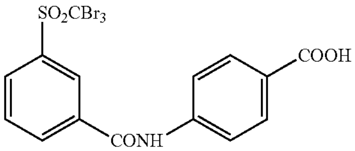
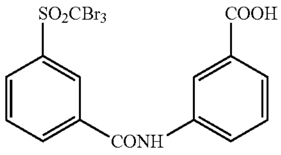
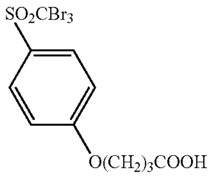
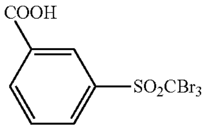
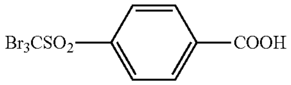
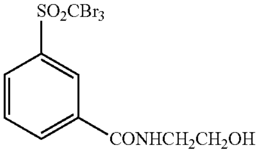
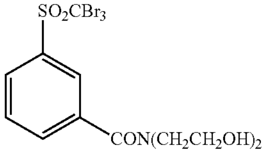
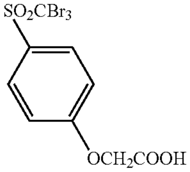
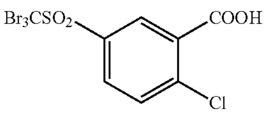
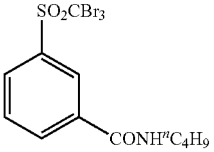
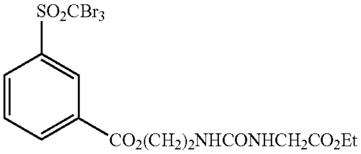
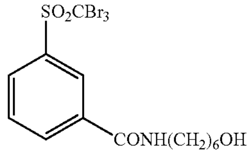
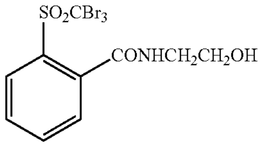
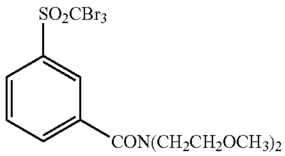
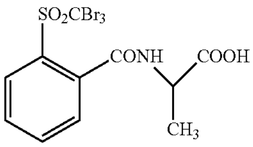
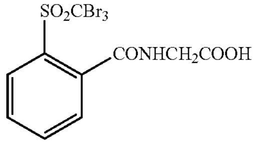
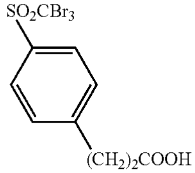
-continued
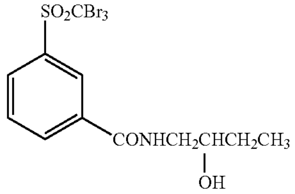
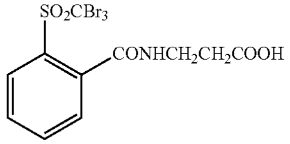
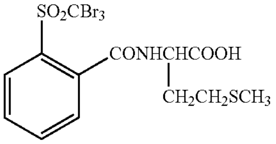
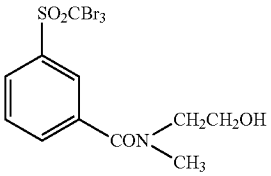
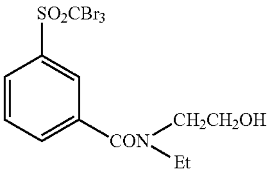
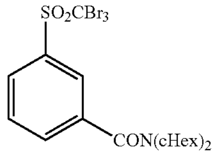
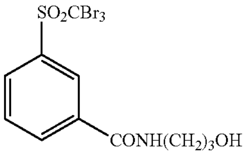
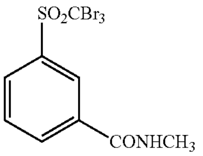
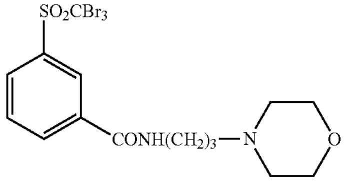
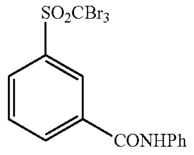
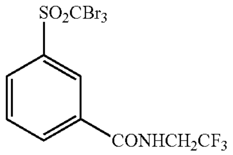
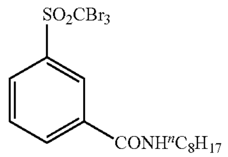
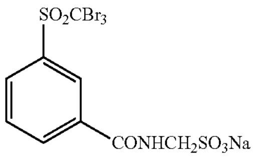
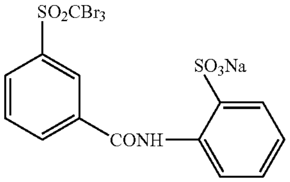
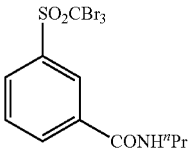
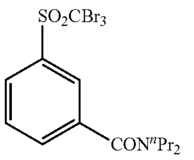
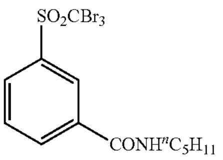
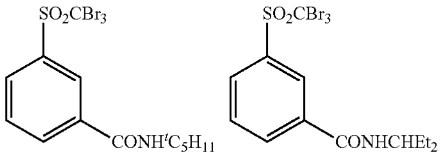

-continued
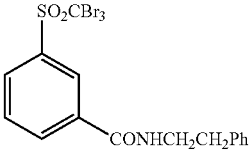
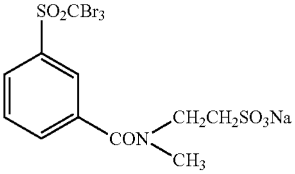
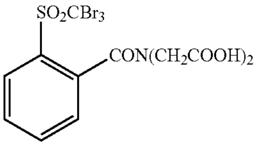
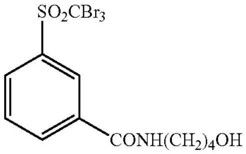
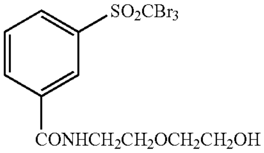
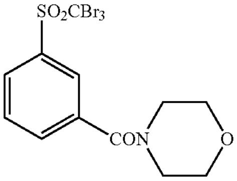
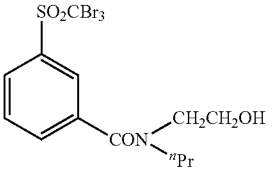
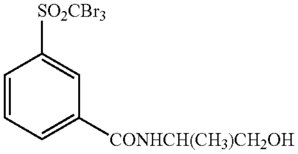
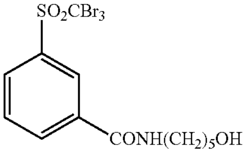
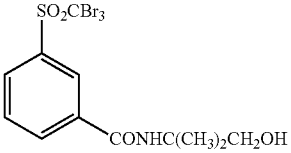
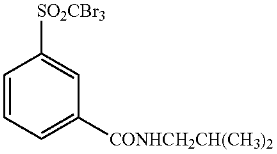
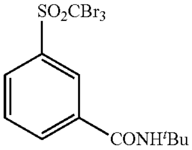
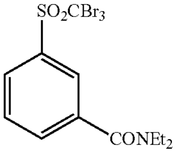
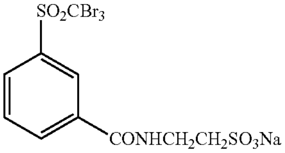
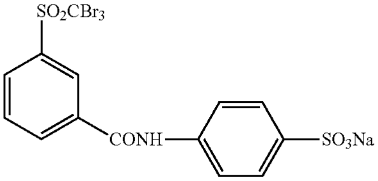
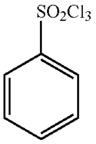
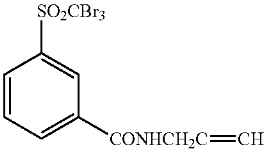
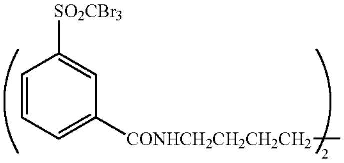
-continued
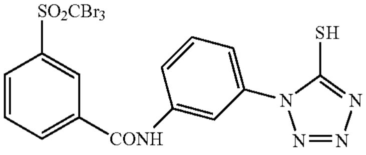
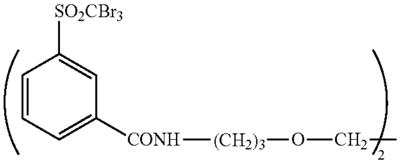
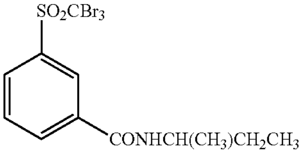
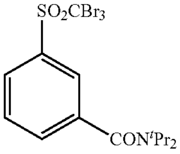
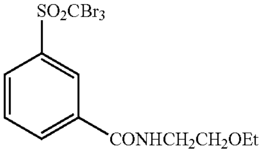
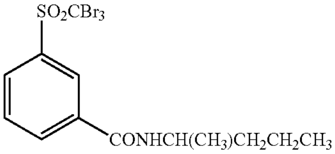
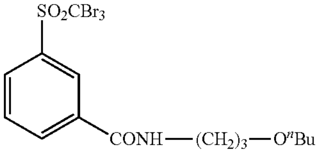
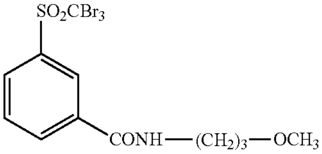
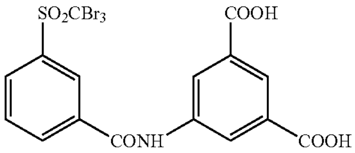
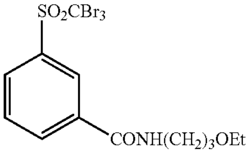
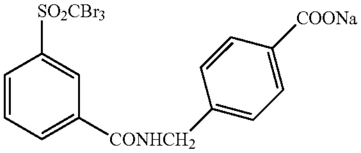
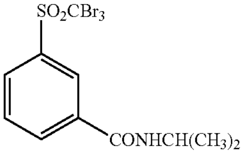

-continued
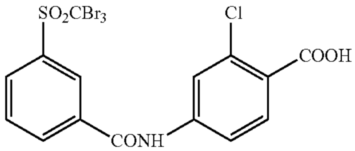
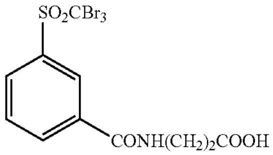
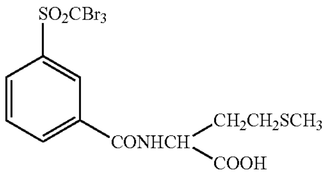
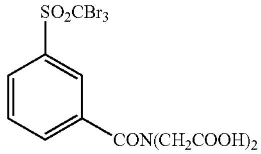
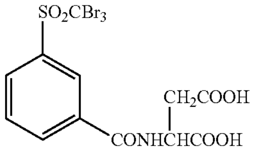
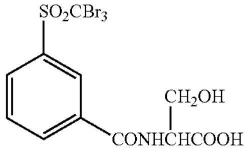
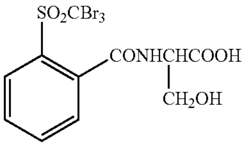
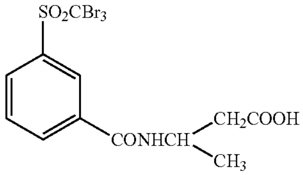
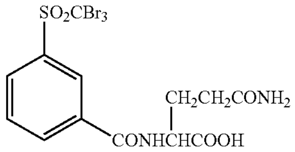
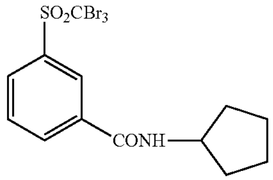
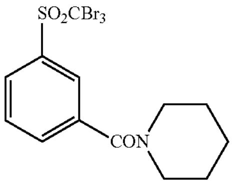
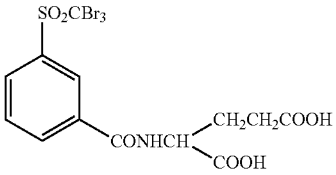
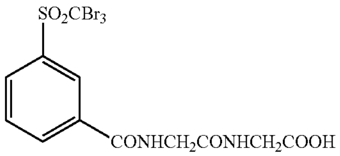
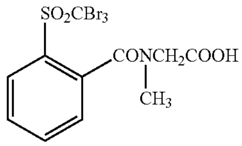
-continued
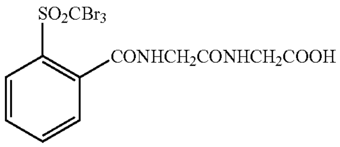
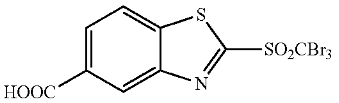
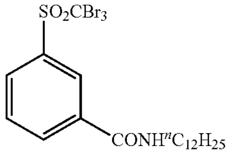
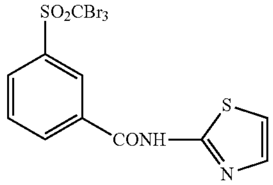
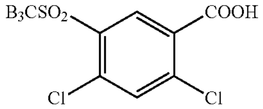
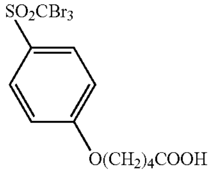
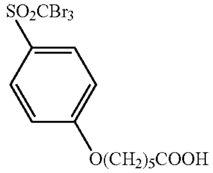
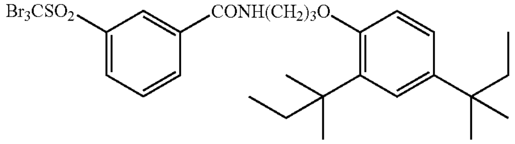
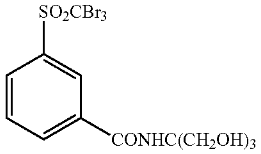
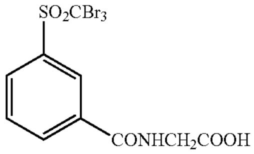
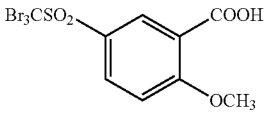
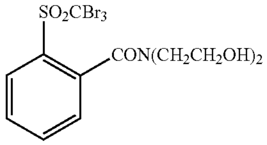
(IS-1)
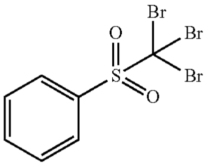
(IS-2)
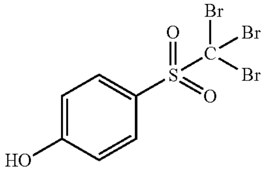

-continued (IS-3)

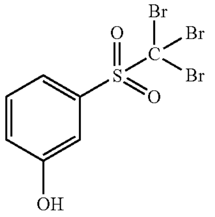

(IS-4)

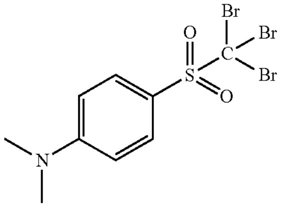

(IS-5)

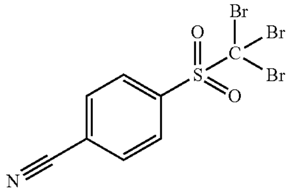

(IS-6)

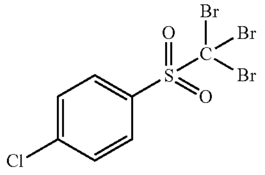

(IS-7)

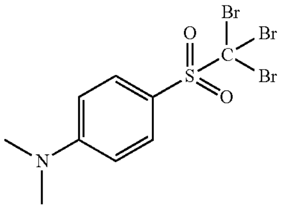

(IS-8)

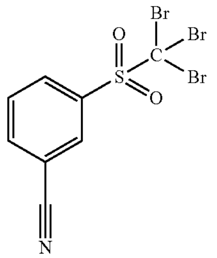

(IS-9)

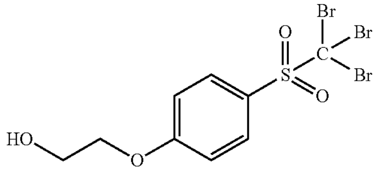

-continued (IS-10)

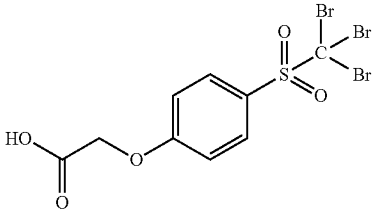

(IS-11)

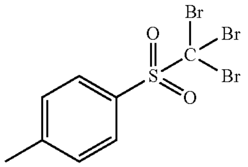

(IS-12)

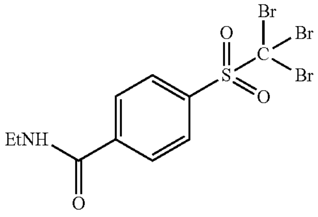

(IS-13)

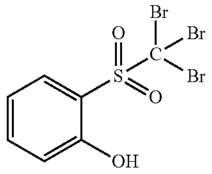

(IS-14)

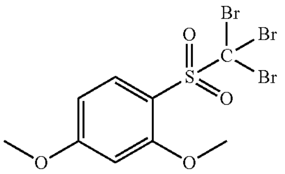

From the viewpoint of improving sensitivity, the lowest unoccupied molecular orbital (LUMO) of the electron-accepting polymerization initiator is preferably −3.00 eV or less, and more preferably −3.02 eV or less.

The lower limit of LUMO is preferably −3.80 eV or more, and more preferably −3.50 eV or more.

One electron-accepting polymerization initiator may be used alone, or two or more electron-accepting polymerization initiators may be used in combination.

The content of the electron-accepting polymerization initiator with respect to the total mass of the image-recording layer is preferably 0.1% by mass to 50% by mass, more preferably 0.5% by mass to 30% by mass, and particularly preferably 0.8% by mass to 20% by mass.

The image-recording layer of the present disclosure further contains an infrared absorber and an electron-accepting polymerization initiator. From the viewpoint of sensitivity improvement and printing durability, LUMO of the electron-accepting polymerization initiator−LUMO of the infrared absorber is preferably 1.00 eV or less, more preferably 0.80 eV or less, even more preferably 0.70 eV or less, particularly preferably 0.70 eV to −0.10 eV, and most preferably 0.70 eV to 0.30 eV.

The negative sign means that LUMO of the infrared absorber is higher than LUMO of the electron-accepting polymerization initiator.

[Polymerizable Compound]

The image-recording layer in the present disclosure contains a polymerizable compound.

In the present disclosure, a polymerizable compound refers to a compound having a polymerizable group.

The polymerizable group is not particularly limited and may be a known polymerizable group. As the polymerizable group, an ethylenically unsaturated group is preferable. The polymerizable group may be a radically polymerizable group or a cationically polymerizable group. The polymerizable group is preferably a radically polymerizable group.

Examples of the radically polymerizable group include a (meth)acryloyl group, an allyl group, a vinylphenyl group, a vinyl group, and the like. From the viewpoint of reactivity, a (meth)acryloyl group is preferable.

The molecular weight of the polymerizable compound (weight-average molecular weight in a case where the polymerizable compound has molecular weight distribution) is preferably 50 or more and less than 2,500.

The polymerizable compound used in the present disclosure may be, for example, a radically polymerizable compound or a cationically polymerizable compound. As the polymerizable compound, an addition polymerizable compound having at least one ethylenically unsaturated bond (ethylenically unsaturated compound) is preferable.

The ethylenically unsaturated compound is preferably a compound having at least one ethylenically unsaturated bond on a terminal, and more preferably a compound having two or more ethylenically unsaturated bonds on a terminal. The chemical form of the polymerizable compound is, for example, a monomer, a prepolymer which is in other words a dimer, a trimer, or an oligomer, a mixture of these, or the like.

Particularly, from the viewpoint of UV printing durability, the aforementioned polymerizable compound preferably includes a polymerizable compound having functionalities of 3 or more, more preferably includes a polymerizable compound having functionalities of 7 or more, and even more preferably includes a polymerizable compound having functionalities of 10 or more. From the viewpoint of UV printing durability of the planographic printing plate to be obtained, the aforementioned polymerizable compound preferably includes an ethylenically unsaturated compound having functionalities of 3 or more (preferably having functionalities of 7 or more and more preferably having functionalities of 10 or more), and more preferably includes a (meth)acrylate compound having functionalities of 3 or more (preferably having functionalities of 7 or more and more preferably having functionalities of 10 or more).

From the viewpoint of on-press developability and contamination suppressiveness, the aforementioned polymerizable compound preferably includes a polymerizable compound having functionalities of 2 or less, more preferably includes a difunctional polymerizable compound, and particularly preferably includes a difunctional (meth)acrylate compound.

From the viewpoint of printing durability, on-press developability, and contamination suppressiveness, the content of the polymerizable compound having functionalities of 2 or less (preferably a difunctional polymerizable compound) with respect to the total mass of polymerizable compounds in the image-recording layer is preferably 5% by mass to 100% by mass, more preferably 10% by mass to 100% by mass, and even more preferably 50% by mass to 100% by mass.

<<Oligomer>>

As the polymerizable compound to be incorporated into in the image-recording layer, a polymerizable compound which is an oligomer (hereinafter, also simply called "oligomer") is preferable.

In the present disclosure, an oligomer represents a polymerizable compound which has a molecular weight (weight-average molecular weight in a case where the compound has molecular weight distribution) of 600 or more and 10,000 or less and at least one polymerizable group.

From the viewpoint of excellent chemical resistance and excellent UV printing durability, the molecular weight of the oligomer is preferably 1,000 or more and 5,000 or less.

Furthermore, from the viewpoint of improving UV printing durability, the number of polymerizable groups in one molecule of the oligomer is preferably 2 or more, more preferably 3 or more, even more preferably 6 or more, and particularly preferably 10 or more.

The upper limit of the number of polymerizable groups in the oligomer is not particularly limited. The number of polymerizable groups is preferably 20 or less.

From the viewpoint of UV printing durability and on-press developability, an oligomer having 7 or more polymerizable groups and a molecular weight of 1,000 or more and 10,000 or less is preferable, and an oligomer having 7 or more and 20 or less polymerizable groups and a molecular weight of 1,000 or more and 5,000 or less is more preferable.

The oligomer may contain a polymer component which is likely to be generated in the process of manufacturing the oligomer.

From the viewpoint of UV printing durability, visibility, and on-press developability, the oligomer preferably has at least one compound selected from the group consisting of a compound having a urethane bond, a compound having an ester bond, and a compound having an epoxy residue, and more preferably has a compound having a urethane bond.

In the present disclosure, an epoxy residue refers to a structure formed of an epoxy group. For example, the epoxy residue means a structure similar to a structure established by the reaction between an acid group (carboxylic acid group or the like) and an epoxy group.

As the compound having a urethane bond, which is an example of the oligomer, for example, a compound having at least a group represented by Formula (Ac-1) or Formula (Ac-2) is preferable, and a compound having at least a group represented by Formula (Ac-1) is more preferable.

(Ac-1)

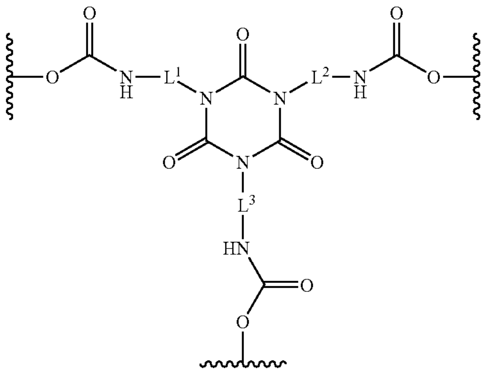

(Ac-2)

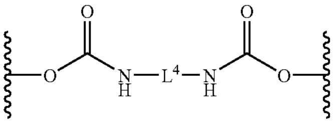

In Formula (Ac-1) and Formula (Ac-2), $L^1$ to $L^4$ each independently represent a divalent hydrocarbon group having 2 to 20 carbon atoms, and the portion of the wavy line represents a binding position binding to other structures.

$L^1$ to $L^4$ preferably each independently represent an alkylene group having 2 to 20 carbon atoms, more preferably each independently represent an alkylene group having 2 to 10 carbon atoms, and even more preferably each independently represent an alkylene group having 4 to 8 carbon atoms. The alkylene group may have a branched structure or a ring structure. The alkylene group is preferably a linear alkylene group.

The portion of the wavy line in Formula (Ac-1) or Formula (Ac-2) is preferably each independently directly bonded to the portion of the wavy line in a group represented by Formula (Ae-1) or Formula (Ae-2).

(Ae-1)

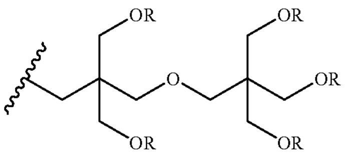

(Ae-2)

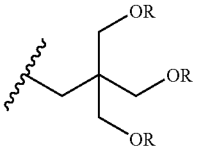

In Formula (Ae-1) and Formula (Ae-2), R each independently represent an acryloyloxy group or a methacryloyloxy group, and the portion of the wavy line represents a position binding to the portion of the wavy line in Formula (Ac-1) and Formula (Ac-2).

As the compound having a urethane bond, a compound may also be used which is prepared by obtaining polyurethane by a reaction between a polyisocyanate compound and a polyol compound and introducing a polymerizable group into the polyurethane by a polymer reaction.

For example, the compound having a urethane bond may be obtained by reacting a polyol compound having an acid group with a polyisocyanate compound to obtain a polyurethane oligomer and reacting this polyurethane oligomer with a compound having an epoxy group and a polymerizable group.

The number of polymerizable groups in the compound having an ester bond, which is an example of oligomer, is preferably 3 or more, and more preferably 6 or more.

As the compound having an epoxy residue, which is an example of oligomer, a compound containing a hydroxy group is preferable.

The number of polymerizable groups in the compound having an epoxy residue is preferably 2 to 6, and more preferably 2 or 3.

The compound having an epoxy residue can be obtained, for example, by reacting a compound having an epoxy group with an acrylic acid.

Specific examples of oligomers will be shown below, but the oligomer used in the present disclosure is not limited thereto.

As the oligomer, commercially available products may also be used. Examples thereof include UA-510H, UA-306H, UA-306I, and UA-306T (manufactured by KYOEISHA CHEMICAL Co., LTD.), UV-1700B, UV-6300B, and UV7620EA (manufactured by The Nippon Synthetic Chemical Industry Co., Ltd.), U-15HA (manufactured by SHIN-NAKAMURA CHEMICAL Co., LTD.), EBECRYL450, EBECRYL657, EBECRYL885, EBECRYL800, EBECRYL3416, and EBECRYL860 (manufactured by DAICEL-ALLNEX LTD.), and the like. However, the oligomer is not limited to these.

From the viewpoint of improving chemical resistance and UV printing durability and further suppressing the occurrence of residues during on-press development, the content of the oligomer with respect to the total mass of polymerizable compounds in the image-recording layer is preferably 30% by mass to 100% by mass, more preferably 50% by mass to 100% by mass, and even more preferably 80% by mass to 100% by mass.

<<Low-Molecular-Weight Polymerizable Compound>>

The polymerizable compound may further include a polymerizable compound other than the oligomer described above.

From the viewpoint of chemical resistance, the polymerizable compound other than the oligomer is preferably a low-molecular-weight polymerizable compound. The low-molecular-weight polymerizable compound may take a chemical form such as a monomer, a dimer, a trimer, or a mixture of these.

From the viewpoint of chemical resistance, the low-molecular-weight polymerizable compound is preferably at least a polymerizable compound selected from the group consisting of a polymerizable compound having three or more ethylenically unsaturated groups and a polymerizable compound having an isocyanuric ring structure.

In the present disclosure, a low-molecular-weight polymerizable compound refers to a polymerizable compound having a molecular weight (weight-average molecular weight in a case where the compound has molecular weight distribution) of 50 or more and less than 600.

From the viewpoint of excellent chemical resistance, excellent UV printing durability, and excellently suppressing the occurrence of residues during on-press development, the molecular weight of the low-molecular-weight polymerizable compound is preferably 100 or more and less than 600, more preferably 300 or more and less than 600, and even more preferably 400 or more and less than 600.

In a case where the polymerizable compound includes a low-molecular-weight polymerizable compound as the polymerizable compound other than an oligomer (total amount in a case where the polymerizable compound includes two or more low-molecular-weight polymerizable compounds), from the viewpoint of chemical resistance and UV printing durability and suppressing the occurrence of residues during on-press development, the ratio of the oligomer to the low-molecular-weight polymerizable compound (oligomer/low-molecular-weight polymerizable compound) is preferably 10/1 to 1/10, more preferably 10/1 to 3/7, and even more preferably 10/1 to 7/3, based on mass.

As the low-molecular-weight polymerizable compound, the polymerizable compounds described in paragraphs "0082" to "0086" of WO2019/013268A can also be suitably used.

The details of how to use the polymerizable compound, such as the structure of the compound, whether the compound is used alone or used in combination with other compounds, and the amount of the compound to be added, can be randomly set.

Particularly, from the viewpoint of UV printing durability, the image-recording layer preferably contains two or more polymerizable compounds.

The content of the polymerizable compound (total content of polymerizable compounds in a case where the image-recording layer contains two or more polymerizable compounds) with respect to the total mass of the image-recording layer is preferably 5% by mass to 75% by mass, more preferably 10% by mass to 70% by mass, and even more preferably 15% by mass to 60% by mass.

[Particles]

From the viewpoint of developability and UV printing durability, it is preferable that the image-recording layer in the present disclosure further contain particles. The particles may be inorganic particles or organic particles.

Particularly, the image-recording layer preferably contains organic particles as particles, and more preferably contains resin particles (polymer particles) as particles.

Known inorganic particles can be used as inorganic particles, and metal oxide particles such as silica particles and titania particles can be suitably used.

<<Resin Particles>>

Examples of the resin particles include particles containing an addition polymerization-type resin (that is, addition polymerization-type resin particles), particles containing a polyaddition-type resin (that is, polyaddition-type resin particles), particles containing a polycondensation-type resin (that is, polycondensation-type resin particles), and the like. Among these, addition polymerization-type resin particles or polyaddition-type resin particles are preferable.

From the viewpoint of enabling thermal fusion, the resin particles may also be particles containing a thermoplastic resin (that is, thermoplastic resin particles).

The resin particles may be in the form of microcapsules, microgel (that is, crosslinked resin particles), or the like.

The resin particles are preferably selected from the group consisting of thermoplastic resin particles, thermal reactive resin particles, resin particles having a polymerizable group, microcapsules encapsulating a hydrophobic compound, and microgel (crosslinked resin particles). Among these, resin particles having a polymerizable group are preferable.

In a particularly preferable embodiment, the resin particles have at least one ethylenically unsaturated group. The presence of such resin particles brings about effects of improving the printing durability of an exposed portion and improving the on-press developability of a non-exposed portion.

As the thermoplastic resin particles, the thermoplastic resin particles described in Research Disclosure No. 33303 published in January 1992, JP1997-123387A (JP-H09-123387A), JP1997-131850A (JP-H09-131850A), JP1997-171249A (JP-H09-171249A), JP1997-171250A (JP-H09-171250A), EP931647B, and the like are preferable.

Specific examples of resins constituting the thermoplastic resin particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures of these.

From the viewpoint of ink receptivity and UV printing durability, the thermoplastic resin particles preferably contain a resin that has a constitutional unit formed of an aromatic vinyl compound and a nitrile group-containing constitutional unit.

The aforementioned aromatic vinyl compound may have a structure composed of an aromatic ring and a vinyl group bonded thereto. Examples of the compound include a styrene compound, a vinylnaphthalene compound, and the like. Among these, a styrene compound is preferable, and styrene is more preferable.

Examples of the styrene compound include styrene, p-methylstyrene, p-methoxystyrene, β-methylstyrene, p-methyl-β-methylstyrene, α-methylstyrene, p-methoxy-β-methylstyrene, and the like. Among these, for example, styrene is preferable.

From the viewpoint of ink receptivity, the content of the constitutional unit formed of an aromatic vinyl compound is preferably higher than the content of the nitrile group-containing constitutional unit that will be described later. The content of the constitutional unit formed of an aromatic vinyl compound with respect to the total mass of the resin is more preferably 15% by mass to 85% by mass, and even more preferably 30% by mass to 70% by mass.

The nitrile group-containing constitutional unit is preferably introduced using a monomer having a nitrile group.

Examples of the monomer having a nitrile group include an acrylonitrile compound. As the monomer having a nitrile group, for example, (meth)acrylonitrile is suitable.

As the nitrile group-containing constitutional unit, a constitutional unit formed of (meth)acrylonitrile is preferable.

From the viewpoint of ink receptivity, the content of the nitrile group-containing constitutional unit is preferably lower than the content of the aforementioned constitutional unit formed of an aromatic vinyl compound. The content of the nitrile group-containing constitutional unit with respect to the total mass of the resin is more preferably 55% by mass to 90% by mass, and even more preferably 60% by mass to 85% by mass.

In a case where the resin contained in the thermoplastic resin particles has the constitutional unit formed of an aromatic vinyl compound and the nitrile group-containing constitutional unit, the content ratio between the constitutional unit formed of an aromatic vinyl compound and the nitrile group-containing constitutional unit (constitutional unit formed of aromatic vinyl compound:nitrile group-containing constitutional unit) is preferably 5:5 to 9:1, and more preferably 6:4 to 8:2, based on mass.

From the viewpoint of UV printing durability and chemical resistance, the resin contained in the thermoplastic resin particles preferably further has a constitutional unit formed of an N-vinyl heterocyclic compound.

Examples of the N-vinyl heterocyclic compound include N-vinylpyrrolidone, N-vinylcarbazole, N-vinylpyrrole, N-vinylphenothiazine, N-vinylsuccinic acid imide, N-vinylphthalimide, N-vinylcaprolactam, and N-vinylimidazole. Among these, N-vinylpyrrolidone is preferable.

The content of the constitutional unit formed of an N-vinyl heterocyclic compound with respect to the total mass of the thermoplastic resin is preferably 5% by mass to 50% by mass, and more preferably 10% by mass to 40% by mass.

The resin contained in the thermoplastic resin particles may contain an acidic group-containing constitutional unit. From the viewpoint of on-press developability and ink receptivity, it is preferable that the resin do not contain an acidic group-containing constitutional unit.

Specifically, in the thermoplastic resin, the content of the acidic group-containing constitutional unit is preferably 20% by mass or less, more preferably 10% by mass or less, and even more preferably 5% by mass or less. The lower limit of the content is not particularly limited, and may be 0% by mass.

The acid value of the thermoplastic resin is preferably 160 mg KOH/g or less, more preferably 80 mg KOH/g or less, and even more preferably 40 mg KOH/g or less. The lower limit of the acid value is not particularly limited, and may be 0 mg KOH/g.

In the present disclosure, the acid value is determined by the measurement method based on JIS K0070: 1992.

From the viewpoint of ink receptivity, the resin contained in the thermoplastic resin particles may contain a hydrophobic group-containing constitutional unit.

Examples of the hydrophobic group include an alkyl group, an aryl group, an aralkyl group, and the like.

As the hydrophobic group-containing constitutional unit, a constitutional unit formed of an alkyl (meth)acrylate compound, an aryl (meth)acrylate compound, or an aralkyl (meth)acrylate compound is preferable, and a constitutional unit formed of an alkyl (meth)acrylate compound is more preferable.

In the resin contained in the thermoplastic resin particles, the content of the hydrophobic group-containing constitutional unit with respect to the total mass of the resin is preferably 5% by mass to 50% by mass, and more preferably 10% by mass to 30% by mass.

From the viewpoint of UV printing durability and on-press developability, the thermoplastic resin contained in the thermoplastic resin particles preferably has a hydrophilic group.

The hydrophilic group is not particularly limited as long as it has a hydrophilic structure, and examples thereof include an acid group such as a carboxy group, a hydroxy group, an amino group, a nitrile group, a polyalkylene oxide structure, and the like.

From the viewpoint of UV printing durability and on-press developability, the hydrophilic group is preferably a group having a polyalkylene oxide structure, a group having a polyester structure, or a sulfonic acid group, more preferably a group having a polyalkylene oxide structure or a sulfonic acid group, and even more preferably a group having a polyalkylene oxide structure.

From the viewpoint of on-press developability, the polyalkylene oxide structure is preferably a polyethylene oxide structure, a polypropylene oxide structure, or a poly(ethylene oxide/propylene oxide) structure.

From the viewpoint of on-press developability, among the above hydrophilic groups, groups having a polypropylene oxide structure as a polyalkylene oxide structure are preferable, and groups having a polyethylene oxide structure and a polypropylene oxide structure are more preferable.

From the viewpoint of on-press developability, the number of alkylene oxide structures in the polyalkylene oxide structure is preferably 2 or more, more preferably 5 or more, even more preferably 5 to 200, and particularly preferably 8 to 150.

From the viewpoint of on-press developability, as the aforementioned hydrophilic group, a group represented by Formula Z, which will be described later, is preferable.

Among the hydrophilic groups that the thermoplastic resin has, a group represented by Formula PO is preferable.

Formula PO

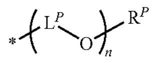

In Formula PO, $L^P$ each independently represent an alkylene group, $R^P$ represents a hydrogen atom or an alkyl group, and n represents an integer of 1 to 100.

In Formula PO, $L^P$ preferably each independently represent an ethylene group, a 1-methylethylene group, or a 2-methylethylene group, and more preferably each independently represent an ethylene group.

In Formula PO, $R^P$ is preferably a hydrogen atom or an alkyl group having 1 to 18 carbon atoms, more preferably a hydrogen atom or an alkyl group having 1 to 10 carbon atoms, even more preferably a hydrogen atom or an alkyl group having 1 to 4 carbon atoms, and particularly preferably a hydrogen atom or a methyl group.

In Formula PO, n is preferably an integer of 1 to 10, and more preferably an integer of 1 to 4.

The content of the hydrophilic group-containing constitutional unit with respect to the total mass of the resin is preferably 5% by mass to 60% by mass, and more preferably 10% by mass to 30% by mass.

The resin contained in the thermoplastic resin particles may further contain other constitutional units. The resin can contain, as those other constitutional units, constitutional units other than the constitutional units described above without particular limitations. Examples thereof include constitutional units formed of an acrylamide compound, a vinyl ether compound, and the like.

In the resin contained in the thermoplastic resin particles, the content of other constitutional units with respect to the total mass of the resin is preferably 5% by mass to 50% by mass, and more preferably 10% by mass to 30% by mass.

Examples of the thermal reactive resin particles include resin particles having a thermal reactive group. The thermal reactive resin particles form a hydrophobic region through crosslinking by a thermal reaction and the accompanying change in functional groups.

The thermal reactive group in the resin particles having a thermal reactive group may be a functional group that causes any reaction as long as chemical bonds are formed. The thermal reactive group is preferably a polymerizable group. Preferred examples of the polymerizable group include an ethylenically unsaturated group that causes a radical polymerization reaction (for example, an acryloyl group, a methacryloyl group, a vinyl group, an allyl group, and the like), a cationically polymerizable group (for example, a vinyl group, a vinyloxy group, an epoxy group, an oxetanyl group, and the like), an isocyanato group or a blocked isocyanato group that causes an addition reaction, an epoxy group, a vinyloxy group, an active hydrogen atom-containing functional group that is a reaction partner thereof (for example, an amino group, a hydroxy group, a carboxy group, and the like), a carboxy group that causes a condensation reaction, a hydroxy group or an amino group that is a reaction partner of the carboxy group, an acid anhydride that causes a ring-opening addition reaction, an amino group or a hydroxy group which is a reaction partner of the acid anhydride, and the like.

The resin having a thermal reactive group may be an addition polymerization-type resin, a polyaddition-type resin, or a polycondensation-type resin or may be a thermoplastic resin.

As the microcapsules, for example, microcapsules are preferable which encapsulate at least some of the constituent components (preferably a hydrophobic compound) of the image-recording layer as described in JP2001-277740A and JP2001-277742A. In a preferred aspect of the image-recording layer containing microcapsules as resin particles, the image-recording layer is composed of microcapsules that encapsulate a hydrophobic component (that is, a hydrophobic compound) among the constituent components of the image-recording layer and a hydrophilic component (that is, a hydrophilic compound) that is on the outside of the microcapsules.

The microgel (crosslinked resin particles) can contain some of the constituent components of the image-recording layer, in at least one of the surface or the interior of the microgel. From the viewpoint of sensitivity of the planographic printing plate precursor to be obtained and printing durability of the planographic printing plate to be obtained, reactive microgel having a polymerizable group on the surface thereof is particularly preferable.

In order to obtain microcapsules containing a constituent component of the image-recording layer, known synthesis methods can be used.

The microgel (crosslinked resin particles) can contain some of the constituent components of the image-recording layer, in at least one of the surface or the interior of the microgel. From the viewpoint of sensitivity of the planographic printing plate precursor to be obtained and printing durability of the planographic printing plate to be obtained, reactive microgel having a polymerizable group on the surface thereof is particularly preferable.

In order to obtain microgel containing a constituent component of the image-recording layer, known synthesis methods can be used.

As the resin particles, from the viewpoint of printing durability, antifouling properties, and storage stability of the planographic printing plate to be obtained, polyaddition-type resin particles are preferable which are obtained by a reaction between a polyvalent isocyanate compound that is an adduct of a polyhydric phenol compound having two or more hydroxy groups in a molecule and isophorone diisocyanate and a compound having active hydrogen.

As the polyhydric phenol compound, a compound having a plurality of benzene rings having a phenolic hydroxyl group is preferable.

As the compound having active hydrogen, a polyol compound or a polyamine compound is preferable, a polyol compound is more preferable, and at least one compound selected from the group consisting of propylene glycol, glycerin, and trimethylolpropane is even more preferable. As the aforementioned active hydrogen compound, water can also be used. In a case where water is used, the amine generated by the reaction between an isocyanato group and water can form a urea bond to form particles.

Preferred examples of the resin particles obtained by the reaction between a polyvalent isocyanate compound that is an adduct of a polyhydric phenol compound having two or more hydroxy groups in a molecule and isophorone diisocyanate and a compound having active hydrogen include the resin particles described in paragraphs "0230" to "0234" of WO2018043259A.

As the resin particles, from the viewpoint of printing durability and solvent resistance of the planographic printing plate to be obtained, addition polymerization-type resin particles are preferable which have a hydrophobic main chain and include both i) constitutional unit having a nitrile group directly bonded to the hydrophobic main chain and ii) constitutional unit having a pendant group including a hydrophilic polyalkylene oxide segment. Specifically, the particles described in paragraph "0156" of JP2019-64269A are preferable.

<<Group represented by Formula Z>>

It is preferable that the resin particles in the present disclosure have a group represented by Formula Z as a hydrophilic group.

*-Q-W-Y     Formula Z

In Formula Z, Q represents a divalent linking group, W represents a divalent group having a hydrophilic structure or a divalent group having a hydrophobic structure, and Y represents a monovalent group having a hydrophilic structure or a monovalent group having a hydrophobic structure, either W or Y has a hydrophilic structure, and * represents a bonding site with another structure.

Furthermore, it is preferable that any of the hydrophilic structures included in Formula Z include a polyalkylene oxide structure.

Q in Formula Z is preferably a divalent linking group having 1 to 20 carbon atoms, and more preferably a divalent linking group having 1 to 10 carbon atoms.

Furthermore, Q in Formula Z is preferably an alkylene group, an arylene group, an ester bond, an amide bond, or a group formed by combining two or more of these, and more preferably a phenylene group, an ester bond, or an amide bond.

The divalent group having a hydrophilic structure represented by W in Formula Z is preferably a group having a polyalkylene oxide structure, and more preferably a polyalkyleneoxy group or a group in which $—CH_2CH_2NR^W—$ is bonded to one terminal of a polyalkyleneoxy group. $R^W$ represents a hydrogen atom or an alkyl group.

The divalent group having a hydrophobic structure represented by W in Formula Z is preferably $—R^{WA}—$, $—O—R^{WA}—O—$, $—R^WN—R^{WA}—NR^W—$, $—OC(=O)—R^{WA}—O—$, or $—OC(=O)—R^{WA}—O$. $R^{WA}$'s each independently represent a linear, branched, or cyclic alkylene group having 6 to 120 carbon atoms, a haloalkylene group having 6 to 120 carbon atoms, an arylene group having 6 to 120 carbon atoms, an alkarylene group having 6 to 120 carbon atoms (divalent group formed by removing one hydrogen atom from an alkylaryl group), or an aralkylene group having 6 to 120 carbon atoms.

The monovalent group having a hydrophilic structure represented by Y in Formula Z is preferably —OH, —C(=O)OH, a polyalkyleneoxy group having a hydrogen atom or an alkyl group on a terminal, or a group in which $—CH_2CH_2N(R^W)—$ is bonded to one terminal of a polyalkyleneoxy group having a hydrogen atom or an alkyl group on the other terminal. Particularly, the monovalent group having a hydrophilic structure is preferably a group having a polyalkylene oxide structure, a polyalkyleneoxy group having a hydrogen atom or an alkyl group on a terminal, or a group in which $—CH_2CH_2N(R^W)—$ is bonded to one terminal of a polyalkyleneoxy group having a hydrogen atom or an alkyl group on the other terminal.

The monovalent group having a hydrophobic structure represented by Y in Formula Z is preferably a linear, branched, or cyclic alkyl group having 6 to 120 carbon atoms, a haloalkyl group having 6 to 120 carbon atoms, an aryl group having 6 to 120 carbon atoms, an alkaryl group having 6 to 120 carbon atoms (alkylaryl group), an aralkyl group having 6 to 120 carbon atoms, $—OR^{WB}$, $—C(=O)OR^{WB}$, or $—OC(=O)R^{WB}$. $R^{WB}$ represents an alkyl group having 6 to 20 carbon atoms.

From the viewpoint of printing durability, receptivity, and on-press developability, in the resin particles having a group represented by formula Z, W is more preferably a divalent group having a hydrophilic structure, Q is more preferably a phenylene group, an ester bond, or an amide bond, W is more preferably a polyalkyleneoxy group, and Y is more preferably a polyalkyleneoxy group having a hydrogen atom or an alkyl group on a terminal.

The group represented by Formula Z may function as a dispersible group for improving the dispersibility of the resin particles.

From the viewpoint of printing durability and on-press developability, the resin particles in the present disclosure preferably have a polymerizable group (preferably an ethylenically unsaturated group). Particularly, the resin particles more preferably include resin particles having a polymerizable group on the surface thereof. In a case where the resin particles having a polymerizable group are used, printing durability (preferably UV printing durability) is improved.

From the viewpoint of printing durability, it is preferable that the resin particles in the present disclosure be resin particles having a hydrophilic group and a polymerizable group.

The polymerizable group may be a cationically polymerizable group or a radically polymerizable group. From the viewpoint of reactivity, the polymerizable group is preferably a radically polymerizable group.

The aforementioned polymerizable group is not particularly limited as long as it is a polymerizable group. From the viewpoint of reactivity, an ethylenically unsaturated group is preferable, a vinylphenyl group (styryl group), a (meth)acryloxy group, or a (meth)acrylamide group is more preferable, and a (meth)acryloxy group is particularly preferable.

In addition, it is preferable that the resin constituting the resin particles having a polymerizable group have a polymerizable group-containing constitutional unit.

The polymerizable group may be introduced into the surface of the resin particles by a polymer reaction.

Furthermore, from the viewpoint of printing durability, receptivity, on-press developability, and suppression of the occurrence of development residues during on-press development, the resin particles preferably contain a polyaddition-type resin having a urea bond, more preferably contain a polyaddition-type resin having a structure obtained by reacting at least an isocyanate compound represented by Formula (Iso) with water, and particularly preferably contain a polyaddition-type resin that has a structure obtained by reacting at least an isocyanate compound represented by Formula (Iso) with water and has a polyethylene oxide structure and a polypropylene oxide structure as polyoxyalkylene structures. Furthermore, the particles containing the polyaddition-type resin having a urea bond are preferably microgel.

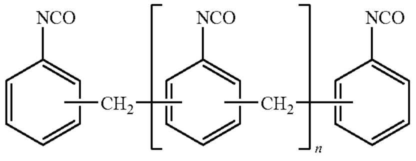

(Iso)

In Formula (Iso), n represents an integer of 0 to 10.

An example of the reaction between the isocyanate compound represented by Formula (Iso) and water is the reaction shown below. In the following example, a 4,4-isomer in which n=0 is used.

As shown below, in a case where the isocyanate compound represented by Formula (Iso) is reacted with water, the isocyanate group is partially hydrolyzed by water and generates an amino group. The generated amino group reacts with the isocyanate group and generates a urea bond, and a dimer is consequently formed. Furthermore, the following reaction is repeated to form a polyaddition-type resin having a urea bond.

In the following reaction, by adding a compound (compound having active hydrogen) such as an alcohol compound or an amine compound reactive with an isocyanate group, it is possible to introduce the structure of an alcohol compound, an amine compound, or the like to the polyaddition-type resin having a urea bond.

Preferred examples of the compound having active hydrogen include the aforementioned compound having active hydrogen.

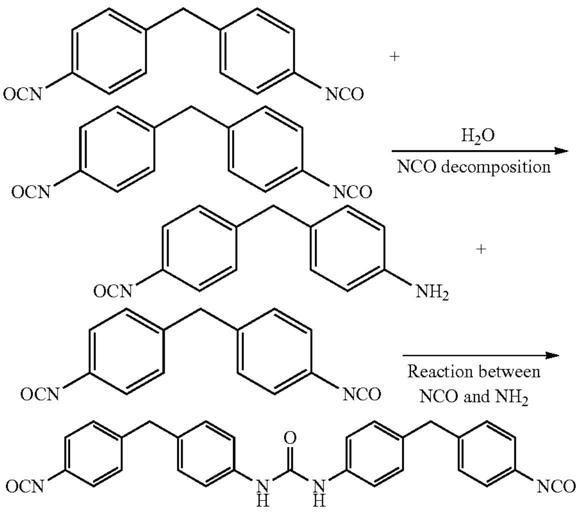

The polyaddition-type resin having a urea bond preferably has an ethylenically unsaturated group, and more preferably has a group represented by Formula (PETA).

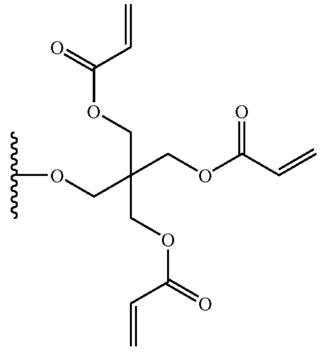

(PETA)

In Formula (PETA), the portion of the wavy line represents a binding position with other structures.

<<Synthesis of Resin Particles>>

The synthesis method of the resin particles is not particularly limited, and may be a method that makes it possible to synthesize particles with various resins described above.

Examples of the synthesis method of the resin particles include known synthesis methods of resin particles, such as an emulsion polymerization method, a suspension polymerization method, a dispersion polymerization method, a soap-free polymerization method, and a microemulsion polymerization method.

In addition, for the synthesis of the resin particles, a known microcapsule synthesis method, a known microgel (crosslinked resin particle) synthesis method, and the like may be used.

<<Average Particle Diameter of Particles>>

The average particle diameter of the particles is preferably 0.01 μm to 3.0 μm, more preferably 0.03 μm to 2.0 μm, and even more preferably 0.10 μm to 1.0 μm. In a case where the average particle diameter is in this range, excellent resolution and temporal stability are obtained.

The average particle diameter of the particles is measured using a light scattering method or by capturing an electron micrograph of the particles, measuring the particle diameter of a total of 5,000 particles in the photograph, and calculating the average thereof. For nonspherical particles, the equivalent circular diameter of the particles in a photograph is adopted.

Note that unless otherwise specified, the average particle diameter of the particles in the present disclosure means a volume average particle diameter.

As the particles (preferably resin particles), only one kind of particles may be used, or two or more kinds of particles may be used in combination.

From the viewpoint of developability and printing durability, the content of the particles (preferably resin particles) with respect to the total mass of the image-recording layer is preferably 5% by mass to 90% by mass, more preferably 10% by mass to 90% by mass, even more preferably 20% by mass to 90% by mass, and particularly preferably 50% by mass to 90% by mass.

[Other Components]

The image-recording layer in the present disclosure may contain other components in addition to the components described above.

Examples of those other components include a binder polymer, a chromogenic agent, a coloring compound, a chain transfer agent, a low-molecular-weight hydrophilic compound, an oil sensitizing agent, other additives, and the like.

Examples of those other components include a colorant, a bakeout agent, a polymerization inhibitor, a higher fatty acid derivative, a plasticizer, inorganic particles, and a low-molecular-weight hydrophilic compound disclosed in paragraphs “0181” to “0190” of JP2009-255434A, and the like.

Examples of other compounds also include a hydrophilic precursor (fine particles capable of converting the image-recording layer into a hydrophobic image-recording layer in a case where heat is applied thereto), a low-molecular-weight hydrophilic compound, an oil sensitizing agent (for example, a phosphonium compound, a nitrogen-containing low-molecular-weight compound, or an ammonium group-containing polymer), and a chain transfer agent disclosed in paragraphs “0191” to “0217” of JP2012-187907A.

—Binder Polymer—

As necessary, the image-recording layer may contain a binder polymer.

The binder polymer refers to a polymer other than resin particles, that is, a polymer that is not in the form of particles.

In addition, the binder polymer excludes an ammonium salt-containing polymer in an oil sensitizing agent and a polymer used as a surfactant.

As the binder polymer, known binder polymers (for example, a (meth) acrylic resin, polyvinyl acetal, a polyurethane resin, and the like) used for the image-recording layer of a planographic printing plate precursor can be suitably used.

As an example, a binder polymer that is used for an on-press development type planographic printing plate precursor (hereinafter, also called binder polymer for on-press development) will be specifically described.

As the binder polymer for on-press development, a binder polymer having an alkylene oxide chain is preferable. The binder polymer having an alkylene oxide chain may have a poly(alkylene oxide) moiety in a main chain or side chain. In addition, the binder polymer may be a graft polymer having poly(alkylene oxide) in a side chain or a block copolymer of a block composed of a poly(alkylene oxide)-containing repeating unit and a block composed of an (alkylene oxide)-free repeating unit.

As a binder polymer having a poly(alkylene oxide) moiety in the main chain, a polyurethane resin is preferable.

In a case where the binder polymer has a poly(alkylene oxide) moiety in the side chain, examples of polymers of the main chain include a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber. Among these, a (meth)acrylic resin is particularly preferable.

In addition, as the binder polymer, for example, a polymer compound is also preferable which has a polyfunctional thiol having functionalities of 6 or more and 10 or less as a nucleus and a polymer chain that is bonded to the nucleus by a sulfide bond and has a polymerizable group (hereinafter, this compound will be also called star-shaped polymer compound).

As the star-shaped polymer compound, for example, the compounds described in JP2012-148555A can be preferably used.

Examples of the star-shaped polymer compound include the compound described in JP2008-195018A that has a polymerizable group such as an ethylenically unsaturated bond for improving the film hardness of an image area in a main chain or side chain and preferably in a side chain. The polymerizable group of the star-shaped polymer compound forms crosslinks between the molecules of the star-shaped polymer compound, which facilitates curing.

As the polymerizable group, an ethylenically unsaturated group such as a (meth)acryloyl group, a vinyl group, an allyl group, or a vinyl phenyl group (styryl group), an epoxy group, or the like is preferable, a (meth)acryloyl group, a vinyl group, or a vinyl phenyl group (styryl group) is more preferable from the viewpoint of polymerization reactivity, and a (meth)acryloyl group is particularly preferable. These groups can be introduced into the polymer by a polymer reaction or copolymerization. Specifically, for example, it is possible to use a reaction between a polymer having a carboxy group in a side chain and glycidyl methacrylate or a reaction between a polymer having an epoxy group and an ethylenically unsaturated group-containing carboxylic acid such as methacrylic acid.

The molecular weight of the binder polymer that is a polystyrene-equivalent weight-average molecular weight (Mw) determined by GPC is preferably 2,000 or more, more preferably 5,000 or more, and even more preferably 10,000 to 300,000.

As the binder polymer, as necessary, a hydrophilic polymer, such as polyacrylic acid, polyvinyl alcohol, or polyvinyl acetal described in JP2008-195018A, can be used in combination. In addition, a lipophilic polymer and a hydrophilic polymer can be used in combination.

Particularly, from the viewpoint of on-press developability, the image-recording layer preferably contains polyvinyl acetal. Suitable examples of the polyvinyl acetal include polyvinyl butyral and the like.

One binder polymer may be used alone, or two or more binder polymers may be used in combination.

The content of the binder polymer to be incorporated into the image-recording layer can be randomly set. The content of the binder polymer with respect to the total mass of the image-recording layer is preferably 1% by mass to 90% by mass, and more preferably 5% by mass to 80% by mass.

—Chromogenic Agent—

The image-recording layer in the present disclosure preferably further contains a chromogenic agent, and more preferably further contains an acid chromogenic agent. Furthermore, the chromogenic agent preferably includes a leuco compound.

"Chromogenic agent" used in the present disclosure means a compound that develops or removes color by a stimulus such as light or acid and thus changes the color of the image-recording layer. Furthermore, "acid chromogenic agent" means a compound that develops or removes color by being heated in a state of accepting an electron accepting compound (for example, a proton of an acid or the like) and thus changes the color of the image-recording layer. The acid chromogenic agent is particularly preferably a colorless compound which has a partial skeleton such as lactone, lactam, sultone, spiropyran, an ester, or an amide and allows such a partial skeleton to rapidly open the ring or to be cleaved when coming into contact with an electron accepting compound.

Examples of such an acid chromogenic agent include the compounds described in paragraphs "0184" to "0191" of JP2019-18412A.

Particularly, from the viewpoint of visibility, the chromogenic agent used in the present disclosure is preferably at least one compound selected from the group consisting of a spiropyran compound, a spirooxazine compound, a spirolactone compound, and a spirolactam compound.

From the viewpoint of visibility, the color of a colorant after color development preferably has maximum absorption wavelength in the range of 450 to 650 nm. The tint is preferably red, purple, blue, or dark green.

From the viewpoint of visibility and visibility of exposed portions, the acid chromogenic agent is preferably a leuco colorant.

The aforementioned leuco colorant is not particularly limited as long as it has a leuco structure. The leuco colorant preferably has a spiro structure, and more preferably has a spirolactone ring structure.

From the viewpoint of visibility and visibility of exposed portions, the leuco colorant is preferably a leuco colorant having a phthalide structure or a fluoran structure.

Furthermore, from the viewpoint of visibility and visibility of exposed portions, the leuco colorant having a phthalide structure or a fluoran structure is preferably a compound represented by any of Formula (Le-1) to Formula (Le-3), and more preferably a compound represented by Formula (Le-2).

(Le-1)

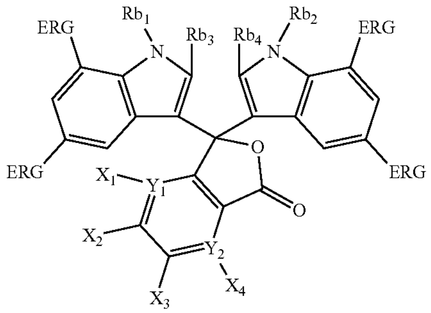

(Le-2)

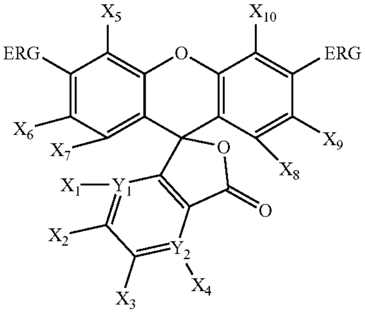

(Le-3)

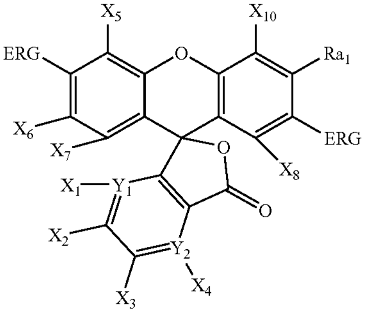

In Formula (Le-1) to Formula (Le-3), ERG's each independently represent an electron-donating group, $X_1$ to $X_4$ each independently represent a hydrogen atom, a halogen atom, or dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent a hydrogen atom, an alkyl group, an aryl group, or a heteroaryl group.

From the viewpoint of color developability and visibility of exposed portions, the electron-donating group represented by ERG in Formula (Le-1) to Formula (Le-3) is preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, an aryloxy group, a heteroaryloxy group, or an alkyl group, more preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, or an aryloxy group, even more preferably a monoalkyl monoarylamino group, a diarylamino group, a diheteroarylamino group, or a monoaryl monoheteroarylamino group, and particularly preferably a monoalkyl monoarylamino group.

From the viewpoint of color developability and visibility of exposed portions, the electron-donating group represented by ERG is preferably a disubstituted amino group having an aryl group that has a substituent on at least one ortho position or a heteroaryl group that has a substituent on at least one ortho position, more preferably a disubstituted amino group having a substituent on at least one ortho position and a phenyl group having an electron-donating group at a para position, even more preferably an amino group having a substituent on at least one ortho position and a phenyl group having an electron-donating group at a para position and an aryl group or a heteroaryl group, and particularly preferably an amino group having a substituent on at least one ortho position, a phenyl group having an electron-donating group at a para position, and an aryl group having an electron-donating group or a heteroaryl group having an electron-donating group.

In the present disclosure, in a case where a bonding position of an aryl group or a heteroaryl group with other structures is defined as 1-position, the ortho position in the aryl group or heteroaryl group other than a phenyl group is called a bonding position (for example, 2-position or the like) adjacent to the 1-position.

From the viewpoint of color developability and visibility of exposed portions, the electron-donating group that the aforementioned aryl group or heteroaryl group has is preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, an aryloxy group, a heteroaryloxy group, or an alkyl group, more preferably an alkoxy group, an aryloxy group, a heteroaryloxy group, or an alkyl group, and particularly preferably an alkoxy group.

From the viewpoint of color developability and visibility of exposed portions, $X_1$ to $X_4$ in Formula (Le-1) to Formula (Le-3) preferably each independently represent a hydrogen atom or a chlorine atom, and more preferably each independently represent a hydrogen atom.

From the viewpoint of color developability and visibility of exposed portions, $X_5$ to $X_{10}$ in Formula (Le-2) or Formula (Le-3) preferably each independently represent a hydrogen atom, a halogen atom, an alkyl group, an aryl group, an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, a hydroxy group, an alkoxy group, an aryloxy group, a heteroaryloxy group, an acyl group, an alkoxycarbonyl group, an aryloxycarbonyl group, a heteroaryloxycarbonyl group, or a cyano group, more preferably each independently represent a hydrogen atom, a halogen atom, an alkyl group, an aryl group, an alkoxy group, or an aryloxy group, even more preferably each independently represent a hydrogen atom, a halogen atom, an alkyl group, or an aryl group, and particularly preferably each independently represent a hydrogen atom.

From the viewpoint of color developability and visibility of exposed portions, it is preferable that at least one of $Y_1$ or $Y_2$ in Formula (Le-1) to Formula (Le-3) be C, and it is more preferable that both of $Y_1$ and $Y_2$ be C.

From the viewpoint of color developability and visibility of exposed portions, $Ra_1$ in Formula (Le-1) to Formula (Le-3) is preferably an alkyl group or an alkoxy group, more preferably an alkoxy group, and particularly preferably a methoxy group.

From the viewpoint of color developability and visibility of exposed portions, $Rb_1$ to $Rb_4$ in Formula (Le-1) to Formula (Le-3) preferably each independently represent a hydrogen atom or an alkyl group, more preferably each independently represent an alkyl group, and particularly preferably each independently represent a methyl group.

Furthermore, from the viewpoint of color developability and visibility of exposed portions, the leuco colorant having a phthalide structure or a fluoran structure is more preferably a compound represented by any of Formula (Le-4) to Formula (Le-6), and even more preferably a compound represented by Formula (Le-5).

(Le-4)

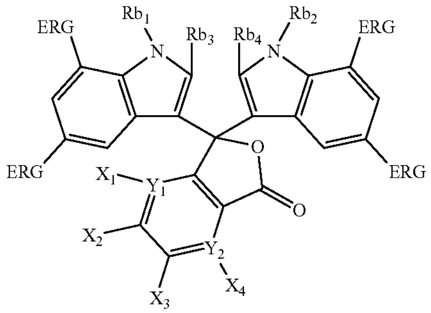

(Le-5)

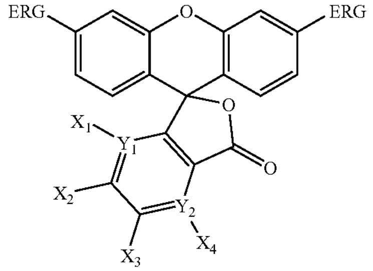

(Le-6)

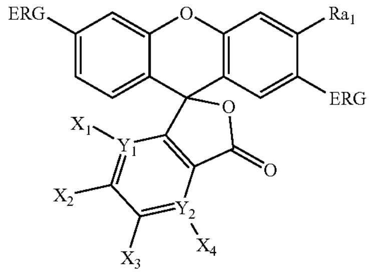

In Formula (Le-4) to Formula (Le-6), ERG's each independently represent an electron-donating group, $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent a hydrogen atom, an alkyl group, an aryl group, or a heteroaryl group.

ERG, $X_1$ to $X_4$, $Y_1$, $Y_2$, $Ra_1$, and $Rb_1$ to $Rb_4$ in Formula (Le-4) to Formula (Le-6) have the same definitions as ERG, $X_1$ to $X_4$, $Y_1$, $Y_2$, $Ra_1$, and $Rb_1$ to $Rb_4$ in Formula (Le-1) to Formula (Le-3) respectively, and preferred aspects thereof are also the same.

Furthermore, from the viewpoint of color developability and visibility of exposed portions, the leuco colorant having a phthalide structure or a fluoran structure is more preferably a compound represented by any of Formula (Le-7) to Formula (Le-9), and particularly preferably a compound represented by Formula (Le-8).

(Le-7)

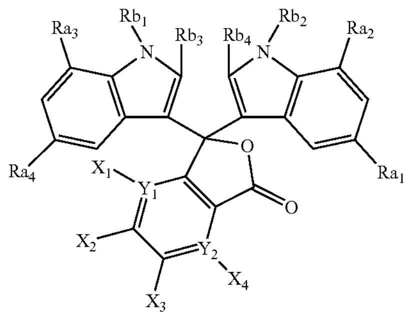

(Le-8)

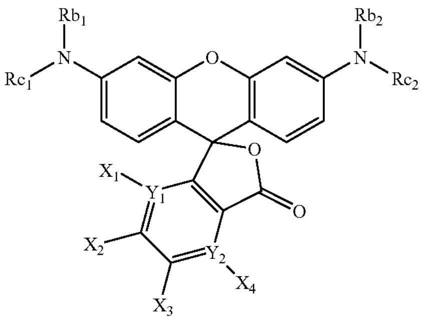

(Le-9)

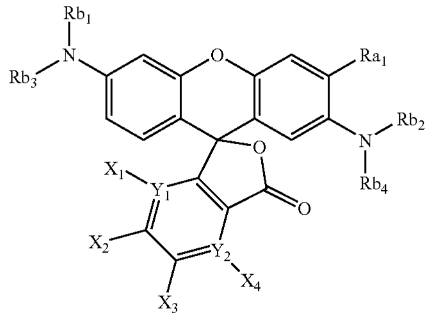

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent a hydrogen atom, an alkyl group, an aryl group, or a heteroaryl group, and $Rc_1$ and $Rc_2$ each independently represent an aryl group or a heteroaryl group.

$X_1$ to $X_4$, $Y_1$, and $Y_2$ in Formula (Le-7) to Formula (Le-9) have the same definition as $X_1$ to $X_4$, $Y_1$, and $Y_2$ in Formula (Le-1) to Formula (Le-3) respectively, and preferred aspects thereof are also the same.

From the viewpoint of color developability and visibility of exposed portions, $Ra_1$ to $Ra_4$ in Formula (Le-7) or Formula (Le-9) preferably each independently represent an alkyl group or an alkoxy group, more preferably each independently represent an alkoxy group, and particularly preferably each independently represent a methoxy group.

From the viewpoint of color developability and visibility of exposed portions, $Rb_1$ to $Rb_4$ in Formula (Le-7) to Formula (Le-9) preferably each independently represent a hydrogen atom, an alkyl group, or an aryl group substituted with an alkoxy group, more preferably each independently represent an alkyl group, and particularly preferably each independently represent a methyl group.

From the viewpoint of color developability and visibility of exposed portions, $Rc_1$ and $Rc_2$ in Formula (Le-8) preferably each independently represent a phenyl group or an alkylphenyl group, and more preferably each independently represent a phenyl group.

From the viewpoint of color developability and visibility of exposed portions, $Rc_1$ and $Rc_2$ in Formula (Le-8) preferably each independently represent an aryl group having a substituent on at least one ortho position or a heteroaryl group having a substituent on at least one ortho position, more preferably each independently represent an aryl group having a substituent on at least one ortho position, even more preferably each independently represent a phenyl group having a substituent on at least one ortho position, and particularly preferably each independently represent a phenyl group having a substituent on at least one ortho position and having an electron-donating group at the para position. Examples of the substituent in $Rc_1$ and $Rc_2$ include substituents that will be described later.

In Formula (Le-8), from the viewpoint of color developability and visibility of exposed portions, $X_1$ to $X_4$ preferably each represent a hydrogen atom, and $Y_1$ and $Y_2$ preferably each represent C.

Furthermore, from the viewpoint of color developability and visibility of exposed portions, in Formula (Le-8), $Rb_1$ and $Rb_2$ preferably each independently represent an alkyl group or an aryl group substituted with an alkoxy group.

From the viewpoint of color developability and visibility of exposed portions, $Rb_1$ and $Rb_2$ in Formula (Le-8) preferably each independently represent an aryl group or a heteroaryl group, more preferably each independently represent an aryl group, even more preferably each independently represent an aryl group having an electron-donating group, and particularly preferably each independently represent a phenyl group having an electron-donating group at the para position.

From the viewpoint of color developability and visibility of exposed portions, the electron-donating group in $Rb_1$, $Rb_2$, $Rc_1$, and $Rc_2$ is preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, an aryloxy group, a heteroaryloxy group, or an alkyl group, more preferably an alkoxy group, an aryloxy group, a heteroaryloxy group, or an alkyl group, and particularly preferably an alkoxy group.

From the viewpoint of color developability and visibility of exposed portions, the acid chromogenic agent preferably includes a compound represented by Formula (Le-10).

(Le-10)

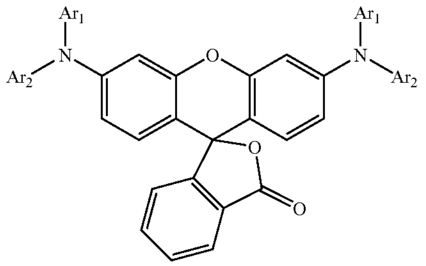

In Formula (Le-10), $Ar_1$ each independently represent an aryl group or a heteroaryl group, and $Ar_2$ each independently represent an aryl group having a substituent on at least one ortho position or a heteroaryl group having a substituent on at least one ortho position.

$Ar_1$ in Formula (Le-10) has the same definition as $Rb_1$ and $Rb_2$ in Formula (Le-7) to Formula (Le-9), and preferred aspects thereof are also the same.

$Ar_2$ in Formula (Le-10) has the same definition as $Rc_1$ and $Rc_2$ in Formula (Le-7) to Formula (Le-9), and preferred aspects thereof are also the same.

The alkyl group in Formula (Le-1) to Formula (Le-9) may be linear or branched or may have a ring structure.

The number of carbon atoms in the alkyl group in Formula (Le-1) to Formula (Le-9) is preferably 1 to 20, more preferably 1 to 8, even more preferably 1 to 4, and particularly preferably 1 or 2.

The number of carbon atoms in the aryl group in Formula (Le-1) to Formula (Le-10) is preferably 6 to 20, more preferably 6 to 10, and particularly preferably 6 to 8.

Specific examples of the aryl group in Formula (Le-1) to Formula (Le-10) include a phenyl group, a naphthyl group, an anthracenyl group, a phenanthrenyl group, and the like which may have a substituent.

Specific examples of the heteroaryl group in Formula (Le-1) to Formula (Le-10) include a furyl group, a pyridyl group, a pyrimidyl group, a pyrazoyl group, a thiophenyl group, and the like which may have a substituent.

Each of the groups in Formula (Le-1) to Formula (Le-10), such as a monovalent organic group, an alkyl group, an aryl group, a heteroaryl group, a dialkylanilino group, an alkylamino group, and an alkoxy group, may have a substituent. Examples of the substituent include an alkyl group, an aryl group, a heteroaryl group, a halogen atom, an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, a hydroxy group, an alkoxy group, an aryloxy group, a heteroaryloxy group, an acyl group, an alkoxycarbonyl group, an aryloxycarbonyl group, a heteroaryloxycarbonyl group, a cyano group, and the like. These substituents may be further substituted with these substituents.

Examples of the leuco colorant having the phthalide structure or the fluoran structure that are suitably used include the following compounds.

S-1

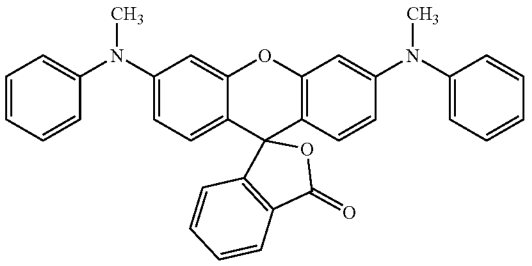

S-2

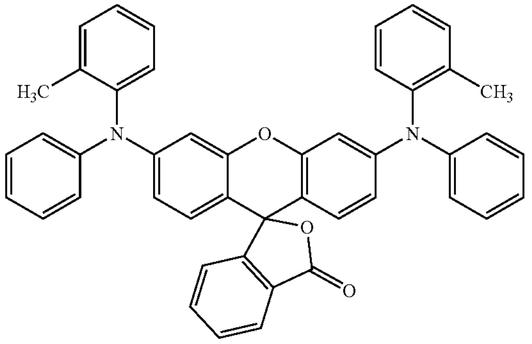

S-3

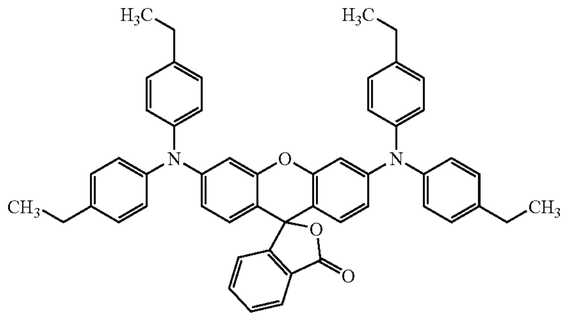

S-4

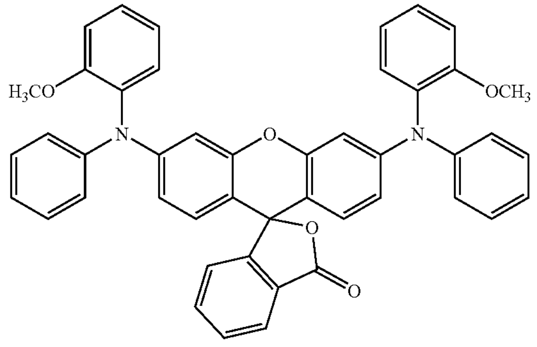

-continued
S-5
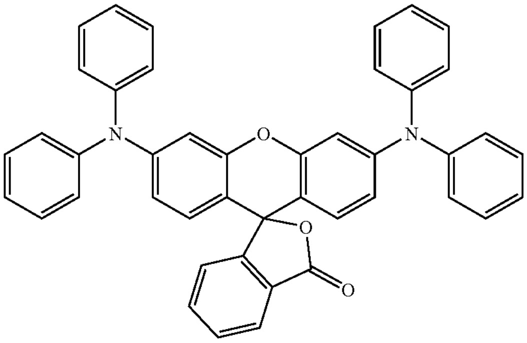
S-6
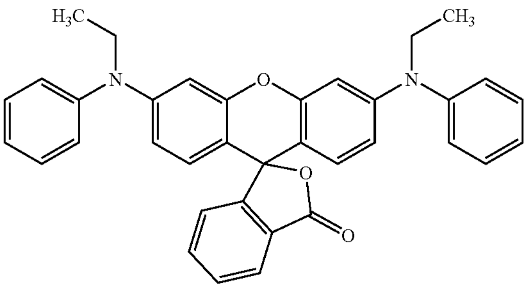
S-7
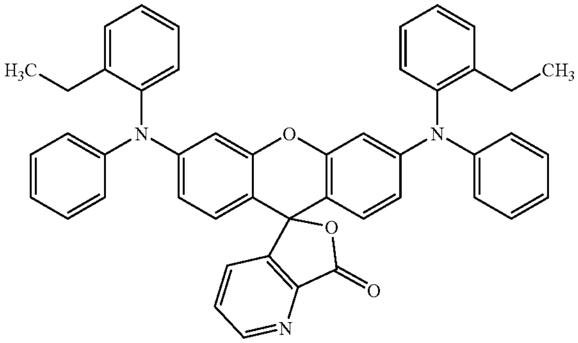
S-8
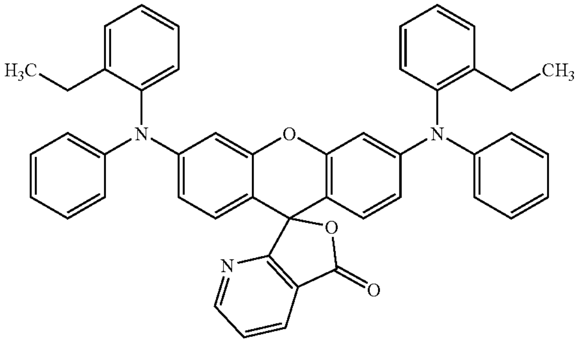
-continued
S-9
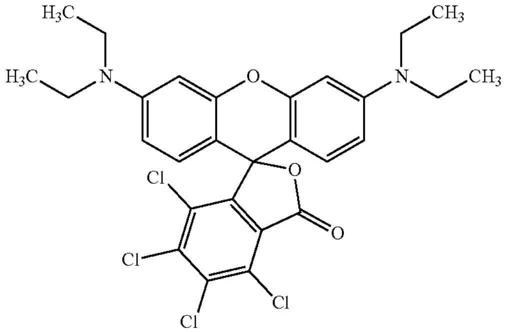
S-10
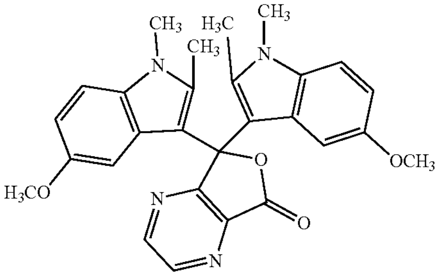
S-11
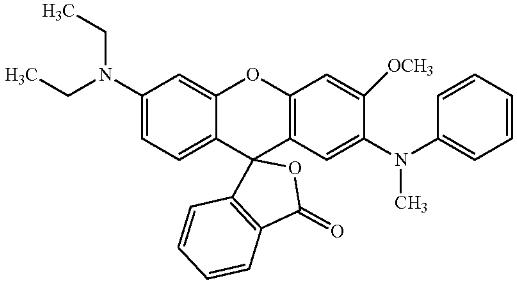
S-12
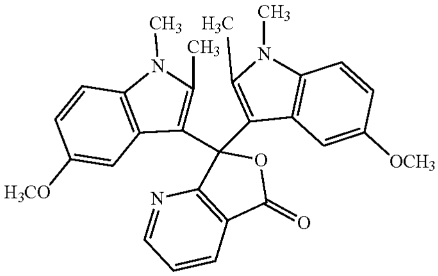
S-13
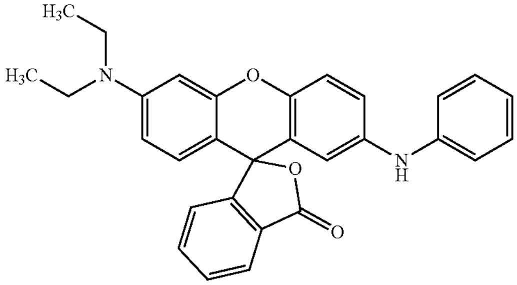

-continued

S-14

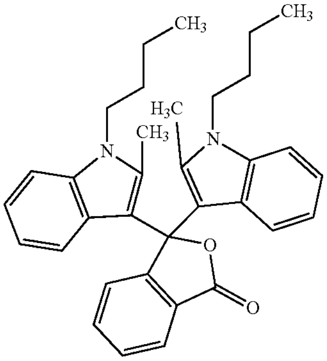

S-15

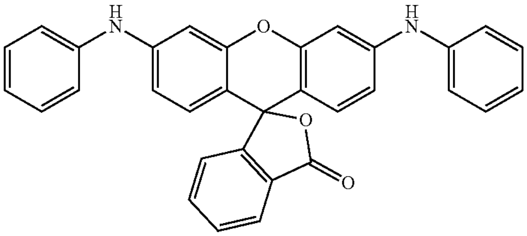

S-16

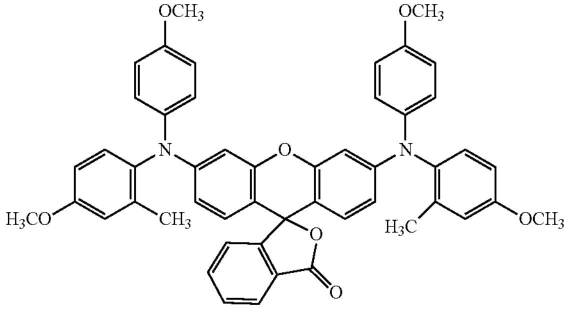

S-17

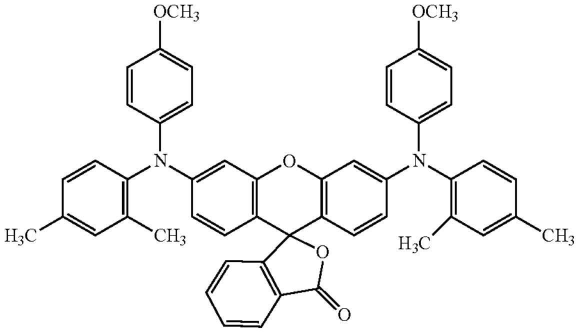

S-18

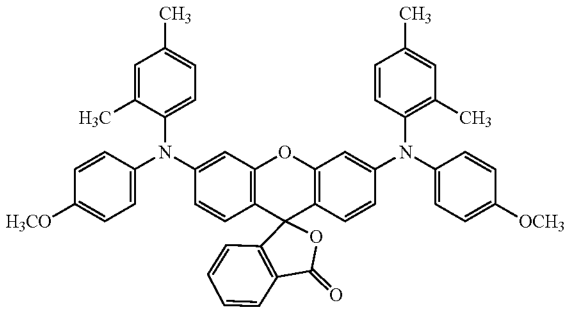

-continued

S-19

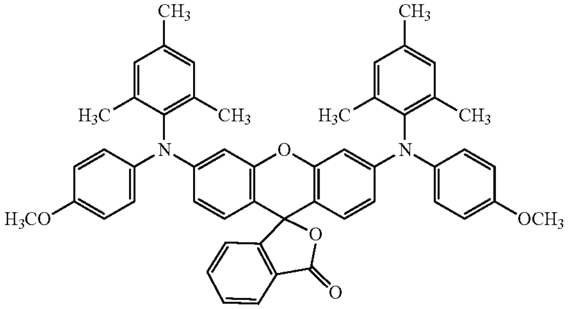

S-20

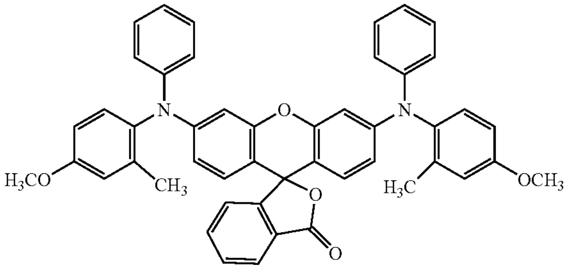

S-21

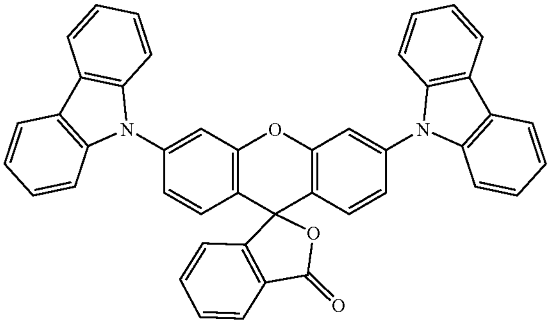

As the acid chromogenic agent, commercially available products can be used. Examples thereof include ETAC, RED500, RED520, CVL, S-205, BLACK305, BLACK400, BLACK100, BLACK500, H-7001, GREEN300, NIR-BLACK78, BLUE220, H-3035, BLUE203, ATP, H-1046, and H-2114 (all manufactured by Fukui Yamada Chemical Co., Ltd.), ORANGE-DCF, Vermilion-DCF, PINK-DCF, RED-DCF, BLMB, CVL, GREEN-DCF, and TH-107 (all manufactured by Hodogaya Chemical Co., Ltd.), ODB, ODB-2, ODB-4, ODB-250, ODB-BlackXV, Blue-63, Blue-502, GN-169, GN-2, Green-118, Red-40, and Red-8 (all manufactured by Yamamoto Chemicals, Inc.), crystal violet lactone (manufactured by Tokyo Chemical Industry Co., Ltd.), and the like. Among these commercially available products, ETAC, S-205, BLACK305, BLACK400, BLACK100, BLACK500, H-7001, GREEN300, NIR-BLACK78, H-3035, ATP, H-1046, H-2114, GREEN-DCF, Blue-63, GN-169, and crystal violet lactone are preferable because these form a film having excellent visible light absorbance.

From the viewpoint of visibility and visibility of exposed portions, examples of suitably used a leuco colorant include the following compounds.

CL-1

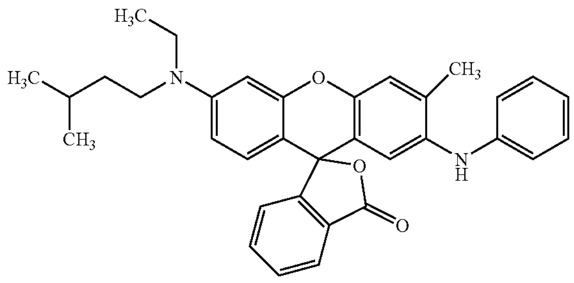

CL-2

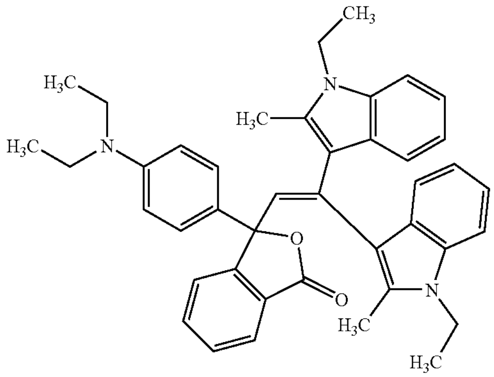

CL-3

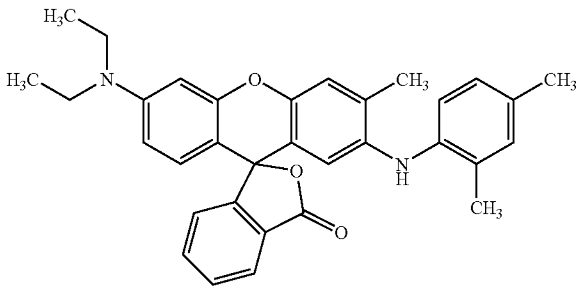

CL-4

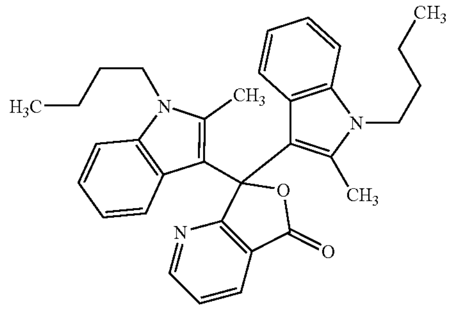

Each of these chromogenic agents may be used alone. Alternatively, two or more components can be used in combination.

The content of the chromogenic agent with respect to the total mass of the image-recording layer is preferably 0.5% by mass to 10% by mass, and more preferably 1% by mass to 5% by mass.

—Coloring Compound—

In the on-press development type planographic printing plate precursor according to the present disclosure, it is preferable that the image-recording layer contain a coloring compound capable of having a coloring reaction with a decomposition product generated by exposure of the image-recording layer.

"Coloring reaction" in the present disclosure is a chemical reaction accompanying a phenomenon of color development or discoloration.

The decomposition product generated by the exposure of the image-recording layer is not particularly limited. From the viewpoint of visibility of exposed portions, the decomposition product is preferably a decomposition product generated by the exposure of a polymerization initiator or a decomposition product generated by the exposure of an infrared absorber, more preferably a decomposition product generated by the exposure of a polymerization initiator, and particularly preferably a decomposition product generated by the exposure of an electron-donating polymerization initiator.

The decomposition product generated by the exposure of the image-recording layer includes not only a decomposition product decomposed by the exposure of the image-recording layer but also a compound generated by the further decomposition or modification of the decomposition product.

From the viewpoint of visibility of exposed portions, the coloring reaction is preferably a complex-forming reaction, and more preferably a boron complex-forming reaction.

An example of the coloring reaction will be shown below. The following reaction is a coloring reaction that occurs in a case where curcumin is used as a coloring compound, and sodium tetraphenylborate as a decomposition product generated by the exposure of the image-recording layer decomposes and generates boric acid. Due to keto-enol tautomerism, an enol tautomer of curcumin is generated as equilibrium. The reaction between the enol tautomer and the boric acid generates the following boron complex (Complex), and a coloring reaction from curcumin (yellow) to the following boron complex (red) occurs.

What is shown below is an example where hydrolysis proceeds to generate boric acid. For example, curcumin may form a complex together with diphenyl monohydroxyborate, monophenyl dihydroxyborate, or the like, or triphenyl borate may be coordinated as a zero-valent ligand to enol-type curcumin to form a complex.

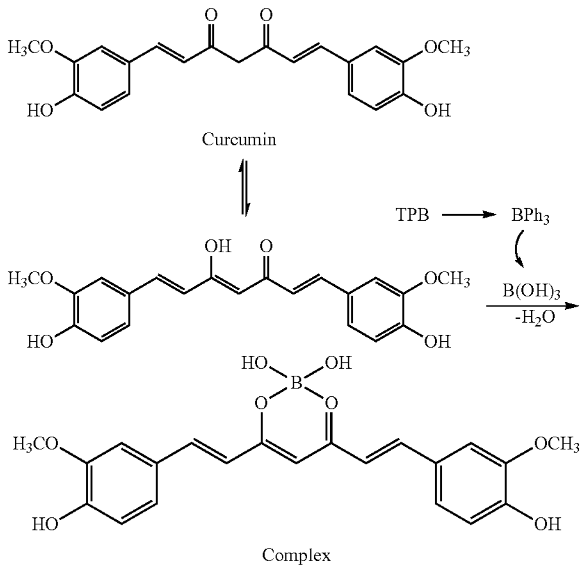

From the viewpoint of visibility of exposed portions and tone reproducibility, the above coloring compound is preferably a compound having one or more ketone structures, more preferably a compound having one or more 1,3-diketone structures, P-hydroxyketone structures, or β-aminoketone structures, even more preferably a compound having one or more 1,3-diketone structures or β-hydroxyketone structures, and particularly preferably a compound having one or more 1,3-diketone structures.

Examples of the coloring compound also include a compound having one or more 1-hydroxy-3-amino structures or 1-hydroxy-3-imino structures.

From the viewpoint of visibility of exposed portions and tone reproducibility, the coloring compound is preferably a compound having an aromatic ring structure, more preferably a compound having two or more aromatic ring structures, even more preferably a compound having two to four aromatic ring structures, and particularly preferably a compound having two aromatic ring structures.

As the aromatic ring structure, from the viewpoint of visibility of exposed portions and tone reproducibility, for example, at least one structure selected from the group consisting of a benzene ring structure and a naphthalene ring structure is preferable, and a benzene ring structure is more preferable.

The coloring compound may be a salt or a hydrate.

In a case where the coloring compound reacts with a decomposition product generated by the exposure of the image-recording layer and forms a complex, in the complex, the coloring compound may be a monodentate ligand or a polydentate ligand. From the viewpoint of complex forming properties, visibility of exposed portions, and tone reproducibility, the coloring compound is preferably a polydentate ligand, more preferably a ligand having a denticity of 2 to 6, even more preferably a ligand having a denticity of 2 to 4, particularly preferably a ligand having a denticity of 2 or 3, and most preferably a bidentate ligand.

From the viewpoint of visibility of exposed portions and tone reproducibility, the on-press development type planographic printing plate precursor according to the present disclosure preferably contains a compound represented by Formula 1C or Formula 2C and more preferably contains a compound represented by Formula 1C, as the coloring compound.

Furthermore, in the on-press development type planographic printing plate precursor according to the present disclosure, after exposure, the compound represented by Formula 1C or Formula 2C preferably reacts with the decomposition product generated by the exposure of the image-recording layer and forms a complex that has the compound represented by Formula 1C or Formula 2C as a zero-valent ligand or an anion formed by the removal of one hydrogen atom from the compound represented by Formula 1C or Formula 2C as a monovalent ligand, and more preferably reacts with the decomposition product generated by the exposure of the image-recording layer and forms a complex that has an anion formed by the removal of one hydrogen atom from the compound represented by Formula 1C or Formula 2C as a monovalent ligand.

Formula 1C

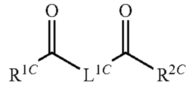

-continued

Formula 2C

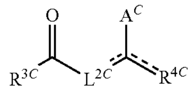

In Formula 1C and Formula 2C, $R^{1C}$ to $R^{4C}$ each independently represent a monovalent organic group, $L^{1C}$ and $L^{2C}$ each independently represent a divalent organic group, $A^{C}$ represents OH or $N^{R5}CR^{6C}$, $R^{5C}$ and $R^{6C}$ each independently represent a hydrogen atom or a monovalent organic group, and a dotted line portion represents a portion which may be a double bond.

In Formula 1C, two or more of $R^{1C}$, $L^{1C}$, and $R^{2C}$ may be bonded to form a ring structure. In Formula 2C, two or more of $R^{3C}$, $L^{2C}$, $R^{4C}$, $R^{5C}$, and $R^{6C}$ may be bonded to form a ring structure.

From the viewpoint of visibility of exposed portions and tone reproducibility, $R^{1C}$ and $R^{2C}$ in Formula 1C preferably each independently represent a monovalent organic group having an aromatic ring, more preferably each independently represent an aryl group or an alkenyl group having an aryl group, and particularly preferably each independently represent a 2-arylvinyl group.

The aryl group may have a substituent. From the viewpoint of visibility of exposed portions and tone reproducibility, the aryl group is preferably an aryl group which has one or more groups selected from the group consisting of a hydroxy group and an alkoxy group as substituents, more preferably a phenyl group which has one or more groups selected from the group consisting of a hydroxy group and an alkoxy group as substituents, and particularly preferably a phenyl group which has a hydroxy group and an alkoxy group as substituents.

$R^{1C}$ and $R^{2C}$ in Formula 1C preferably each independently have a carbon number (number of carbon atoms) of 6 to 50, more preferably each independently have a carbon number of 6 to 20, and particularly preferably each independently have a carbon number of 8 to 20.

It is preferable that $R^{1C}$ and $R^{2C}$ in Formula 1C be the same group.

From the viewpoint of visibility of exposed portions and tone reproducibility, $L^{1C}$ in Formula 1C is preferably an alkylene group or an alkylene group having an acyloxy group, and more preferably a methylene group or an acyloxymethylene group.

From the viewpoint of visibility of exposed portions, the acyloxy group is preferably an acyloxy group having 1 to 10 carbon atoms, more preferably an acyloxy group having 1 to 4 carbon atoms, and particularly preferably an acetoxy group.

From the viewpoint of visibility of exposed portions and tone reproducibility, $R^{3C}$ in Formula 2C is preferably a monovalent organic group having an aromatic ring, and more preferably an aryl group or an alkenyl group having an aryl group.

In Formula 2C, from the viewpoint of visibility of exposed portions and tone reproducibility, $L^{2C}$ and $R^{4C}$ are preferably bonded to form an aromatic ring, and more preferably bonded to form a benzene ring.

$R^{3C}$ and $R^{4C}$ in Formula 2C preferably each independently have 6 to 50 carbon atoms, more preferably each independently have 6 to 30 carbon atoms, and particularly preferably each independently have 6 to 20 carbon atoms.

In a case where $L^{2C}$ in Formula 2C is not bonded to $R^{4C}$, from the viewpoint of visibility of exposed portions and tone reproducibility, $L^{2C}$ is preferably an alkylene group or an alkylene group having an acyloxy group, and more preferably a methylene group or an acyloxymethylene group.

From the viewpoint of visibility of exposed portions, the acyloxy group is preferably an acyloxy group having 1 to 10 carbon atoms, more preferably an acyloxy group having 1 to 4 carbon atoms, and particularly preferably an acetoxy group.

It is preferable that $L^{2C}$ in Formula 2C be bonded to $R^{4C}$ to form a ring member of an aromatic ring structure.

From the viewpoint of visibility of exposed portions and tone reproducibility, the compound represented by Formula 2C is preferably a compound having a 1-hydroxyanthraquinone structure or a 1-aminoanthraquinone structure, and more preferably a compound having a 1-hydroxyanthraquinone structure.

From the viewpoint of visibility of exposed portions and tone reproducibility, $A^C$ in Formula 2C is preferably OH or $NHR^{6C}$, and more preferably OH.

$R^{5C}$ in $NR^{5C}R^{6C}$ in Formula 2C is preferably a hydrogen atom, an alkyl group, or an aryl group, more preferably a hydrogen atom or an alkyl group, and particularly preferably a hydrogen atom.

$R^{6C}$ in $NR^{5C}R^{6C}$ in Formula 2C is preferably a hydrogen atom, an alkyl group, or an anthraquinolyl group, more preferably an anthraquinolyl group, and particularly preferably a 1-anthraquinolyl group.

Specifically, suitable examples of the coloring compound include curcumin (C-1 that will be described later in Examples), demethoxycurcumin (C-2 that will be described later in Examples), alizarin (C-3 that will be described later in Examples), iminodianthraquinone (C-4 that will be described later in Examples), carminic acid (C-5 that will be described later in Examples), azomethine H (C-6 that will be described later in Examples), 1, 3-bis(4-methoxyphenyl)-1, 3-propanedione (C-7 that will be described later in Examples), 4-methoxychalcone (C-8 that will be described later in Examples), 1,3-bis(4-dimethylaminophenyl)-1,3-propanedione (C-9 that will be described later in Examples), acetoxycurcumin (C-10 that will be described later in Examples), and the like.

One coloring compound may be used alone, or two or more coloring compounds may be used in combination.

In addition, one compound represented by Formula 1C or Formula 2C may be used alone, or two or more compounds represented by Formula 1C or Formula 2C may be used in combination.

Furthermore, one complex described above may be formed, or two or more complexes described above may be formed.

From the viewpoint of visibility of exposed portions and tone reproducibility, the content of the coloring compound with respect to the total mass of the image-recording layer is preferably 0.001% by mass to 5% by mass, more preferably 0.01% by mass to 3% by mass, even more preferably 0.05% by mass to 2.5% by mass, and particularly preferably 0.05% by mass to 1.0% by mass.

The molar ratio of a content $M^C$ of the coloring compound (preferably the compound represented by Formula 1C or Formula 2C) in the image-recording layer to a content $M^I$ of the polymerization initiator, which will be described later, in the image-recording layer is preferably $M^C/M^I$=0.001 to 1, more preferably $M^C/M^I$=0.01 to 0.8, and particularly preferably $M^C/M^I$=0.05 to 0.5.

The molar ratio of a content $M^C$ of the coloring compound (preferably the compound represented by Formula 1C or Formula 2C) in the image-recording layer to a content $M^{DI}$ of the Electron-donating polymerization initiator, which will be described later, in the image-recording layer is preferably $M^C/M^{DI}$=0.001 to 1.5, more preferably $M^C/M^{DI}$=0.01 to 1, and particularly preferably $M^C/M^{DI}$=0.05 to 0.8.

[Formation of Image-Recording Layer]

The image-recording layer in the planographic printing plate precursor according to the present disclosure can be formed, for example, by preparing a coating liquid by dispersing or dissolving the necessary components described above in a known solvent, coating a support with the coating liquid by a known method such as bar coating, and drying the coating liquid, as described in paragraphs "0142" and "0143" of JP2008-195018A. The coating amount (solid content) of the image-recording layer after coating and drying varies with uses, but is preferably 0.3 g/m$^2$ to 3.0 g/m$^2$. In a case where the coating amount is in this range, excellent sensitivity and excellent film characteristics of the image-recording layer are obtained.

As the solvent, known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, and the like. One solvent may be used alone, or two or more solvents may be used in combination. The concentration of solid contents in the coating liquid is preferably 1% by mass to 50% by mass.

The coating amount (solid content) of the image-recording layer after coating and drying varies with uses. However, from the viewpoint of obtaining excellent sensitivity and excellent film characteristics of the image-recording layer, the coating amount is preferably 0.3 g/m$^2$ to 3.0 g/m$^2$.

The film thickness of the image-recording layer in the planographic printing plate precursor according to the present disclosure is preferably 0.1 μm to 3.0 μm, and more preferably 0.3 μm to 2.0 μm.

In the present disclosure, the film thickness of each layer in the planographic printing plate precursor is checked by preparing a slice by cutting the planographic printing plate precursor in a direction perpendicular to the surface of the precursor and observing the cross section of the slice with a scanning electron microscope (SEM).

<Overcoat Layer>

The on-press development type planographic printing plate precursor according to the present disclosure has a support, an image-recording layer, and an overcoat layer in this order, in which a content of an inorganic compound in the overcoat layer is zero or is more than 0% by mass or less than 1% by mass with respect to a total mass of the overcoat layer.

From the viewpoint of on-press developability and dampening water turbidity suppressiveness, the content of an inorganic compound in the overcoat layer is preferably zero or is more than 0% by mass and less than 0.5% by mass with respect to the total mass of the overcoat layer, and is more preferably zero.

From the viewpoint of visibility, it is preferable that the overcoat layer contain a color-altering compound.

In the on-press development type planographic printing plate precursor, the overcoat layer is the overcoat layer on the side of the image-recording layer that is on the support.

The overcoat layer may have a function of suppressing the reaction inhibiting image formation by blocking oxygen, a function of preventing the damage of the image-recording layer, a function of preventing ablation during exposure to high-illuminance lasers, and the like.

—Color-Altering Compound—

Furthermore, it is preferable that the overcoat layer contain a color-altering compound.

The overcoat layer may contain other components, such as a water-soluble polymer, a hydrophobic polymer, an oil sensitizing agent, an acid generator, and an infrared absorber, in addition to a color-altering compound. The outermost layer preferably contains a color-altering compound and a water-soluble polymer, and more preferably contains a color-altering compound, a water-soluble polymer, and a hydrophobic polymer.

In the present disclosure, "color-altering compound" refers to a compound which undergoes change in absorption in the visible light region (wavelength: 400 nm or more and less than 750 nm) due to the exposure to infrared. That is, in the present disclosure, "color-altering" means that the absorption in the visible light region (wavelength: 400 nm or more and less than 750 nm) changes due to the exposure to infrared.

Specifically, examples of the color-altering compound in the present disclosure include (1) compound that absorbs more light in the visible light region due to the exposure to infrared than before the exposure to infrared, (2) compound that is made capable of absorbing light in the visible light region due to the exposure to infrared, and (3) compound that is made incapable of absorbing light in the visible light region due to the exposure to infrared.

The infrared in the present disclosure is a ray having a wavelength of 750 nm to 1 mm, and preferably a ray having a wavelength of 750 nm to 1,400 nm.

The color-altering compound preferably includes a compound that develops color due to the exposure to infrared.

Furthermore, the color-altering compound preferably includes a decomposable compound that decomposes due to the exposure to infrared, and particularly preferably includes a decomposable compound that decomposes by either or both of heat and electron migration due to the exposure to infrared.

More specifically, the color-altering compound in the present disclosure is preferably a compound that decomposes due to the exposure to infrared (more preferably, decomposes by either or both of heat or electron migration due to the exposure to infrared) and absorbs more light in the visible light region than before the exposure to infrared or is made capable of absorbing light of shorter wavelengths and thus capable of absorbing light in the visible light region.

"Decomposes by electron migration" mentioned herein means that electrons excited to the lowest unoccupied molecular orbital (LUMO) from the highest occupied molecular orbital (HOMO) of the color-altering compound by exposure to infrared move to electron accepting groups (groups having potential close to LUMO) in a molecule by means of intramolecular electron migration and thus result in decomposition.

In addition, from the viewpoint of improving visibility of exposed portions, the color-altering compound is preferably a cyanine dye.

Hereinafter, as an example of the color-altering compound, a decomposable compound will be described.

There are no limitations on the decomposable compound as long as it absorbs at least a part of light in the infrared wavelength region (wavelength region of 750 nm to 1 mm, preferably a wavelength region of 750 nm to 1,400 nm) and decomposes. The decomposable compound is preferably a compound having maximum absorption wavelength in a wavelength region of 750 nm to 1,400 nm.

More specifically, the decomposable compound is preferably a compound that decomposes due to the exposure to infrared and generates a compound having maximum absorption wavelength in a wavelength region of 500 nm to 600 nm.

From the viewpoint of improving visibility of exposed portions, the decomposable compound is preferably a cyanine dye having a group that decomposes by exposure to infrared (specifically, $R^1$ in Formula 1-1 to Formula 1-7).

From the viewpoint of improving visibility of exposed portions, the decomposable compound is more preferably a compound represented by Formula 1-1.

Formula 1-1

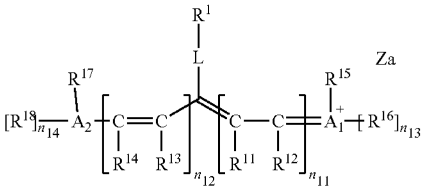

In Formula 1-1, $R^1$ represents a group that is represented by any of Formula 2-1 to Formula 4-1, $R^{11}$ to $R^{18}$ each independently represent a hydrogen atom, a halogen atom, —$R^a$, —$OR^b$, —$SR^c$, or —$NR^dR^e$, $R^a$ to $R^e$ each independently represent a hydrocarbon group, $A_1$, $A_2$, and a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, a sum of $n_{11}$ and $n_{12}$ is 2 or more, $n_{13}$ and $n_{14}$ each independently represent 0 or 1, L represents an oxygen atom, a sulfur atom, or —$NR^{10}$—, $R^{10}$ represents a hydrogen atom, an alkyl group, or an aryl group, and Za represents a counterion that neutralizes charge.

Formula 2-1

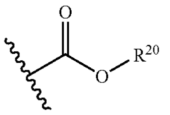

Formula 3-1

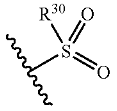

-continued

Formula 4-1

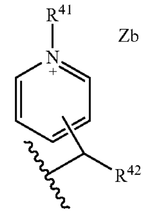

In Formula 2-1 to Formula 4-1, $R^{20}$, $R^{30}$, $R^{41}$, and $R^{42}$ each independently represent an alkyl group or an aryl group, Zb represents a counterion that neutralizes charge, a wavy line represents a bonding site with a group represented by L in Formula 1-1.

In a case where the compound represented by Formula 1-1 is exposed to infrared, the $R^1$-L bond is cleaved, L turns into =O, =S, or =$NR^{10}$, and the compound is discolored.

In Formula 1-1, $R^1$ represents a group represented by any of Formula 2-1 to Formula 4-1.

Hereinafter, each of the group represented by Formula 2-1, the group represented by Formula 3-1, and the group represented by Formula 4-1 will be described.

In Formula 2-1, $R^{20}$ represents an alkyl group or an aryl group, and the portion of the wavy line represents a bonding site with the group represented by L in Formula 1-1.

As the alkyl group represented by $R^{20}$, an alkyl group having 1 to 30 carbon atoms is preferable, an alkyl group having 1 to 15 carbon atoms is more preferable, and an alkyl group having 1 to 10 carbon atoms is even more preferable.

The alkyl group may be linear or branched, or may have a ring structure.

The aryl group represented by $R^{20}$ is preferably an aryl group having 6 to 30 carbon atoms, more preferably an aryl group having 6 to 20 carbon atoms, and even more preferably an aryl group having 6 to 12 carbon atoms.

From the viewpoint of visibility, $R^{20}$ is preferably an alkyl group.

From the viewpoint of decomposition properties and visibility, the alkyl group represented by $R^{20}$ is preferably a secondary alkyl group or a tertiary alkyl group, and more preferably a tertiary alkyl group.

Furthermore, from the viewpoint of decomposition properties and visibility, the alkyl group represented by $R^{20}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Specific examples of the group represented by Formula 2-1 will be shown below. However, the present disclosure is not limited thereto. In the following structural formulas, “represents a bonding site with the group represented by L in Formula 1-1.

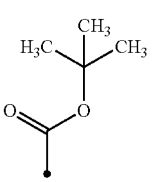
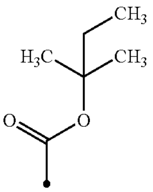
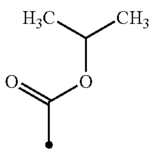

-continued

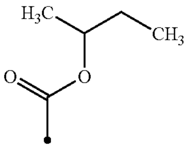
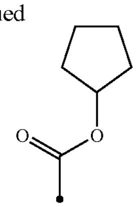

In Formula 3-1, $R^{30}$ represents an alkyl group or an aryl group, and the portion of the wavy line represents a bonding site with the group represented by L in Formula 1-1. The alkyl group and aryl group represented by $R^{30}$ are the same as the alkyl group and aryl group represented by $R^{20}$ in Formula 2-1, and the preferred aspects thereof are also the same.

From the viewpoint of decomposition properties and visibility, the alkyl group represented by $R^{30}$ is preferably a secondary alkyl group or a tertiary alkyl group, and more preferably a tertiary alkyl group.

Furthermore, from the viewpoint of decomposition properties and visibility, the alkyl group represented by $R^{30}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

In addition, from the viewpoint of decomposition properties and visibility, the alkyl group represented by $R^{30}$ is preferably a substituted alkyl group, more preferably a fluoro-substituted alkyl group, even more preferably a perfluoroalkyl group, and particularly preferably a trifluoromethyl group.

From the viewpoint of decomposition properties and visibility, the aryl group represented by $R^{30}$ is preferably a substituted aryl group. Examples of the substituent include an alkyl group (preferably an alkyl group having 1 to 4 carbon atoms), an alkoxy group (preferably an alkoxy group having 1 to 4 carbon atoms), and the like.

Specific examples of the group represented by Formula 3-1 will be shown below. However, the present disclosure is not limited thereto. In the following structural formulas, ● represents a bonding site with the group represented by L in Formula 1-1.

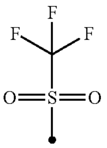
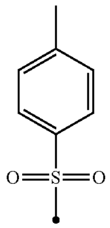

In Formula 4-1, $R^{41}$ and $R^{42}$ each independently represent an alkyl group or an aryl group, Zb represents a counterion that neutralizes charge, and the portion of the wavy line represents a bonding site with the group represented by L in Formula 1-1.

The alkyl group and aryl group represented by $R^{41}$ or $R^{42}$ are the same as the alkyl group and aryl group represented by $R^{20}$ in Formula 2, and preferred aspects thereof are also the same.

From the viewpoint of decomposition properties and visibility, $R^{41}$ is preferably an alkyl group.

From the viewpoint of decomposition properties and visibility, $R^{42}$ is preferably an alkyl group.

From the viewpoint of decomposition properties and visibility, the alkyl group represented by $R^{41}$ is preferably an alkyl group having 1 to 8 carbon atoms, more preferably an alkyl group having 1 to 4 carbon atoms, and particularly preferably a methyl group.

From the viewpoint of decomposition properties and visibility, the alkyl group represented by $R^{42}$ is preferably a secondary alkyl group or a tertiary alkyl group, and more preferably a tertiary alkyl group.

Furthermore, from the viewpoint of decomposition properties and visibility, the alkyl group represented by $R^{42}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Zb in Formula 4-1 may be a counterion that neutralizes charge, and may be included in Za in Formula 1-1 in the entirety of the compound.

Zb is preferably a sulfonate ion, a carboxylate ion, a tetrafluoroborate ion, a hexafluorophosphate ion, a p-toluenesulfonate ion, or a perchlorate ion, and more preferably a tetrafluoroborate ion.

Specific examples of the group represented by Formula 4-1 will be shown below. However, the present disclosure is not limited thereto. In the following structural formulas, ● represents a bonding site with the group represented by L in Formula 1-1.

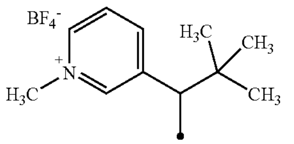

L in Formula 1-1 is preferably an oxygen atom or —$NR^{10}$—, and particularly preferably an oxygen atom.

Furthermore, $R^{10}$ in —$NR^{10}$— is preferably an alkyl group. The alkyl group represented by $R^{10}$ is preferably an alkyl group having 1 to 10 carbon atoms. The alkyl group represented by $R^{10}$ may be linear or branched, or may have a ring structure.

Among the alkyl groups, a methyl group or a cyclohexyl group is preferable.

In a case where $R^{10}$ in —$NR^{10}$— represents an aryl group, the aryl group is preferably an aryl group having 6 to 30 carbon atoms, more preferably an aryl group having 6 to 20 carbon atoms, and even more preferably an aryl group having 6 to 12 carbon atoms. These aryl groups may have a substituent.

In Formula 1-1, $R^{11}$ to $R^{18}$ preferably each independently represent a hydrogen atom, —$R^a$, —$OR^b$, —$SR^c$, or —$NR^dR^e$.

The hydrocarbon group represented by $R^a$ to $R^e$ is preferably a hydrocarbon group having 1 to 30 carbon atoms, more preferably a hydrocarbon group having 1 to 15 carbon atoms, and even more preferably a hydrocarbon group having 1 to 10 carbon atoms.

The hydrocarbon group may be linear or branched or may have a ring structure.

As the hydrocarbon group, an alkyl group is particularly preferable.

The aforementioned alkyl group is preferably an alkyl group having 1 to 30 carbon atoms, more preferably an alkyl group having 1 to 15 carbon atoms, and even more preferably an alkyl group having 1 to 10 carbon atoms.

The alkyl group may be linear or branched, or may have a ring structure.

Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, or a butyl group is preferable.

The above alkyl group may have a substituent.

Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, groups obtained by combining these, and the like.

$R^{11}$ to $R^{14}$ in Formula 1-1 preferably each independently represent a hydrogen atom or —$R^a$ (that is, a hydrocarbon group), more preferably each independently represent a hydrogen atom or an alkyl group, and even more preferably each independently represent a hydrogen atom except in the cases described below.

Particularly, each of $R^{11}$ and $R^{13}$ bonded to the carbon atom that is bonded to the carbon atom to which L is bonded is preferably an alkyl group. It is more preferable that $R^{11}$ and $R^{13}$ be linked to each other to form a ring. The ring to be formed in this way may be a monocyclic or polycyclic ring. Specifically, examples of the ring to be formed include a monocyclic ring such as a cyclopentene ring, a cyclopentadiene ring, a cyclohexene ring, or a cyclohexadiene ring, and a polycyclic ring such as an indene ring or an indole ring.

Furthermore, it is preferable that $R^{12}$ bonded to the carbon atom to which $A_1^+$ is bonded be linked to $R^{15}$ or $R^{16}$ (preferably $R^{16}$) to form a ring, and $R^{14}$ bonded to the carbon atom to which $A_2$ is bonded be linked to $R^{17}$ or $R^{18}$ (preferably $R^{18}$) to form a ring.

In Formula 1-1, $n_{13}$ is preferably 1, and $R^{16}$ is preferably —$R^a$ (that is, a hydrocarbon group).

Furthermore, it is preferable that $R^{16}$ be linked to $R^{12}$ bonded to the carbon atom, to which $A_1^+$ is bonded, to form a ring. As the ring to be formed, an indolium ring, a pyrylium ring, a thiopyrylium ring, a benzoxazoline ring, or a benzimidazoline ring is preferable, and an indolium ring is more preferable from the viewpoint of improving visibility of exposed portions. These rings may further have a substituent.

In Formula 1-1, $n_{14}$ is preferably 1, and $R^{18}$ is preferably —$R^a$ (that is, a hydrocarbon group).

Furthermore, it is preferable that $R^{18}$ be linked to $R^{14}$ bonded to the carbon atom, to which $A_2$ is bonded, to form a ring. As the ring to be formed, an indole ring, a pyran ring, a thiopyran ring, a benzoxazole ring, or a benzimidazole ring is preferable, and an indole ring is more preferable from the viewpoint of improving visibility of exposed portions. These rings may further have a substituent.

It is preferable that $R^{16}$ and $R^{18}$ in Formula 1-1 be the same group. In a case where $R^{16}$ and $R^{18}$ each form a ring, it is preferable that the formed rings have the same structure except for $A_1^+$ and $A_2$.

It is preferable that $R^{15}$ and $R^{17}$ in Formula 1-1 be the same group. Furthermore, $R^{15}$ and $R^{17}$ are preferably —$R^a$ (that is, a hydrocarbon group), more preferably an alkyl group, and even more preferably a substituted alkyl group.

From the viewpoint of improving water solubility, $R^{15}$ and $R^{17}$ in the compound represented by Formula 1-1 are preferably a substituted alkyl group.

Examples of the substituted alkyl group represented by $R^{15}$ or $R^{17}$ include a group represented by any of Formula (a1) to Formula (a4).

$$—W—(R^{W0}—O)_{n_{W1}}—R^{W1} \quad (a1)$$

$$—R^{W2}—CO_2M \quad (a2)$$

$$—R^{W3}—PO_3M_2 \quad (a3)$$

$$—R^{W4}—SO_3M \quad (a4)$$

In Formula (a1) to Formula (a4), $R^{W0}$ represents an alkylene group having 2 to 6 carbon atoms, W represents a single bond or an oxygen atom, and $n_{W1}$ represents an integer of 1 to 45, $R^{W1}$ represents an alkyl group having 1 to 12 carbon atoms or —C(=O)—$R^{W5}$, $R^{W5}$ represents an alkyl group having 1 to 12 carbon atoms, $R^{W2}$ to $R^{W4}$ each independently represent a single bond or an alkylene group having 1 to 12 carbon atoms, and M represents a hydrogen atom, a sodium atom, a potassium atom, or an onium group.

Specific examples of the alkylene group represented by $R^{W0}$ in Formula (a1) include an ethylene group, an n-propylene group, an isopropylene group, an n-butylene group, an isobutylene group, an n-pentylene group, an isopentylene group, an n-hexyl group, an isohexyl group, and the like. Among these, an ethylene group, an n-propylene group, an isopropylene group, or an n-butylene group is preferable, and an n-propylene group is particularly preferable.

$n_{W1}$ is preferably 1 to 10, more preferably 1 to 5, and particularly preferably 1 to 3.

Specific examples of the alkyl group represented by $R^{W1}$ include a methyl group, an ethyl group, an n-propyl group, an isopropyl group, an n-butyl group, an isobutyl group, a tert-butyl group, an n-pentyl group, an isopentyl group, a neopentyl group, an n-hexyl group, an n-octyl group, an n-dodecyl group, and the like. Among these, a methyl group, an ethyl group, an n-propyl group, an isopropyl group, an n-butyl group, or a tert-butyl group is preferable, a methyl group or an ethyl group is more preferable, and a methyl group is particularly preferable.

The alkyl group represented by $R^{W5}$ is the same as the alkyl group represented by $R^{W1}$. Preferred aspects of the alkyl group represented by $R^{W5}$ are the same as preferred aspects of the alkyl group represented by $R^{W1}$.

Specific examples of the group represented by Formula (a1) will be shown below. However, the present disclosure is not limited thereto. In the following structural formulas, Me represents a methyl group, Et represents an ethyl group, and * represents a bonding site.

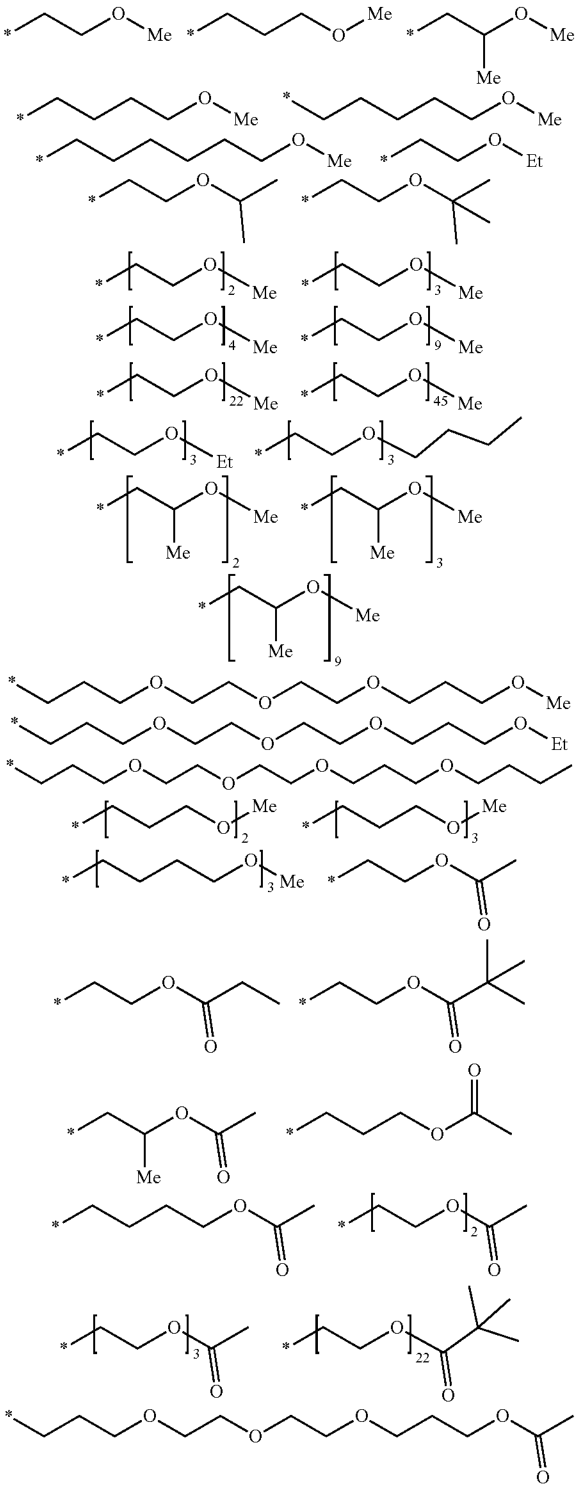

Specific examples of the alkylene group represented by $R^{W2}$ to $R^{W4}$ in Formula (a2) to Formula (a4) include a methylene group, an ethylene group, an n-propylene group, an isopropylene group, an n-butylene group, an isobutylene group, an n-pentylene group, an isopentylene group, an n-hexyl group, an isohexyl group, an n-octylene group, an n-dodecylene group, and the like. Among these, an ethylene group, an n-propylene group, an isopropylene group, or an n-butylene group is preferable, and an ethylene group or an n-propylene group is particularly preferable.

In Formula (a3), two Ms may be the same as or different from each other.

Examples of the onium group represented by M in Formula (a2) to Formula (a4) include an ammonium group, an iodonium group, a phosphonium group, a sulfonium group, and the like.

All of $CO_2M$ in Formula (a2), $PO_3M_2$ in Formula (a2), and $SO_3M$ in Formula (a4) may have an anion structure from which M is dissociated. The countercation of the anion structure may be $A_1^+$ or a cation that can be contained in $R^1$-L in Formula 1-1.

Among the groups represented by Formula (a1) to Formula (a4), the group represented by Formula (a1), Formula (a2), or Formula (a4) is preferable.

$n_{11}$ and $n_{12}$ in Formula 1-1 are preferably the same as each other, and preferably both represent an integer of 1 to 5, more preferably both represent an integer of 1 to 3, even more preferably both represent 1 or 2, and particularly preferably both represent 2.

$A_1$ and $A_2$ in Formula 1-1 each independently represent an oxygen atom, a sulfur atom, or a nitrogen atom. Among these, a nitrogen atom is preferable.

$A_1$ and $A_2$ in Formula 1-1 are preferably the same atoms.

Za in Formula 1-1 represents a counterion that neutralizes charge.

In a case where all of $R^{11}$ to $R^{18}$ and $R^1$-L are groups having a neutral charge, Za is a monovalent counteranion. Here, $R^{11}$ to $R^{18}$ and $R^1$-L may have an anion structure or a cation structure. For example, in a case where two or more among $R^{11}$ to $R^{18}$ and $R^1$-L have an anion structure, Za can also be a countercation.

In a case where the cyanine dye represented by Formula 1-1 has such a structure that the overall charge of the compound is neutral except for Za, Za is unnecessary.

In a case where Za is a counteranion, examples thereof include a sulfonate ion, a carboxylate ion, a tetrafluoroborate ion, a hexafluorophosphate ion, a p-toluenesulfonate ion, a perchlorate ion, and the like. Among these, a tetrafluoroborate ion is preferable.

In a case where Za is a countercation, examples thereof include an alkali metal ion, an alkaline earth metal ion, an ammonium ion, a pyridinium ion, a sulfonium ion, and the like. Among these, a sodium ion, a potassium ion, an ammonium ion, a pyridinium ion, or a sulfonium ion is preferable, and a sodium ion, a potassium ion, or an ammonium ion is more preferable.

From the viewpoint of improving visibility of exposed portions, the decomposable compound is more preferably a compound represented by Formula 1-2 (that is, a cyanine dye).

Formula 1-2

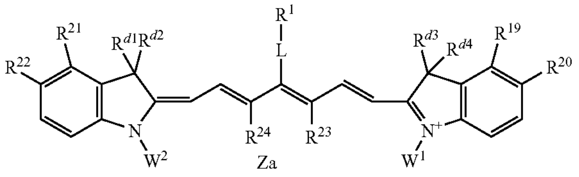

In Formula 1-2, $R^1$ represents a group that is represented by any of Formula 2-1 to Formula 4-1, $R^{19}$ to $R^{22}$ each independently represent a hydrogen atom, a halogen atom, $-R^a$, $-OR^b$, $-CN$, $-SR^c$, or $-NR^dR^e$, $R^{23}$ and $R^{24}$ each independently represent a hydrogen atom or $-R^a$, $R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or $-NR^{10}-$, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

$R^1$ in Formula 1-2 has the same definition as $R^1$ in Formula 1-1, and preferred aspects thereof are also the same.

In Formula 1-2, $R^{19}$ to $R^{22}$ preferably each independently represent a hydrogen atom, a halogen atom, $-R^a$, $-OR^b$, or $-CN$.

More specifically, $R^{19}$ and $R^{21}$ are preferably a hydrogen atom or $-R^a$.

Furthermore, $R^{20}$ and $R^{22}$ are preferably a hydrogen atom, $-R^a$, $-OR^b$, or $-CN$.

$-R^a$ represented by $R^{19}$ to $R^{22}$ is preferably an alkyl group or an alkenyl group.

In a case where all of $R^{19}$ to $R^{22}$ are $-R^a$, it is preferable that $R^{19}$ and $R^{20}$ and $R^{21}$ and $R^{22}$ be linked to each other to form a monocyclic or polycyclic ring.

Examples of the ring formed of $R^{19}$ and $R^{20}$ or $R^{21}$ and $R^{22}$ linked to each other include a benzene ring, a naphthalene ring, and the like.

$R^{23}$ and $R^{24}$ in Formula 1-2 are preferably linked to each other to form a monocyclic or polycyclic ring.

The ring formed of $R^{23}$ and $R^{24}$ linked to each other may be a monocyclic or polycyclic ring. Specifically, examples of the ring to be formed include a monocyclic ring such as a cyclopentene ring, a cyclopentadiene ring, a cyclohexene ring, or a cyclohexadiene ring, and a polycyclic ring such as an indene ring.

$R^{d1}$ to $R^{d4}$ in Formula 1-2 are preferably an unsubstituted alkyl group. Furthermore, all of $R^{d1}$ to $R^{d4}$ are preferably the same group.

Examples of the unsubstituted alkyl group include unsubstituted alkyl groups having 1 to 4 carbon atoms. Among these, a methyl group is preferable.

From the viewpoint of improving water solubility of the compound represented by Formula 1-2, $W^1$ and $W^2$ in Formula 1-2 preferably each independently represent a substituted alkyl group.

Examples of the substituted alkyl group represented by $W^1$ and $W^2$ include a group represented by any of Formula (a1) to Formula (a4) in Formula 1-1, and preferred aspects thereof are also the same.

From the viewpoint of on-press developability, $W^1$ and $W^2$ preferably each independently represent an alkyl group having a substituent. The alkyl group preferably has at least $-OCH_2CH_2-$, a sulfo group, a salt of a sulfo group, a carboxy group, or a salt of a carboxy group, as the substituent.

Za represents a counterion that neutralizes charge in the molecule.

In a case where all of $R^{19}$ to $R^{22}$, $R^{21}$ and $R^{24}$, $R^{d1}$ to $R^{d4}$, $W^1$, $W^2$, and $R^1$-L are groups having a neutral charge, Za is a monovalent counteranion. Here, $R^{19}$ to $R^{22}$, $R^{23}$ and $R^{24}$, $R^{d1}$ to $R^{d4}$, $W^1$, $W^2$, and $R^1$-L may have an anion structure or a cation structure. For example, in a case where two or more among $R^{19}$ to $R^{22}$, $R^{23}$ and $R^{24}$, $R^{d1}$ to $R^{d4}$, $W^1$, $W^2$, and $R^1$-L have an anion structure, Za can be a countercation.

In a case where the compound represented by Formula 1-2 has such a structure that the overall charge of the compound is neutral except for Za, Za is unnecessary.

Examples of the case where Za is a counteranion are the same as such examples of Za in Formula 1-1, and preferred aspects thereof are also the same. Furthermore, examples of the case where Za is a countercation are the same as such examples of Za in Formula 1-1, and preferred aspects thereof are also the same.

From the viewpoint of decomposition properties and visibility, the cyanine dye as a decomposable compound is even more preferably a compound represented by any of Formula 1-3 to Formula 1-7.

Particularly, from the viewpoint of decomposition properties and visibility, the cyanine dye is preferably a compound represented by any of Formula 1-3, Formula 1-5, and Formula 1-6.

Formula 1-3

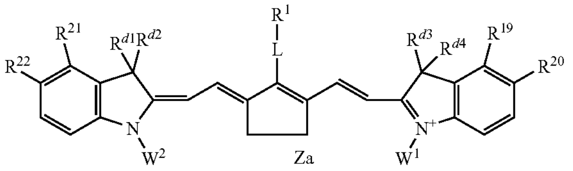

Formula 1-4

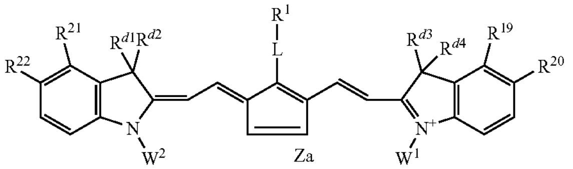

Formula 1-5

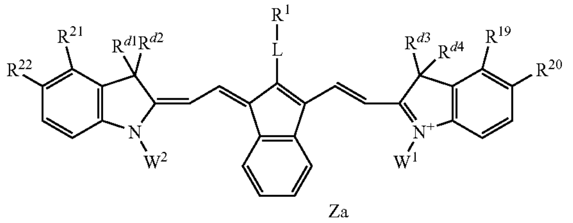

Formula 1-6

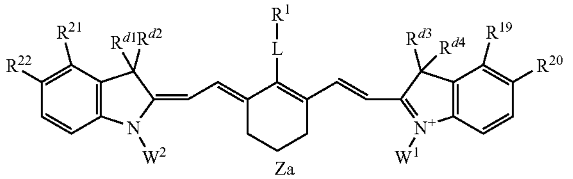

Formula 1-7

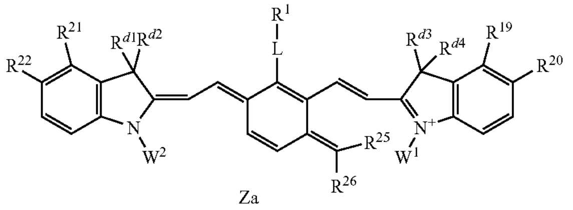

In Formula 1-3 to Formula 1-7, $R^1$ represents a group that is represented by any of Formula 2-1 to Formula 4-1, $R^{19}$ to $R^{22}$ each independently represent a hydrogen atom, a halogen atom, —$R^a$, —$OR^b$, —CN, —$SR^c$, or —$NR^dR^e$, $R^{25}$ and $R^{26}$ each independently represent a hydrogen atom, a halogen atom, or —$R^a$, $R^a$ to $R^e$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or —$NR^{10}$—, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

$R^1$, $R^{19}$ to $R^{22}$, $R^{d1}$ to $R^{d4}$, $W^1$, $W^2$, and L in Formula 1-3 to Formula 1-7 have the same definitions as $R^1$, $R^{19}$ to $R^{22}$, $R^{d1}$ to $R^{d4}$, $W^1$, $W^2$, and L in Formula 1-2, and preferred aspects thereof are also the same.

$R^{25}$ and $R^{26}$ in Formula 1-7 preferably each independently represent a hydrogen atom or an alkyl group, more preferably each independently represent an alkyl group, and particularly preferably each independently represent a methyl group.

Specific examples of the cyanine dye as a decomposable compound will be shown below. However, the present disclosure is not limited thereto.

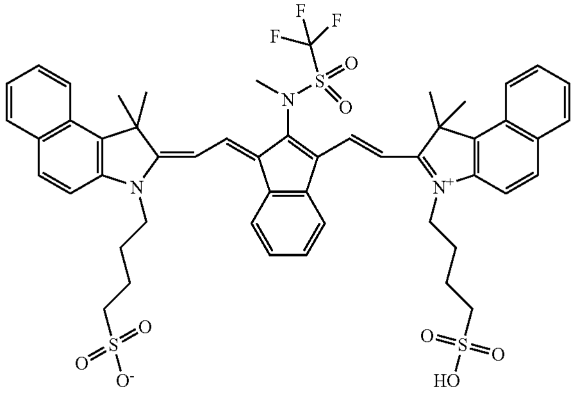

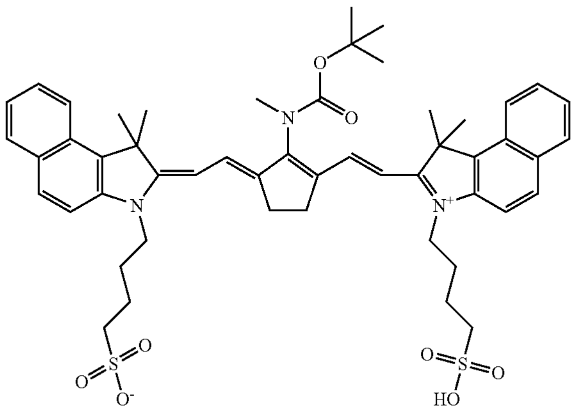

-continued

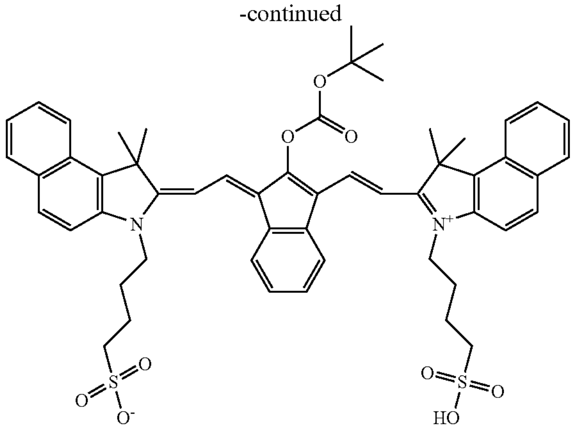

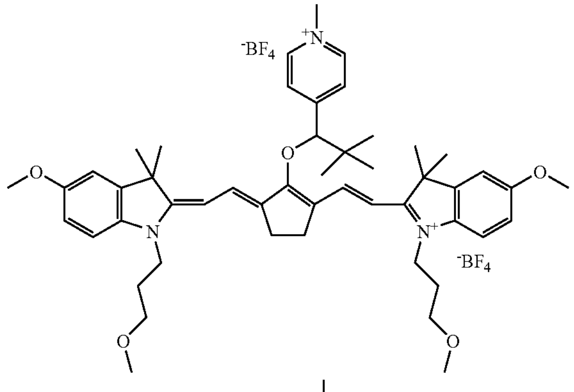

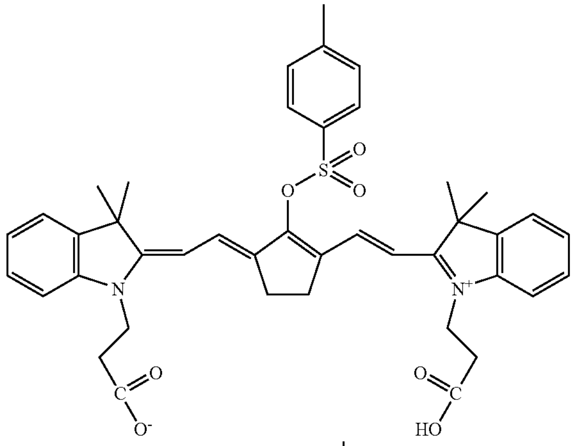

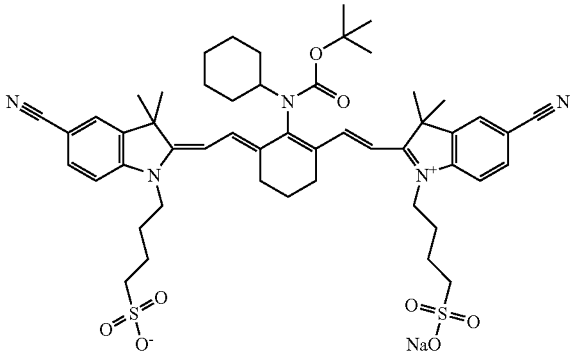

Furthermore, as the cyanine dye which is a decomposable compound, the infrared absorbing compound described in WO2019/219560A can be suitably used.

The color-altering compound may include an acid chromogenic agent.

As the acid chromogenic agent, it is possible to use the compounds described above as acid chromogenic agents in the image-recording layer, and preferred aspects thereof are also the same.

One color-altering compound may be used alone, or two or more components may be combined and used as the color-altering compound.

As the color-altering compound, the decomposable compound described above and the acid generator that will be described later may be used in combination.

From the viewpoint of visibility, the content of the color-altering compound in the overcoat layer with respect to the total mass of the overcoat layer is preferably 0.10% by mass to 50% by mass, more preferably 0.50% by mass to 30% by mass, and even more preferably 1.0% by mass to 20% by mass.

From the viewpoint of visibility, $M^X/M^Y$ which is a ratio of a content $M^X$ of the color-altering compound in the overcoat layer to a content $M^Y$ of the infrared absorber in the image-recording layer is preferably 0.1 or more, more preferably 0.2 or more, and particularly preferably 0.3 or more and 3.0 or less.

—Hydrophilic Polymer—

From the viewpoint of development removability (more preferably on-press developability), the overcoat layer preferably contains a hydrophilic polymer, and more preferably contains a water-soluble polymer.

In the present disclosure, a water-soluble polymer refers to a polymer that dissolves 1 g or more in 100 g of pure water at 70 °C and is not precipitated even though a solution of 1 g of the polymer in 100 g of pure water at 70 °C is cooled to 25 °C.

Examples of the water-soluble polymer used in the overcoat layer include polyvinyl alcohol, modified polyvinyl alcohol, polyvinylpyrrolidone, a cellulose derivative, polyethylene glycol, poly(meth)acrylonitrile, and the like.

As the modified polyvinyl alcohol, acid-modified polyvinyl alcohol having a carboxy group or a sulfo group is preferably used. Specific examples thereof include modified polyvinyl alcohols described in JP2005-250216A and JP2006-259137A.

Among these, as the hydrophilic polymer, from the viewpoint of on-press developability, for example, a cellulose derivative is preferable, and hydroxyalkyl cellulose is more preferable.

Preferred examples of the water-soluble polymer include polyvinyl alcohol. Particularly, as the water-soluble polymer to be used, polyvinyl alcohol having a saponification degree of 50% or more is more preferable.

The saponification degree is preferably 60% or higher, more preferably 70% or higher, and even more preferably 85% or higher. The upper limit thereof of the saponification degree is not particularly limited, and may be 100% or less.

The saponification degree is measured according to the method described in JIS K 6726: 1994.

Preferred examples of the water-soluble polymer also include polyvinylpyrrolidone.

As the water-soluble polymer, it is also preferable to use polyvinyl alcohol and polyvinylpyrrolidone in combination.

One water-soluble polymer may be used alone, or two or more water-soluble polymers may be used in combination.

In a case where the overcoat layer contains a water-soluble polymer, the content of the water-soluble polymer with respect to the total mass of the overcoat layer is preferably 1% by mass to 99% by mass, more preferably 3% by mass to 97% by mass, and even more preferably 5% by mass to 95% by mass.

—Other Components—

The overcoat layer may contain other components such as a hydrophobic polymer, an oil sensitizing agent, an acid generator, and an infrared absorber, in addition to the color-altering compound and water-soluble polymer described above.

Hereinafter, those other components will be described.

<<Hydrophobic Polymer>>

The overcoat layer preferably contains a hydrophobic polymer.

The hydrophobic polymer refers to a polymer that dissolves less than 1 g or does not dissolve in 100 g of pure water at 70 °C.

Examples of the hydrophobic polymer include polyethylene, polystyrene, polyvinyl chloride, polyvinylidene chloride, polyalkyl (meth)acrylate ester (for example, polymethyl (meth)acrylate, polyethyl (meth)acrylate, polybutyl (meth)acrylate, and the like), a copolymer obtained by combining raw material monomers of these polymers, and the like.

The hydrophobic polymer preferably includes a polyvinylidene chloride resin.

Furthermore, the hydrophobic polymer preferably includes a styrene-acrylic copolymer.

In addition, from the viewpoint of on-press developability, the hydrophobic polymer is preferably hydrophobic polymer particles.

One hydrophobic polymer may be used alone, or two or more hydrophobic polymers may be used in combination.

In a case where the overcoat layer contains a hydrophobic polymer, the content of the hydrophobic polymer with respect to the total mass of the overcoat layer is preferably 1% by mass to 80% by mass, and more preferably 5% by mass to 50% by mass.

<<Acid Generator>>

In a case where an acid chromogenic agent is used as a color-altering compound, the overcoat layer preferably contains an acid generator.

"Acid generator" in the present disclosure is a compound that generates an acid by light or heat. Specifically, the acid generator refers to a compound that generates an acid by being decomposed by exposure to infrared.

The acid to be generated is preferably a strong acid having a pKa of 2 or less, such as sulfonic acid or hydrochloric acid. The acid generated from the acid generator enables the acid chromogenic agent to discolor.

Specifically, as the acid generator, from the viewpoint of sensitivity and stability, an onium salt compound is preferable.

Specific examples of onium salts suitable as the acid generator include the compounds described in paragraphs "0121" to "0124" of WO2016/047392A.

Particularly, sulfonate, carboxylate, $BPh_4^-$, $BF_4^-$, $PF_6^-$, $ClO_4^-$ of triarylsulfonium or diaryliodonium, and the like are preferable. Ph represents a phenyl group.

One acid generator may be used alone, or two or more acid generators may be used in combination.

In a case where the overcoat layer contains an acid generator, the content of the acid generator with respect to the total mass of the overcoat layer is preferably 0.5% by mass to 30% by mass, and more preferably 1% by mass to 20% by mass.

The overcoat layer may contain known additives such as an oil sensitizing agent, an inorganic lamellar compound, and a surfactant, in addition to the components described above.

The overcoat layer is formed by coating by a known method and drying.

The coating amount of the overcoat layer (solid content) is preferably 0.01 g/m$^2$ to 10 g/m$^2$, more preferably 0.02 g/m$^2$ to 3 g/m$^2$, and particularly preferably 0.1 g/m$^2$ to 2.0 g/m$^2$.

The film thickness of the overcoat layer is preferably 0.1 μm to 5.0 μm, and more preferably 0.3 μm to 4.0 μm.

The film thickness of the overcoat layer is preferably 0.1 times to 5.0 times the film thickness of the image-recording layer that will be described later, and more preferably 0.2 times to 3.0 times the film thickness of the image-recording layer that will be described later.

The overcoat layer may contain known additives such as a plasticizer for imparting flexibility, a surfactant for improving coating properties, and inorganic particles for controlling surface sliding properties.

<Support>

The planographic printing plate precursor according to the present disclosure has a support.

The support to be used can be appropriately selected from known supports for a planographic printing plate precursor.

As the support, a support having a hydrophilic surface (hereinafter, also called "hydrophilic support") is preferable.

As the support in the present disclosure, an aluminum plate is preferable which has been roughened using a known method and has undergone an anodization treatment. That is, the support in the present disclosure preferably has an aluminum plate and an aluminum anodic oxide film disposed on the aluminum plate.

The aforementioned support preferably has an aluminum plate and an anodic oxide film of aluminum disposed on the aluminum plate, the anodic oxide film is preferably at a position closer to a side of the image-recording layer than the aluminum plate and preferably has micropores extending in a depth direction from the surface of the anodic oxide film on the side of the image-recording layer, and the average diameter of the micropores within the surface of the anodic oxide film is preferably more than 10 nm and 100 nm or less.

Furthermore, the micropores are preferably each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communicate position, an average diameter of the large diameter portion within the surface of the anodic oxide film is preferably 15 nm to 100 nm, and an average diameter of the small diameter portion at the communicate position is preferably 13 nm or less.

FIG. 1 is a schematic cross-sectional view of an embodiment of an aluminum support **12*a*. The aluminum support 12*a* has a laminated structure in which an aluminum plate 18 and an anodic oxide film 20*a* of aluminum (hereinafter, also simply called "anodic oxide film 20*a*") are laminated in this order. The anodic oxide film 20*a* in the aluminum support 12*a* is positioned such that the anodic oxide film 20*a* is closer to the image-recording layer side than the aluminum plate 18**. That is, it is preferable that the planographic printing plate precursor according to the present disclosure have at least an anodic oxide film, an image-recording layer, and a water-soluble resin layer in this order on an aluminum plate.

—Anodic Oxide Film—

Hereinafter, preferred aspects of the anodic oxide film **20*a*** will be described.

The anodic oxide film 20*a* is a film prepared on a surface of the aluminum plate 18 by an anodization treatment. This film has uniformly distributed ultrafine micropores 22*a* approximately perpendicular to the surface of the film. The micropores 22*a* extend from a surface of the anodic oxide film 20*a* on the image-recording layer side (a surface of the anodic oxide film 20*a* opposite to the aluminum plate 18) along the thickness direction (toward the aluminum plate 18).

The average diameter (average opening diameter) of the micropores 22*a*, which are in the anodic oxide film 20*a*, at the surface of the anodic oxide film 20*a* is preferably more than 10 nm and 100 nm or less. Particularly, from the viewpoint of balance between printing durability, antifouling properties, and image visibility, the average diameter of the micropores 22*a* is more preferably 15 nm to 60 nm, even more preferably 20 nm to 50 nm, and particularly preferably 25 nm to 40 nm. The internal diameter of the pores may be larger or smaller than the pore diameter within the surface layer.

In a case where the average diameter is more than 10 mu, printing durability and image visibility are excellent. Furthermore, in a case where the average diameter is 100 nm or less, printing durability is excellent.

The average diameter of the micropores 22*a* is a value determined by observing the surface of the anodic oxide film 20*a* with a field emission scanning electron microscope (FE-SEM) at 150,000× magnification (N=4), measuring the size (diameter) of 50 micropores existing in a range of 400 nm×600 $nm^2$ in the obtained 4 images, and calculating the arithmetic mean thereof.

In a case where the shape of the micropores 22*a* is not circular, the equivalent circular diameter is used. "Equivalent circular diameter" is a diameter determined on an assumption that the opening portion is in the form of a circle having the same projected area as the projected area of the opening portion.

The shape of the micropores 22*a* is not particularly limited. In FIG. 1, the micropores 22*a* have a substantially straight tubular shape (substantially cylindrical shape). However, the micropores 22*a* may have a conical shape that tapers along the depth direction (thickness direction). The shape of the bottom portion of the micropores 22*a* is not particularly limited, and may be a curved (convex) or flat surface shape.

In the support, the micropores may be each composed of a large diameter portion that extends to a position at a certain depth from the surface of the anodic oxide film and a small diameter portion that is in communication with a bottom portion of the large diameter portion and extends to a position at a certain depth from the communicate position.

Figure 2:
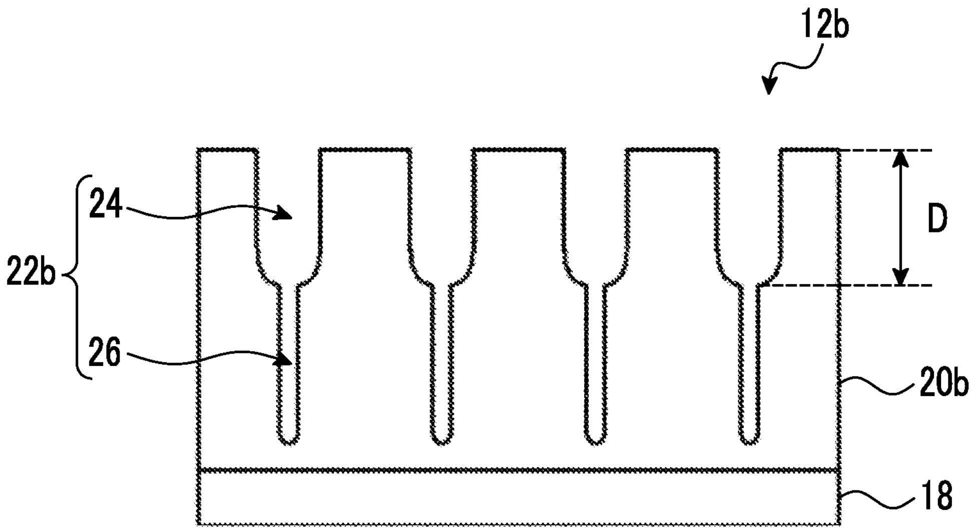
FIG. 2 is a schematic cross-sectional view of an embodiment of an aluminum support having an anodic oxide film.

For example, as shown in FIG. 2, an aspect may be adopted in which an aluminum support 12*b* includes an aluminum plate 18 and an anodic oxide film 20*b* having micropores 22*b* each composed of a large diameter portion 24 and a small diameter portion 26.

For example, the micropores 22*b* in the anodic oxide film 20*b* are each composed of the large diameter portion 24 that extends to a position at a depth of 10 nm to 1,000 nm (depth D: see FIG. 2) from the surface of the anodic oxide film and the small diameter portion 26 that is in communication with the bottom portion of the large diameter portion 24 and further extends from the communicate position to a position at a depth of 20 nm to 2,000 nm. Specifically, for example, it is possible to use the aspect described in paragraphs "0107" to "0114" of JP2019-162855A.

—Manufacturing Method of Support—

As a manufacturing method of the support used in the present disclosure, for example, a manufacturing method is preferable in which the following steps are sequentially performed.

Roughening treatment step: step of performing roughening treatment on aluminum plate Anodization treatment step: step of subjecting aluminum plate having undergone roughening treatment to anodic oxidation Pore widening treatment step: step of bringing aluminum plate having anodic oxide film obtained by anodization treatment step into contact with aqueous acid solution or aqueous alkali solution such that diameter of micropores in anodic oxide film increases Hereinafter, the procedure of each step will be specifically described.

<<Roughening Treatment Step>>

The roughening treatment step is a step of performing a roughening treatment including an electrochemical roughening treatment on the surface of the aluminum plate. This step is preferably performed before the anodization treatment step which will be described later. However, in a case where the surface of the aluminum plate already has a preferable shape, the roughening treatment step may not be performed. This step can be carried out by the method described in paragraphs "0086" to "0101" of JP2019-162855A.

<<Anodization Treatment Step>>

The procedure of the anodization treatment step is not particularly limited as long as the aforementioned micropores can be obtained. Examples thereof include known methods.

In the anodization treatment step, an aqueous solution of sulfuric acid, phosphoric acid, oxalic acid, or the like can be used as an electrolytic cell. For example, the concentration of sulfuric acid is 100 g/L to 300 g/L.

The conditions of the anodization treatment are appropriately set depending on the electrolytic solution used. For example, the liquid temperature is 5 °C to 70 °C (preferably 10 °C to 60 °C), the current density is 0.5 A/$dm^2$ to 60 A/$dm^2$ (preferably 1 A/$dm^2$ to 60 A/$dm^2$), the voltage is 1 V to 100 V (preferably 5 V to 50 V), the electrolysis time is 1 second to 100 seconds (preferably 5 seconds to 60 seconds), and the film amount is 0.1 g/$m^2$ to 5 g/$m^2$ (preferably 0.2 g/$m^2$ to 3 g/$m^2$).

<<Pore Widening Treatment>>

The pore widening treatment is a treatment of enlarging the diameter of micropores (pore diameter) present in the anodic oxide film formed by the aforementioned anodization treatment step (pore diameter enlarging treatment).

The pore widening treatment can be carried out by bringing the aluminum plate obtained by the anodization treatment step into contact with an aqueous acid solution or an aqueous alkali solution. The contact method is not particularly limited, and examples thereof include a dipping method and a spraying method.

As necessary, the support may have a backcoat layer on the side opposite to the image-recording layer, the backcoat layer containing the organic polymer compound described in JP1993-045885A (JP-H5-45885A) or the alkoxy compound of silicon described in JP1994-035174A (JP-H6-35174A).

<Undercoat Layer>

The planographic printing plate precursor according to the present disclosure preferably has an undercoat layer (also called interlayer in some cases) between the image-recording layer and the support. The undercoat layer enhances the adhesion between the support and the image-recording layer in an exposed portion, and enables the image-recording layer to be easily peeled from the support in a non-exposed portion. Therefore, the undercoat layer contributes to the improvement of developability without deteriorating printing durability. Furthermore, in the case of exposure to infrared laser, the undercoat layer functions as a heat insulating layer and thus brings about an effect of preventing sensitivity reduction resulting from the diffusion of heat generated by exposure to the support.

Examples of compounds that are used in the undercoat layer include polymers having adsorbent groups that can be adsorbed onto the surface of the support and hydrophilic groups. In order to improve adhesiveness to the image-recording layer, polymers having adsorbent groups and hydrophilic groups plus crosslinking groups are preferable. The compounds that are used in the undercoat layer may be low-molecular-weight compounds or polymers. As necessary, as the compounds that are used in the undercoat layer, two or more compounds may be used by being mixed together.

In a case where the compound used in the undercoat layer is a polymer, a copolymer of a monomer having an adsorbent group, a monomer having a hydrophilic group, and a monomer having a crosslinking group is preferable.

As the adsorbent group that can be adsorbed onto the surface of the support, a phenolic hydroxyl group, a carboxy group, $—PO_3H_2$, $—OPO_3H_2$, $—CONHSO_2—$, $—SO_2NHSO_2—$, and $—COCH_2COCH_3$ are preferable. As the hydrophilic groups, a sulfo group or salts thereof and salts of a carboxy group are preferable. As the crosslinking groups, an acryloyl group, a methacryloyl group, an acrylamide group, a methacrylamide group, an allyl group, and the like are preferable.

The polymer may have a crosslinking group introduced by the formation of a salt of a polar substituent of the polymer and a compound that has a substituent having charge opposite to that of the polar substituent and an ethylenically unsaturated bond, or may be further copolymerized with monomers other than the monomers described above and preferably with hydrophilic monomers.

Specifically, for example, silane coupling agents having addition polymerizable ethylenic double bond reactive groups described in JP1998-282679A (JP-H10-282679A) and phosphorus compounds having ethylenic double bond reactive groups described in JP1990-304441A (JP-H02-304441A) are suitable. The low-molecular-weight compounds or polymer compounds having crosslinking groups (preferably ethylenically unsaturated bonding groups), functional groups that interact with the surface of the support, and hydrophilic groups described in JP2005-238816A, JP2005-125749A, JP2006-239867A, and JP2006-215263A are also preferably used.

For example, the high-molecular-weight polymers having adsorbent groups that can be adsorbed onto the surface of the support, hydrophilic groups, and crosslinking groups described in JP2005-125749A and JP2006-188038A are more preferable.

The content of ethylenically unsaturated bonding group in the polymer used in the undercoat layer is preferably 0.1 mmol to 10.0 mmol per gram of the polymer, and more preferably 0.2 mmol to 5.5 mmol per gram of the polymer.

The weight-average molecular weight (Mw) of the polymer used in the undercoat layer is preferably 5,000 or more, and more preferably 10,000 to 300,000.

—Hydrophilic Compound—

From the viewpoint of developability, it is preferable that the undercoat layer contain a hydrophilic compound.

The hydrophilic compound is not particularly limited, and known hydrophilic compounds used for the undercoat layer can be used.

Preferred examples of the hydrophilic compound include phosphonic acids having an amino group such as carboxymethyl cellulose and dextrin, an organic phosphonic acid, an organic phosphoric acid, an organic phosphinic acid, amino acids, a hydrochloride of an amine having a hydroxy group, and the like.

In addition, examples of preferable hydrophilic compounds include a compound having an amino group or a functional group capable of inhibiting polymerization and a group that interacts with the surface of the support (for example, 1,4-diazabicyclo[2.2.2]octane (DABCO), 2,3,5,6-tetrahydroxy-p-quinone, chloranil, sulfophthalic acid, ethylenediaminetetraacetic acid (EDTA) or a salt thereof, hydroxyethyl ethylenediaminetriacetic acid or a salt thereof, dihydroxyethyl ethylenediaminediacetic acid or a salt thereof, hydroxyethyl iminodiacetic acid or a salt thereof, and the like).

From the viewpoint of scratch and contamination suppressiveness, it is preferable that the hydrophilic compound include hydroxycarboxylic acid or a salt thereof.

Furthermore, from the viewpoint of scratch and contamination suppressiveness, it is preferable that the hydrophilic compound, which is preferably hydroxycarboxylic acid or a salt thereof, be contained in a layer on the aluminum support. The layer on the aluminum support is preferably a layer on the side where the image-recording layer is formed or a layer in contact with the aluminum support.

Preferred examples of the layer on the aluminum support include a layer in contact with the aluminum support, such as the undercoat layer or the image-recording layer. Furthermore, a layer other than the layer in contact with the aluminum support, for example, the overcoat layer or the image-recording layer may contain a hydrophilic compound and preferably contains hydroxycarboxylic acid or a salt thereof.

In the planographic printing plate precursor according to the present disclosure, from the viewpoint of scratch and contamination suppressiveness, it is preferable that the image-recording layer contain hydroxycarboxylic acid or a salt thereof.

Moreover, regarding the planographic printing plate precursor according to the present disclosure, for example, an aspect is also preferable in which the surface of the aluminum support on the image-recording layer side is treated with a composition (for example, an aqueous solution or the like) containing at least hydroxycarboxylic acid or a salt thereof. In a case where the above aspect is adopted, at least some of the hydroxycarboxylic acid or a salt thereof used for treatment can be detected in a state of being contained in the layer on the image-recording layer side (for example, the image-recording layer or the undercoat layer) that is in contact with the aluminum support.

In a case where the layer on the side of the image-recording layer that is in contact with the aluminum support, such as the undercoat layer, contains hydroxycarboxylic acid or a salt thereof, the surface of the aluminum support on the image-recording layer side can be hydrophilized, and it is easy for the surface of the aluminum support on the image-recording layer side to have a water contact angle of 110° or less measured by an airborne water droplet method, which result in excellent scratch and contamination suppressiveness.

"Hydroxycarboxylic acid" is the generic term for organic compounds having one or more carboxy groups and one or more hydroxy groups in one molecule. These compounds are also called hydroxy acid, oxy acid, oxycarboxylic acid, or alcoholic acid (see Iwanami Dictionary of Physics and Chemistry, 5th Edition, published by Iwanami Shoten, Publishers. (1998)).

The hydroxycarboxylic acid or a salt thereof is preferably represented by Formula (HC).

$$R^{HC}(OH)_{mhc}(COOM^{HC})_{nhc} \quad \text{Formula (HC)}$$

In Formula (HC), $R^{HC}$ represents an (mhc+nhc)-valent organic group, $M^{HC}$ each independently represent a hydrogen atom, an alkali metal, or an onium, and mhc and nhc each independently represent an integer of 1 or more. In a case where n is 2 or more, $M^{HC}$ may be the same as or different from each other.

Examples of the (mhc+nhc)-valent organic group represented by $R^{HC}$ in Formula (HC) include an (mhc+nhc)-valent hydrocarbon group and the like. The hydrocarbon group may have a substituent and/or a linking group.

Examples of the hydrocarbon group include an (mhc+nhc)-valent group derived from aliphatic hydrocarbon, such as an alkylene group, an alkanetriyl group, an alkanetetrayl group, an alkanepentayl group, an alkenylene group, an alkenetriyl group, an alkenetetrayl group, and alkenepentayl group, an alkynylene group, an alkynetriyl group, alkynetetrayl group, or an alkynepentayl group, an (mhc+nhc)-valent group derived from aromatic hydrocarbon, such as an arylene group, an arenetriyl group, an arenetetrayl group, or an arenepentayl group, and the like. Examples of the substituent include an alkyl group, an alkenyl group, an alkynyl group, an aralkyl group, an aryl group, and the like. Specific examples of the substituent include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, eicosyl group, isopropyl group, isobutyl group, s-butyl group, t-butyl group, isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a methoxymethyl group, a methoxyethoxyethyl group, an allyloxymethyl group, a phenoxymethyl group, an acetyloxymethyl group, a benzoyloxymethyl group, a benzyl group, a phenethyl group, an a-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, a 3-butynyl group, a phenyl group, a biphenyl group, a naphthyl group, a tolyl group, a xylyl group, a mesityl group, a cumenyl group, a methoxyphenyl group, an ethoxyphenyl group, a phenoxyphenyl group, an acetoxyphenyl group, a benzoyloxyphenyl group, a methoxycarbonylphenyl group, an ethoxycarbonylphenyl group, a phenoxycarbonylphenyl group, and the like. Furthermore, the linking group is composed of at least one atom selected from the group consisting of a hydrogen atom, a carbon atom, an oxygen atom, a nitrogen atom, a sulfur atom, and a halogen atom, and the number of atoms is preferably 1 to 50. Specific examples thereof include an alkylene group, a substituted alkylene group, an arylene group, a substituted arylene group, and the like. The linking group may have a structure in which a plurality of these divalent groups is linked through any of an amide bond, an ether bond, a urethane bond, a urea bond, and an ester bond.

Examples of the alkali metal represented by $M^{HC}$ include lithium, sodium, potassium, and the like. Among these, sodium is particularly preferable. Examples of the onium include ammonium, phosphonium, sulfonium, and the like. Among these, ammonium is particularly preferable.

From the viewpoint of scratch and contamination suppressiveness, $M^{HC}$ is preferably an alkali metal or an onium, and more preferably an alkali metal.

The sum of mhc and nhc is preferably 3 or more, more preferably 3 to 8, and even more preferably 4 to 6.

The molecular weight of the hydroxycarboxylic acid or a salt thereof is preferably 600 or less, more preferably 500 or less, and particularly preferably 300 or less. The molecular weight is preferably 76 or more.

Specifically, examples of the hydroxycarboxylic acid constituting the hydroxycarboxylic acid or a salt of the hydroxycarboxylic acid include gluconic acid, glycolic acid, lactic acid, tartronic acid, hydroxybutyrate (such as 2-hydroxybutyrate, 3-hydroxybutyrate, or γ-hydroxybutyrate), malic acid, tartaric acid, citramalic acid, citric acid, isocitric acid, leucine acid, mevalonic acid, pantoic acid, ricinoleic acid, ricineraidic acid, cerebronic acid, quinic acid, shikimic acid, a monohydroxybenzoic acid derivative (such as salicylic acid, creosotic acid (homosalicylic acid, hydroxy(methyl) benzoate), vanillic acid, or syringic acid), a dihydroxybenzoic acid derivative (such as pyrocatechuic acid, resorcylic acid, protocatechuic acid, gentisic acid, or orsellinic acid), a trihydroxybenzoic acid derivative (such as gallic acid), a phenyl acetate derivative (such as mandelic acid, benzilic acid, or atrolactic acid), a hydrocinnamic acid derivative (such as melilotic acid, phloretic acid, coumaric acid, umbellic acid, caffeic acid, ferulic acid, sinapic acid, cerebronic acid, or carminic acid), and the like.

Among these, as the aforementioned hydroxycarboxylic acid or a hydroxycarboxylic acid constituting a salt of the hydroxycarboxylic acid, from the viewpoint of scratch and contamination suppressiveness, a compound having two or more hydroxy groups is preferable, a compound having 3 or more hydroxy groups is more preferable, a compound having 5 or more hydroxy groups is even more preferable, and a compound having 5 to 8 hydroxy groups is particularly preferable.

Furthermore, as a hydroxycarboxylic acid having one carboxy group and two or more hydroxy groups, gluconic acid or shikimic acid is preferable.

As hydroxycarboxylic acid having two or more carboxy groups and one hydroxy group, citric acid or malic acid is preferable.

As hydroxycarboxylic acid having two or more carboxy groups and two or more hydroxy groups, tartaric acid is preferable.

Among these, gluconic acid is particularly preferable as the aforementioned hydroxycarboxylic acid.

One hydrophilic compound may be used alone, or two or more hydrophilic compounds may be used in combination.

In a case where the undercoat layer contains a hydrophilic compound, which is preferably hydroxycarboxylic acid or a salt thereof, the content of the hydrophilic compound, which is preferably hydroxycarboxylic acid or a salt thereof, with respect to the total mass of the undercoat layer is preferably 0.01% by mass to 50% by mass, more preferably 0.1% by mass to 40% by mass, and particularly preferably 1.0% by mass to 30% by mass.

In order to prevent contamination over time, the undercoat layer may contain a chelating agent, a secondary or tertiary amine, a polymerization inhibitor, and the like, in addition to the following compounds for an undercoat layer.

The undercoat layer is formed by known coating methods.

The coating amount (solid content) of the undercoat layer is preferably 0.1 mg/m$^2$ to 300 mg/m$^2$, and more preferably 5 mg/m$^2$ to 200 mg/m$^2$.

The planographic printing plate precursor according to the present disclosure may have other layers in addition to those described above.

Known layers can be adopted as those other layers without particular limitations. For example, as necessary, a backcoat layer may be provided on a surface of the support that is opposite to the image-recording layer side.

(Method of Preparing Planographic Printing Plate and Planographic Printing Method)

The method of preparing a planographic printing plate according to the present disclosure preferably includes a step of exposing the planographic printing plate precursor according to the present disclosure in the shape of an image (exposure step) and a step of removing the image-recording layer having undergone exposure in a non-image area by supplying at least one material selected from the group consisting of a printing ink and dampening water on a printer (on-press development step).

The planographic printing method according to the present disclosure preferably includes a step of exposing the planographic printing plate precursor according to the present disclosure in the shape of an image (exposure step), a step of removing the image-recording layer in a non-image area by supplying at least one material selected from the group consisting of a printing ink and dampening water on a printer such that a planographic printing plate is prepared (on-press development step), and a step of performing printing by using the obtained planographic printing plate (hereinafter, also called "printing step").

<Exposure Step>

The method of preparing a planographic printing plate according to the present disclosure preferably includes an exposure step of exposing the planographic printing plate precursor according to the present disclosure in the shape of an image such that an exposed portion and a non-exposed portion are formed. The planographic printing plate precursor according to the present disclosure is preferably exposed to a laser through a transparent original picture having a linear image, a halftone dot image, or the like or exposed in the shape of an image by laser light scanning according to digital data or the like.

The wavelength of a light source to be used is preferably 750 nm to 1,400 nm. As the light source having a wavelength of 750 nm to 1,400 nm, a solid-state laser or a semiconductor laser that radiates infrared is suitable. In a case where an infrared laser is used, the output is preferably 100 mW or higher, the exposure time per pixel is preferably 20 microseconds or less, and the amount of irradiation energy is preferably 10 mJ/cm$^2$ to 300 mJ/cm$^2$. In addition, in order to shorten the exposure time, a multibeam laser device is preferably used. The exposure mechanism may be any one of an in-plane drum method, an external surface drum method, a flat head method, or the like.

The image exposure can be carried out by a common method using a platesetter or the like. In the case of on-press development, image exposure may be carried out on a printer after the planographic printing plate precursor is mounted on the printer.

<On-Press Development Step>

The method of preparing a planographic printing plate according to the present disclosure preferably includes an on-press development step of removing the image-recording layer in a non-image area by supplying at least one selected from the group consisting of printing ink and dampening water on a printer.

Hereinafter, the on-press development method will be described.

[On-Press Development Method]

In the on-press development method, the planographic printing plate precursor having undergone image exposure is preferably supplied with an oil-based ink and an aqueous component on a printer, such that the image-recording layer in a non-image area is removed and a planographic printing plate is prepared.

That is, in a case where the planographic printing plate precursor is subjected to image exposure and then directly mounted on a printer without being subjected to any development treatment, or in a case where the planographic printing plate precursor is mounted on a printer, then subjected to image exposure on the printer, and then supplied with an oil-based ink and an aqueous component for printing, at the initial stage in the middle of printing, in a non-image area, a non-cured image-recording layer is removed by either or both of the supplied oil-based ink and the aqueous component by means of dissolution or dispersion, and the hydrophilic surface is exposed in the non-image area. On the other hand, in an exposed portion, the image-recording layer cured by exposure forms an oil-based ink-receiving portion having a lipophilic surface. What is supplied first to the surface of the plate may be any of the oil-based ink or the aqueous component. However, in view of preventing the plate from being contaminated by the components of the image-recording layer from which aqueous components are removed, it is preferable that the oil-based ink be supplied first. In the manner described above, the planographic printing plate precursor is subjected to on-press development on a printer and used as it is for printing a number of sheets. As the oil-based ink and the aqueous component, ordinary printing ink and ordinary dampening water for planographic printing are suitably used.

As the laser used for performing image exposure on the planographic printing plate precursor according to the present disclosure, a light source having a wavelength of 750 nm to 1,400 nm is preferably used. As the light source having a wavelength of 750 nm to 1,400 nm, the light sources described above are preferably used.

<Printing Step>

The planographic printing method according to the present disclosure includes a printing step of printing a recording medium by supplying a printing ink to a planographic printing plate.

The printing ink is not particularly limited, and various known inks can be used as desired. In addition, preferred examples of the printing ink include oil-based ink or ultraviolet-curable ink (UV ink).

In the printing step, as necessary, dampening water may be supplied.

Furthermore, the printing step may be successively carried out after the on-press development step or the development step using a developer, without stopping the printer.

The recording medium is not particularly limited, and known recording media can be used as desired.

In the method of preparing a planographic printing plate from the planographic printing plate precursor according to the present disclosure and in the planographic printing method according to the present disclosure, as necessary, the entire surface of the planographic printing plate precursor may be heated as necessary before exposure, in the middle of exposure, or during a period of time from exposure to development. In a case where the planographic printing plate precursor is heated as above, an image-forming reaction in the image-recording layer is accelerated, which can result in advantages such as improvement of sensitivity and printing durability, stabilization of sensitivity, and the like. Heating before development is preferably carried out under a mild condition of 150 °C or lower. In a case where this aspect is adopted, it is possible to prevent problems such as curing of a non-image area. For heating after development, it is preferable to use an extremely severe condition which is preferably in a range of 100 °C to 500 °C. In a case where this aspect is adopted, a sufficient image-strengthening action is obtained, and it is possible to inhibit problems such as the deterioration of the support or the thermal decomposition of the image area.

EXAMPLES

Hereinafter, the present disclosure will be specifically described based on examples, but the present disclosure is not limited thereto. In the present examples, unless otherwise specified, "%" and "part" mean "% by mass" and "part by mass" respectively. Unless otherwise described, the molecular weight of a polymer compound is a weight-average molecular weight (Mw), and the ratio of repeating constitutional units of a polymer compound is expressed as molar percentage. The weight-average molecular weight (Mw) is a polystyrene-equivalent molecular weight measured by gel permeation chromatography (GPC).

Examples 1 to 38 and Comparative Examples 1 to 6

<Preparation of Supports A and B>

<<Treatments A and B>>

(A-a) Alkaline Etching Treatment

An aqueous solution of caustic soda having a caustic soda concentration of 26% by mass and an aluminum ion concentration of 6.5% by mass was sprayed onto the aluminum plate at a temperature of 70 °C, thereby performing an etching treatment. Then, rinsing was performed by means of spraying. The amount of dissolved aluminum within the surface to be subjected to the electrochemical roughening treatment later was 5 g/m$^2$.

(A-b) Desmutting Treatment Using Aqueous Acidic Solution (First Desmutting Treatment)

Next, a desmutting treatment was performed using an aqueous acidic solution. In the desmutting treatment, a 150 g/L aqueous sulfuric acid solution was used as the aqueous acidic solution. The liquid temperature was 30 °C. The desmutting treatment was performed for 3 seconds by spraying the aqueous acidic solution onto the aluminum plate. Then, a rinsing treatment was performed.

(A-c) Electrochemical Roughening Treatment

Next, an electrochemical roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30 °C. The aluminum ion concentration was adjusted by adding aluminum chloride.

The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 A/dm$^2$ in terms of the peak current value of the alternating current waveform. In addition, the quantity of electricity was 450 C/dm$^2$ which was the total quantity of electricity used for the aluminum plate to have an anodic reaction, and the electrolysis treatment was performed 4 times by conducting electricity of 112.5 C/dm$^2$ for 4 seconds at each treatment session. A carbon electrode was used as the counter electrode of the aluminum plate. Then, a rinsing treatment was performed.

(A-d) Alkaline Etching Treatment

An aqueous solution of caustic soda having a caustic soda concentration of 5% by mass and an aluminum ion concentration of 0.5% by mass was sprayed onto the aluminum plate having undergone the electrochemical roughening treatment at a temperature of 45 °C, thereby performing an etching treatment. The amount of dissolved aluminum within the surface having undergone the electrochemical roughening treatment was 0.2 g/m$^2$. Then, a rinsing treatment was performed.

(A-e) Desmutting Treatment Using Aqueous Acidic Solution

Next, a desmutting treatment was performed using an aqueous acidic solution. Specifically, the desmutting treatment was performed for 3 seconds by spraying the aqueous acidic solution onto the aluminum plate. In the desmutting treatment, an aqueous solution having a sulfuric acid concentration of 170 g/L and an aluminum ion concentration of 5 g/L was used as aqueous acidic solution. The liquid temperature was 30 °C.

(A-f) First-Stage Anodization Treatment

Figure 3:
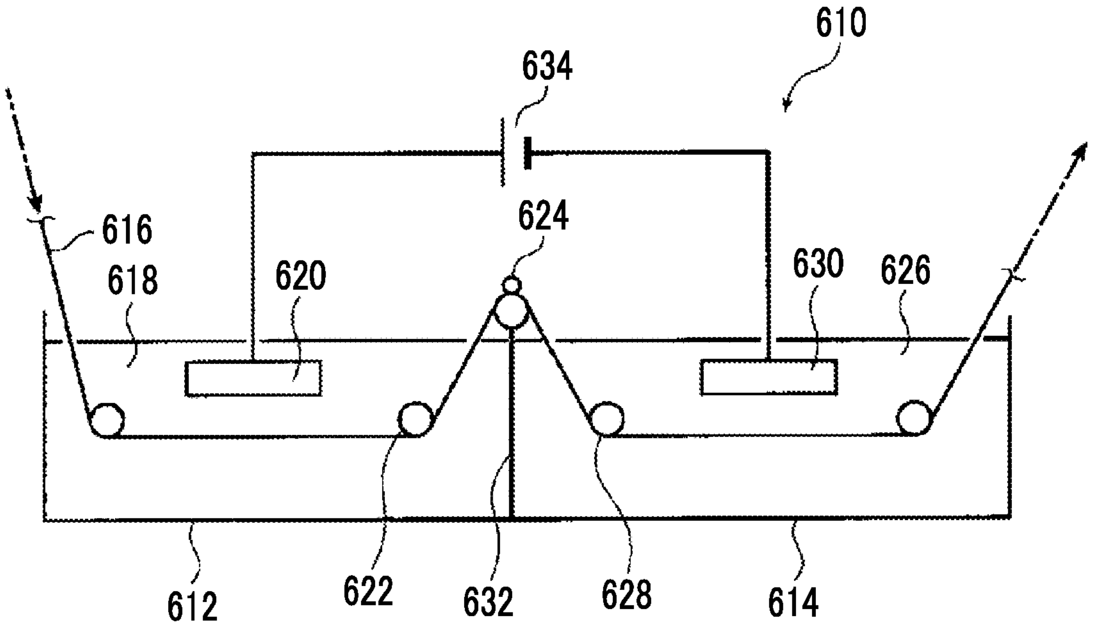
FIG. 3 is a schematic view of an anodization treatment device used for an anodization treatment in a manufacturing method of an aluminum support having an anodic oxide film.

By using the anodization device for direct current electrolysis having the structure shown in FIG. 3, a first-stage anodization treatment was performed. The anodization treatment was performed under the conditions described in the column of "First anodization treatment" shown in Table 1, thereby forming an anodic oxide film having a predetermined film amount.

(A-g) Pore Widening Treatment

The aluminum plate having undergone the above anodization treatment was immersed in an aqueous solution of caustic soda at a temperature of 40 °C. and having a caustic soda concentration of 5% by mass and an aluminum ion concentration of 0.5% by mass under the time conditions shown in Table 1, thereby performing a pore widening treatment. Then, rinsing was performed by means of spraying.

(A-h) Second-Stage Anodization Treatment

By using the anodization device for direct current electrolysis having the structure shown in FIG. 3, a second-stage anodization treatment was performed. The anodization treatment was performed under the conditions described in the column of "Second anodization treatment" shown in Table 1, thereby forming an anodic oxide film having a predetermined film amount. As shown in Table 1, in the surface treatment B, the second-stage anodization treatment was not performed.

TABLE 1

| Support | | Support A | Support B |
|---|---|---|---|
| Surface treatment | | A | B |
| First anodization treatment | Liquid type | Phosphoric acid | Sulfuric acid |
| | Liquid Component | $H_3PO_4$ | $H_2SO_4$/Al |
| | Component Concentration (g/L) | 15 | 170/5 |

TABLE 1-continued

| | Support | Support A | Support B |
|---|---|---|---|
| | Temperature (°C) | 35 | 50 |
| | Current Density ($A/dm^2$) | 4.5 | 30 |
| | Time (s) | 12 | 18 |
| | Film amount ($g/m^2$) | 1.0 | 2.4 |
| Pore widening treatment | Liquid Component | NaOH 5%/ Al 0.5% | NaOH 5%/ Al 0.5% |
| | Temperature (°C) | 40 | 40 |
| | Time (s) | 3 | 3 |
| Second anodization treatment | Liquid type | Sulfuric acid | — |
| | Liquid Component | $H_2SO_4$/Al | — |
| | Component Concentration (g/L) | 170/5 | — |
| | Temperature (°C) | 50 | — |
| | Current Density ($A/dm^2$) | 15 | — |
| | Time (s) | 10.5 | — |
| | Film amount ($g/m^2$) | 1.4 | — |

<Preparation of Supports C to E>

<<Surface Treatment C>>

(C-a) Mechanical Roughening Treatment (Brush Graining Method)

By using the device shown in FIG. 5, a pumice suspension (specific gravity: 1.1 $g/cm^3$) as an abrasive slurry was supplied to the surface of an aluminum plate, and in this state, a mechanical roughening treatment is performed using a rotating bundled brush. In FIG. 5, 1 represents an aluminum plate, 2 and 4 represent roller-shaped brushes (bundled brushes in the present example), 3 represents an abrasive slurry, and 5, 6, 7, and 8 represent support rollers.

In the mechanical roughening treatment, an abrasive having a median diameter (μm) of 30 μm and 4 brushes were used, and the rotation speed (rpm) of the brushes was set to 250 rpm. The bundled brush was made of 6·10 nylon and consisted of bristles having a diameter of 0.3 mm and a length of 50 mm. The brush was prepared by making holes in a φ 300 mm stainless steel cylinder and densely implanting bristles therein. The distance between two support rollers (φ 200 mm) under the bundled brush was 300 mm. The bundled brush was pressed until the load of the drive motor for rotating the brush was 10 kW higher than the load applied before the bundled brush was pressed on the aluminum plate. The rotation direction of the brush was the same as the moving direction of the aluminum plate.

(C-b) Alkaline Etching Treatment

From a spray tube, an aqueous solution of caustic soda having a caustic soda concentration of 26% by mass and an aluminum ion concentration of 6.5% by mass was sprayed from a spray tube onto the aluminum plate obtained above at a temperature of 70 °C, thereby performing an etching treatment. Then, rinsing was performed by means of spraying. The amount of dissolved aluminum was 10 $g/m^2$.

(C-c) Desmutting Treatment in Aqueous Acidic Solution

Next, a desmutting treatment was performed in an aqueous nitric acid solution. As the aqueous nitric acid solution used in the desmutting treatment, the waste liquid of nitric acid used in the next step, electrochemical roughening, was used. The liquid temperature was 35 °C. The desmutting treatment was performed for 3 seconds by spraying the desmutting liquid.

(C-d) Electrochemical Roughening Treatment

An electrochemical roughening treatment was continuously performed using nitric acid as an electrolyte at an alternating current voltage of 60 Hz. In this treatment, an electrolytic solution was used which was prepared by adding aluminum nitrate to 10.4 g/L aqueous nitric acid solution at a temperature of 35 °C. such that the aluminum ion concentration was adjusted to 4.5 g/L. By using an alternating current power source having the waveform shown in FIG. 3, alternating current having a trapezoidal rectangular waveform, and a carbon electrode as a counter electrode, an electrochemical roughening treatment was performed under the conditions of a time tp taken for the current value to reach the peak from zero of 0.8 msec and the duty ratio of 1:1. As an auxiliary anode, ferrite was used. The electrolytic cell shown in FIG. 4 was used. The current density was 30 $A/dm^2$ in terms of the peak value of current, and 5% of the current coming from the power source was allowed to flow into the auxiliary anode. The quantity of electricity ($C/dm^2$) was 185 $C/dm^2$, which is the total quantity of electricity used during the anodization of the aluminum plate. Then, rinsing was performed by means of spraying.

(C-e) Alkaline Etching Treatment

From a spray tube, an aqueous solution of caustic soda having a caustic soda concentration of 5% by mass and an aluminum ion concentration of 0.5% by mass was sprayed onto the aluminum plate obtained above at a temperature of 50 °C, thereby performing an etching treatment. Then, rinsing was performed by means of spraying. The amount of dissolved aluminum was 0.5 $g/m^2$.

(C-f) Desmutting Treatment in Aqueous Acidic Solution

Next, a desmutting treatment was performed in an aqueous sulfuric acid solution. In the desmutting treatment, an aqueous sulfuric acid solution having a sulfuric acid concentration of 170 g/L and an aluminum ion concentration of 5 g/L was used. The liquid temperature was 30 °C. The desmutting treatment was performed for 3 seconds by spraying the desmutting liquid.

(C-g) Electrochemical Roughening Treatment

An electrochemical roughening treatment was continuously performed using hydrochloric acid as an electrolyte at an alternating current voltage of 60 Hz. An electrolytic solution was used which was prepared by adding aluminum chloride to 6.2 g/L aqueous hydrochloric acid solution at a liquid temperature of 35 °C such that the aluminum ion concentration was adjusted to 4.5 g/L. By using an alternating current power source having the waveform shown in FIG. 3, alternating current having a trapezoidal rectangular waveform, and a carbon electrode as a counter electrode, an electrochemical roughening treatment was performed under the conditions of a time tp taken for the current value to reach the peak from zero of 0.8 msec and the duty ratio of 1:1. As an auxiliary anode, ferrite was used. The electrolytic cell shown in FIG. 4 was used.

The current density was 25 $A/dm^2$ in terms of the peak value of current, and the quantity of electricity ($C/dm^2$) during the hydrochloric acid electrolysis was 63 $C/dm^2$ which is the total quantity of electricity used during the anodization of the aluminum plate. Then, rinsing was performed by means of spraying.

(C-h) Alkaline Etching Treatment

From a spray tube, an aqueous solution of caustic soda having a caustic soda concentration of 5% by mass and an aluminum ion concentration of 0.5% by mass was sprayed onto the aluminum plate obtained above at a temperature of 50 °C, thereby performing an etching treatment. Then, rinsing was performed by means of spraying. The amount of dissolved aluminum was 0.1 $g/m^2$.

(C-i) Desmutting Treatment in Aqueous Acidic Solution

Next, a desmutting treatment was performed in an aqueous sulfuric acid solution. Specifically, by using a waste liquid generated in the anodization treatment step (170 g/L aqueous sulfuric acid solution containing dissolved aluminum ions at 5 g/L), the desmutting treatment was performed for 4 seconds at a liquid temperature of 35 °C. The desmutting treatment was performed for 3 seconds by spraying the desmutting liquid.

(C-j) First-Stage Anodization Treatment

By using the anodization device for direct current electrolysis having the structure shown in FIG. 3, a first-stage anodization treatment was performed. The anodization treatment was performed under the conditions shown in Table 1, thereby forming an anodic oxide film having a predetermined film thickness. In the anodization treatment device 610, an aluminum plate 616 is transported as indicated by the arrow in FIG. 3. In a power supply tank 612 containing an electrolytic solution 618, the aluminum plate 616 is positively (+) charged by a power supply electrode 620. Then, the aluminum plate 616 is transported upwards by a roller 622 in the power supply tank 612, makes a turn downwards by a nip roller 624, then transported toward an electrolytic treatment tank 614 containing an electrolytic solution 626, and makes a turn by a roller 628 to move in the horizontal direction. Subsequently, the aluminum plate 616 is negatively (−) charged by an electrolysis electrode 630. As a result, an anodic oxide film is formed on the surface of the aluminum plate 616. The aluminum plate 616 exits from the electrolytic treatment tank 614 and is then transported for the next step. In the anodization treatment device 610, the roller 622, the nip roller 624, and the roller 628 constitute a direction change unit. Furthermore, in the inter-tank portion between the power supply tank 612 and the electrolytic treatment tank 614, the aluminum plate 616 is transported in a ridge shape and an inverted U shape by the rollers 622, 624, and 628. The power supply electrode 620 and the electrolysis electrode 630 are connected to a direct current power source 634.

(C-k) Pore Widening Treatment

Under the conditions shown in Table 1, the aluminum plate having undergone the above anodization treatment was immersed in an aqueous solution of caustic soda at a temperature of 35 °C and having a caustic soda concentration of 5% by mass and an aluminum ion concentration of 0.5% by mass, thereby performing a pore widening treatment. Then, rinsing was performed by means of spraying.

(C-i) Second-Stage Anodization Treatment

By using the anodization device for direct current electrolysis having the structure shown in FIG. 3, a second-stage anodization treatment was performed. The anodization treatment was performed under the conditions shown in Table 2, thereby forming an anodic oxide film having a predetermined film thickness.

(C-m) Third-Stage Anodization Treatment

By using the anodization device for direct current electrolysis having the structure shown in FIG. 3, a third-stage anodization treatment was performed. The anodization treatment was performed under the conditions shown in Table 2, thereby forming an anodic oxide film having a predetermined film thickness.

<<Surface Treatment D:>>

[Support Having Large Diameter Portion and Small Diameter Portion]

(D-a) Alkaline Etching Treatment

An aqueous solution of caustic soda having a caustic soda (sodium hydroxide) concentration of 26% by mass and an aluminum ion concentration of 6.5% by mass was sprayed from a spray tube onto the aluminum plate at a temperature of 70 °C, thereby performing an etching treatment. Then, rinsing was performed by means of spraying. The amount of dissolved aluminum within the surface to be subjected to the electrochemical roughening treatment later was 1.0 g/m$^2$.

(D-b) Desmutting Treatment in Aqueous Acidic Solution (First Desmutting Treatment)

Next, a desmutting treatment was performed in an aqueous acidic solution. In the desmutting treatment, a 150 g/L aqueous sulfuric acid solution was used as the aqueous acidic solution. The liquid temperature was 30 °C. The desmutting treatment was performed for 3 seconds by spraying the desmutting liquid. Then, a rinsing treatment was performed.

(D-c) Electrochemical Roughening Treatment in Aqueous Hydrochloric Acid Solution Next, an electrolytic roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30 °C. The aluminum ion concentration was adjusted by adding aluminum chloride. The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 A/dm$^2$ in terms of the peak current value of the alternating current waveform. In addition, the quantity of electricity was 450 C/dm$^2$ which was the total quantity of electricity used for the aluminum plate to have an anodic reaction, and the electrolysis treatment was performed 4 times by conducting electricity of 125 C/dm$^2$ for 4 seconds at each treatment session. A carbon electrode was used as the counter electrode of the aluminum plate. Then, a rinsing treatment was performed.

(D-d) Alkaline Etching Treatment

An aqueous solution of caustic soda having a caustic soda concentration of 5% by mass and an aluminum ion concentration of 0.5% by mass was sprayed from a spray tube onto the aluminum plate having undergone the electrochemical roughening treatment at a temperature of 45 °C, thereby performing an etching treatment. The amount of dissolved aluminum within the surface having undergone the electrochemical roughening treatment was 0.2 g/m$^2$. Then, a rinsing treatment was performed.

(D-e) Desmutting Treatment in Aqueous Acidic Solution

Next, a desmutting treatment was performed in an aqueous acidic solution. In the desmutting treatment, as an aqueous acidic solution, a waste liquid was used which was generated in the anodization treatment step (170 g/L aqueous sulfuric acid solution containing dissolved aluminum ions at 5.0 g/L). The liquid temperature was 30 °C. The desmutting treatment was performed for 3 seconds by spraying the desmutting liquid.

(D-f) First-Stage Anodization Treatment

By using the anodization device for direct current electrolysis having the structure shown in FIG. 3, a first-stage anodization treatment was performed. The anodization treatment was performed under the conditions shown in Table 2, thereby forming an anodic oxide film having a predetermined film thickness.

(D-g) Pore Widening Treatment

Under the conditions shown in Table 1, the aluminum plate having undergone the above anodization treatment was immersed in an aqueous solution of caustic soda at a temperature of 35 °C and having a caustic soda concentration of 5% by mass and an aluminum ion concentration of 0.5% by mass, thereby performing a pore widening treatment. Then, rinsing was performed by means of spraying.

(D-h) Second-Stage Anodization Treatment

By using the anodization device for direct current electrolysis having the structure shown in FIG. 3, a second-stage anodization treatment was performed. The anodization treatment was performed under the conditions shown in Table 2, thereby forming an anodic oxide film having a predetermined film thickness.

By the surface treatment C or D, the supports C to E shown in Tables 2 and 3 were obtained.

Table 2 shows the average diameter (un) of the large diameter portion in the anodic oxide film within the surface of the anodic oxide film having micropores obtained after the second anodization treatment step, the average diameter (un) of the small diameter portion at a communicate position, the depth (nm) of the large diameter portion and the small diameter portion, the pit density (micropore density, unit; number of micropores/$\mu m^2$), and the thickness (nm) of the anodic oxide film from the bottom portion of the small diameter portion to the surface of the aluminum plate.

The average diameter of the micropores (average diameter of the large diameter portion and the small diameter portion) is a value obtained by observing the surface of the large diameter portion and the surface of the small diameter portion with FE-SEM at 150,000× magnification (N=4), and measuring the diameters of micropores (large diameter portion and small diameter portion) in a range of 400 nm×600 nm in the obtained 4 images, and calculating the average thereof. In a case where the large diameter portion was deep and it was difficult to measure the diameter of the small diameter portion, and in a case where an enlarged diameter portion in the small diameter portion was measured, the upper portion of the anodic oxide film was cut, and then various diameters were calculated.

The depth of the micropores (depth of the large diameter portion and the small diameter portion) is a value obtained by observing the cross section of the support (anodic oxide film) with FE-SEM (observation of the depth of the large diameter portion: 150,000× magnification, observation of depth of small diameter portion: 50,000× magnification), measuring the depths of 25 random micropores in the obtained image, and calculating the average thereof.

In Table 2, Film amount (AD) in the column of First anodization treatment and Film amount (AD) in the column of Second anodization treatment represent the amount of film obtained by each treatment. As electrolytic solutions, the aqueous solutions containing the components in Table 2 were used.

TABLE 2

| Support | | Support C | Support D | Support E |
|---|---|---|---|---|
| Surface treatment | | C | D | C |
| First anodization treatment | Liquid type | Sulfuric acid | Sulfuric acid | Sulfuric acid |
| | Liquid component | $H_2SO_4$/Al | $H_2SO_4$/Al | $H_2SO_4$/Al |
| | Component concentration | 170/5 | 170/5 | 170/5 |
| | Temperature | 40 | 40 | 40 |
| | Current density | 30 | 8 | 5 |
| | Time | 1.6 | 4 | 5 |
| | Film amount | 0.25 | 0.25 | 0.25 |
| Pore widening treatment | Liquid component | NaOH 5%/ Al 0.5% | NaOH 5%/ Al 0.5% | NaOH 5%/ Al 0.5% |
| | Temperature | 35 | 35 | 35 |
| | Time | 5 | 3 | 3 |
| Second anodization treatment | Liquid type | Sulfuric acid | Sulfuric acid | Sulfuric acid |
| | Liquid component | $H_2SO_4$/Al | $H_2SO_4$/Al | $H_2SO_4$/Al |
| | Component concentration | 170/5 | 170/5 | 170/5 |
| | Temperature | 50 | 50 | 50 |
| | Current density | 13 | 13 | 13 |
| | Time | 17 | 25 | 17 |
| | Film amount | 2.25 | 3.35 | 2.25 |

TABLE 3

| | Large diameter portion | | | | Small diameter portion | | | |
|---|---|---|---|---|---|---|---|---|
| Support | Average diameter (nm) | Shape | Micropore density (number/μm2) | Depth (nm) | Pore diameter at communicate position (nm) | Shape | Depth (nm) | Thickness of anodic oxide film (nm) |
| Support C | 35 | Straight tubular | 500 | 100 | 10 | Straight tubular | 900 | 1,000 |
| Support D | 26 | Straight tubular | 1,080 | 100 | 10 | Straight tubular | 1,400 | 1,500 |
| Support E | 26 | Straight tubular | 1,150 | 150 | 10 | Straight tubular | 850 | 1,000 |

<Method of Forming Undercoat Layers A to C>

The supports described in Tables 5 to 8 were coated with any of the coating liquids A to C for an undercoat layer described in Tables 5 to 8 having the following compositions such that the dry coating amount of 20 $mg/m^2$ was obtained, and the supports were dried in an oven at 100 °C for 30 seconds, thereby forming an undercoat layer.

—Composition of Coating Liquid A for Undercoat Layer—

Polymer (U-1) [the following structure]: 0.18 parts

Hydroxyethyl iminodiacetic acid: 0.10 parts

Water: 61.4 parts (U-1)

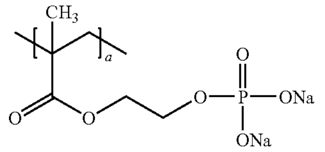

-continued

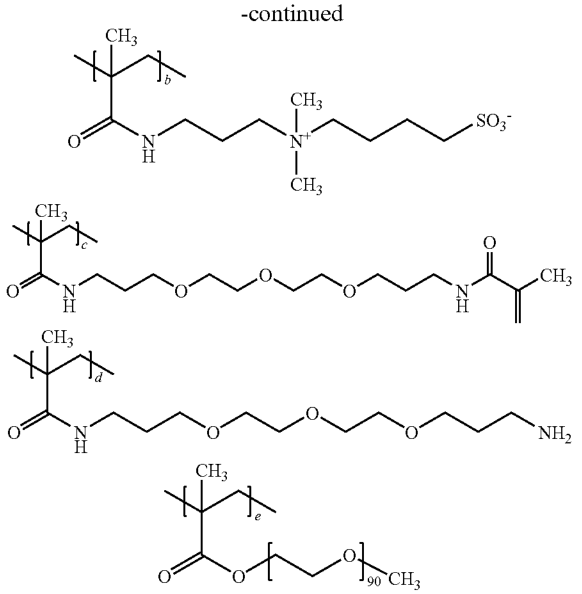

a/b/c/d/e = 14.2/71.8/8.9/0.1/5.0(% by mass)
a/b/c/d/e = 19.0/72.8/7.7/0.1/0.4 (mol %)
Weight-average molecular weight = 200,000

Sodium gluconate: 0.07 parts

Surfactant (EMALEX 710, manufactured by NIHON EMULSION Co., Ltd.): 0.0016 parts

Preservative (BIOHOPE L, manufactured by K•I Chemical Industry Co., LTD.): 0.0015 parts Water: 3.29 parts —Composition of Coating Liquid C for Undercoat Layer—

Polymer (U-1): 0.14 parts

Chelest 400: 0.035 parts

Chelest 3EAF: 0.035 parts

Surfactant (EMALEX 710, manufactured by NIHON EMULSION Co., Ltd.): 0.0016 parts

Preservative (BIOHOPE L, manufactured by K•I Chemical Industry Co., LTD.): 0.0015 parts Water: 3.29 parts —Synthesis of Polymer (U-1)—

<<Purification of Monomer M-1>>

LIGHT ESTER P-1M (2-methacryloyloxyethyl acid phosphate, manufactured by KYOEISHA CHEMICAL Co., LTD.) (420 parts), 1,050 parts of diethylene glycol dibutyl ether, and 1,050 parts of distilled water were added to a separating funnel, vigorously stirred, and then left to stand. The upper layer was discarded, 1,050 parts of diethylene glycol dibutyl ether was then added thereto, the solution was vigorously stirred, and then left to stand. The upper layer was discarded, thereby obtaining 1,300 parts of an aqueous solution of a monomer M-1 (10.5% by mass in terms of solid content).

<<Synthesis of Polymer (U-1)>>

Distilled water (53.73 parts) and 3.66 parts of the following monomer M-2 were added to a three-neck flask, and heated to 55 °C in a nitrogen atmosphere. Then, the following dripping liquid 1 was added dropwise thereto for 2 hours, the obtained solution was stirred for 30 minutes, and 0.386 parts of VA-046B (manufactured by FUJIFILM Wako Pure Chemical Corporation) was added thereto. The solution was heated to 80 °C and stirred for 1.5 hours. The reaction solution was returned to room temperature (25 °C), a 30% by mass aqueous sodium hydroxide solution was added thereto such that the pH was adjusted to 8.0, and then 0.005 parts of 4-hydroxy-2,2,6,6-tetramethylpiperidin-1-oxyl (4-OH-TEMPO) was added thereto. By the above operation, 180 parts of an aqueous solution of a polymer (U-1) was obtained. The polyethylene glycol-equivalent weight-average molecular weight (Mw) thereof that was measured by gel permeation chromatography (GPC) was 200,000.

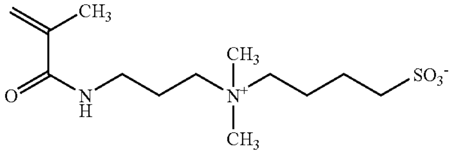

Monomer M-2

<<Composition of Dripping Liquid 1>>

Aqueous solution of the monomer M-1: 87.59 parts

The above monomer M-2: 14.63 parts

VA-046B (2,2'-azobis[2-(2-imidazolin-2-yl)propane]disulfate dihydrate, manufactured by FUJIFILM Wako Pure Chemical Corporation): 0.386 parts Distilled water: 20.95 parts <Formation of Image-Recording Layer>

By bar coating, the support or the undercoat layer was coated with a coating liquid for an image-recording layer having the composition described in Tables 5 to 8 (here, the coating liquid for an image-recording layer contained the components described in Tables 5 to 8, and the solid contents thereof were adjusted to 6% by mass by using a mixed solvent of 1-methoxy-2-propanol (MFG):methyl ethyl ketone (MEK):methanol=4:4:1 (mass ratio)). The support or the undercoat layer was dried in oven at 120 °C for 40 seconds, thereby forming an image-recording layer having a dry coating amount described in Tables 5 to 8.

Each component used in the image-recording layer will be shown below.

[Oil Agent]

O-1 to O-13: the following compounds (values of physical properties and the like are shown in the following Table 4).

O-1

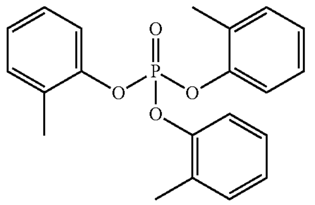

O-2

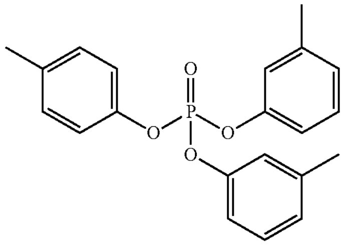

-continued

O-3

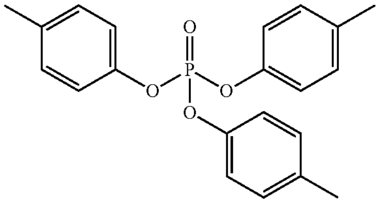

O-4

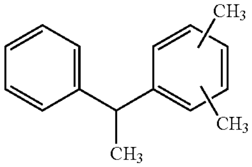

O-5

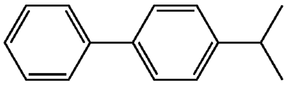

O-6

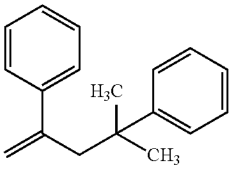

O-7

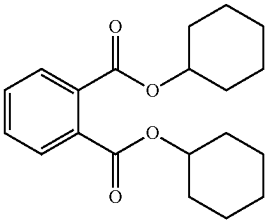

O-8

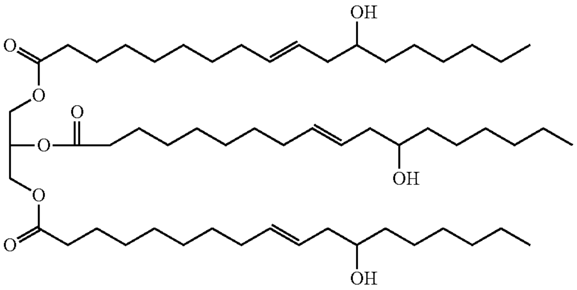

(representative structure)

-continued

O-9

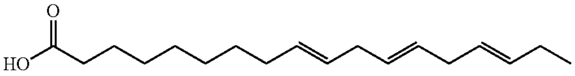

O-10

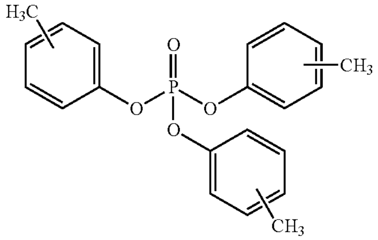

O-11

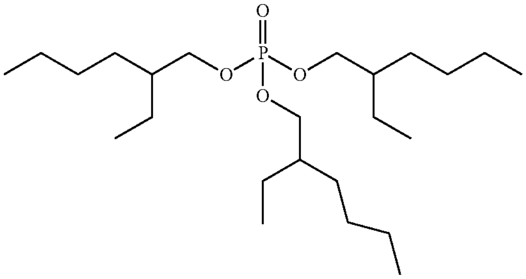

O-12

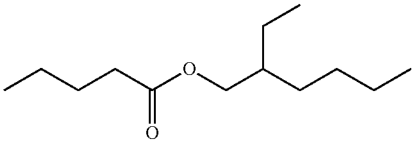

O-13

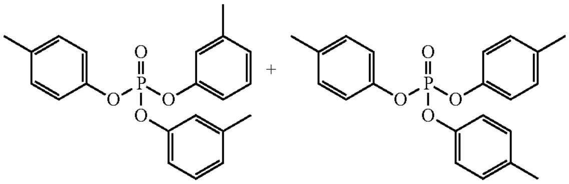

TABLE 4

| | Compound name | Trade name | Melting point (°C) | Boiling point (°C) | ClogP | Number of phosphorus atoms | Number of aromatic rings | Manufacturer |
|---|---|---|---|---|---|---|---|---|
| O-1 | o-tricrecyl phosphate (TCP) | — | Liquid at normal temperature | 410 | 5.95 | 1 | 3 | Tokyo Chemical Industry Co., Ltd. |
| O-2 | m-TCP | — | 20 | 455 | 5.95 | 1 | 3 | Tokyo Chemical Industry Co., Ltd. |
| O-3 | p-TCP | — | 77 | 430 | 5.95 | 1 | 3 | Tokyo Chemical Industry Co., Ltd. |

TABLE 4-continued

| | Compound name | Trade name | Melting point (°C) | Boiling point (°C) | ClogP | Number of phosphorus atoms | Number of aromatic rings | Manufacturer |
|---|---|---|---|---|---|---|---|---|
| O-4 | dimethyl(1-phenylethy)benzene mixture | NISSEKI HIZOL SAS-296 | Liquid at normal temperature | 355 | 5.56 | 0 | 2 | ENEOS Holdings, Inc. |
| O-5 | 4-isopropylbiphenyl | — | Liquid at normal temperature | 291 | 5.46 | 0 | 2 | Tokyo Chemical Industry Co., Ltd. |
| O-6 | 2,4-diphenyl-4-methyl-1-pentene | — | Liquid at normal temperature | 337 | 6.01 | 0 | 2 | Tokyo Chemical Industry Co., Ltd. |
| O-7 | dicyclohexy phthalate | — | 65 | 439 | 5.62 | 0 | 1 | Tokyo Chemical Industry Co., Ltd. |
| O-8 | castor oil | — | Liquid at normal temperature | 313 | 17.77 | 0 | 0 | FUJIFILM Wako Pure Chemical Corporation |
| O-9 | α-linolenic acid | — | Liquid at normal temperature | 386 | 6.82 | 0 | 0 | Tokyo Chemical Industry Co., Ltd. |
| O-10 | m/o/p-TCP | P0273 | −33 | 467 | 3.95 | 1 | 3 | Tokyo Chemical Industry Co., Ltd. |
| O-11 | tris(2-ethylhexyl)phosphate | — | Liquid at normal temperature | 412 | 9.42 | 1 | 0 | Tokyo Chemical Industry Co., Ltd. |
| O-12 | butyl 2-ethylhexanoate | — | Liquid at normal temperature | 230 | 3.34 | 0 | 0 | Tokyo Chemical Industry Co., Ltd. |
| O-13 | m/p-TCP | TCP | Liquid at normal temperature | 459 | 5.95 | 1 | 3 | DAIHACHI CHEMICAL INDUSTRY CO. LTD. |

[Infrared Absorber]

IR-1 to IR-10: Compounds having the following structures

IR-1

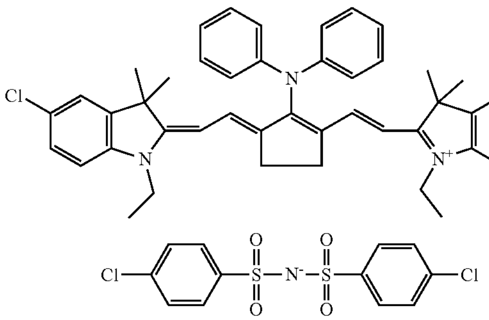

HOMO = -5.352 eV
LUMO = -3.751 eV

IR-2

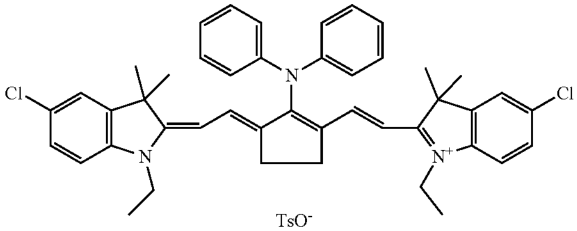

TsO-
HOMO = -5.352 eV
LUMO = -3.751 eV

-continued

IR-3

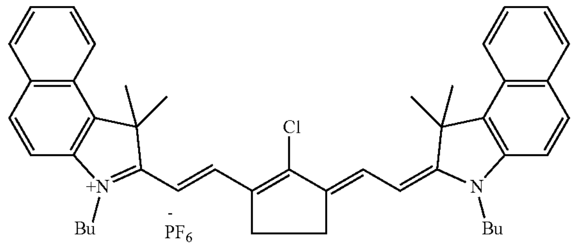

HOMO = -5.311 eV
LUMO = -3.777 eV

IR-4

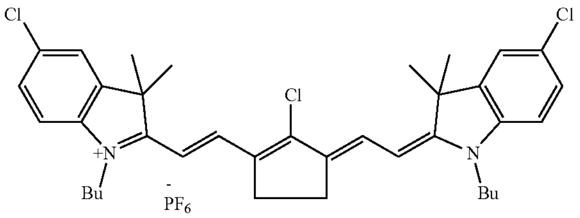

HOMO = -5.425 eV
LUMO = -3.848 eV

-continued

IR-5

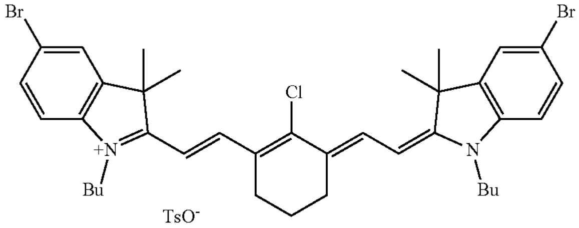

HOMO = -5.469 eV
LUMO = -3.851 eV

IR-6

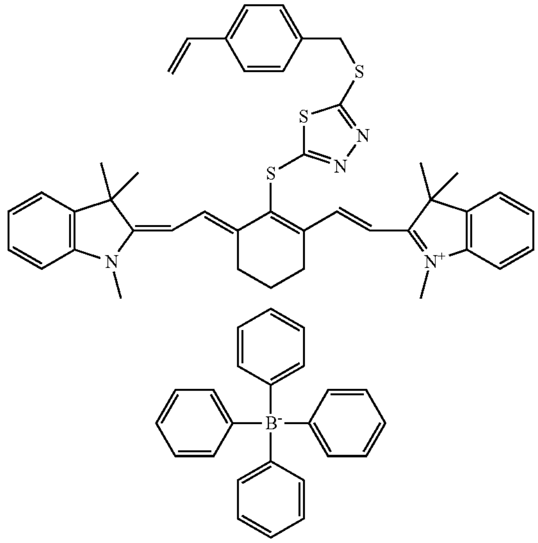

HOMO = -5.420 eV
LUMO = -3.816 eV

IR-7

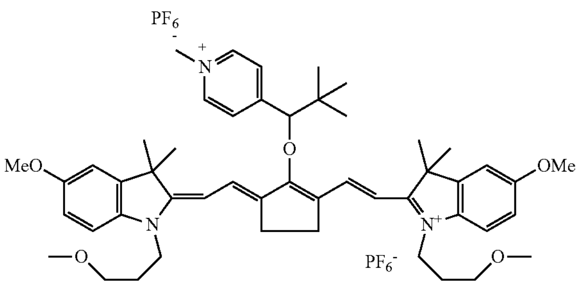

HOMO = -5.290 eV
LUMO = -3.701 eV

-continued

IR-8

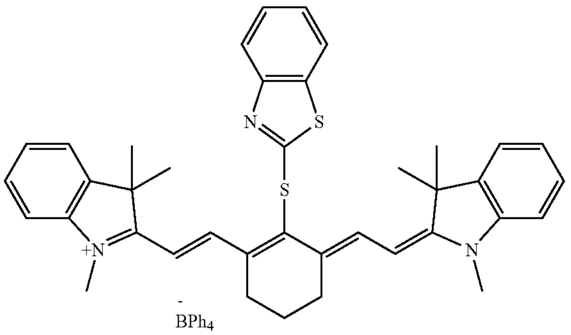

HOMO = -5.429 eV
LUMO = -3.839 eV

IR-9

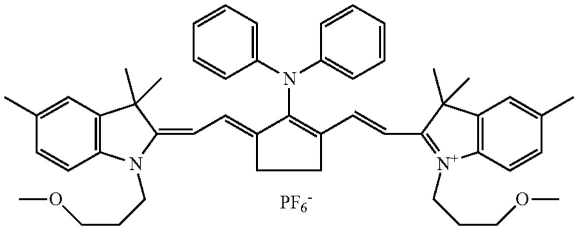

HOMO = -5.280 eV
LUMO = -3.700 eV

IR-10

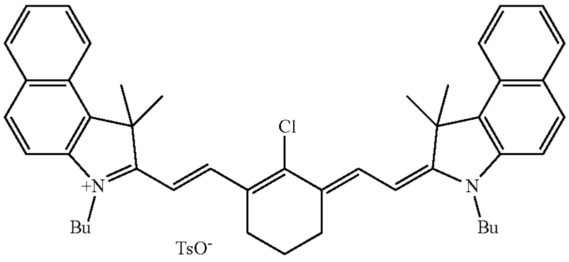

HOMO = -5.3148 eV
LUMO = -3.7907 eV

Bu represents an n-butyl group, Ph represents a phenyl group, and $TsO^-$ represents a tosylate anion.

[Electron-Accepting Polymerization Initiator]

Int-1 to Int-5: Compounds having the following structures, $TsO^-$ represents a tosylate anion, and Ph represents a phenyl group.

Int-1

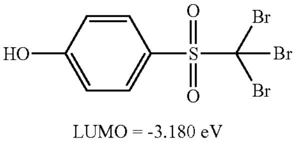

LUMO = -3.180 eV

-continued

Int-2

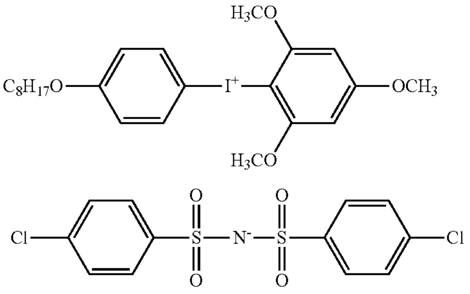

LUMO = -3.078 eV

Int-3

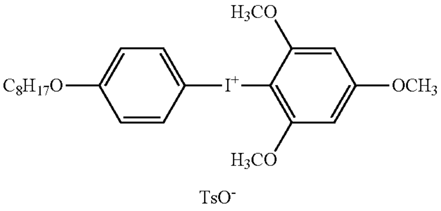

LUMO = -3.078 eV

Int-4

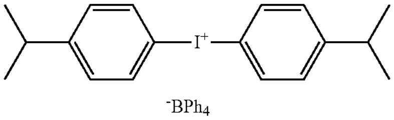

LUMO = -3.258 eV

Int-5

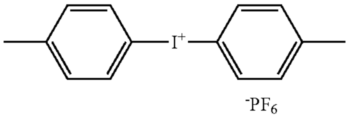

LUMO = -3.2544 eV

[Electron-Donating Polymerization Initiator]

B-1 to B-4: Compounds having the following structures

B - 1

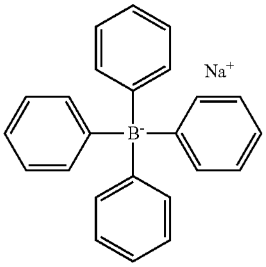

HOMO = -5.903 eV

-continued

B - 2

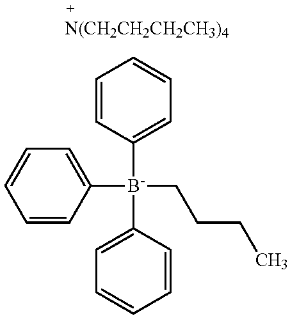

HOMO = -5.769 eV

B - 3

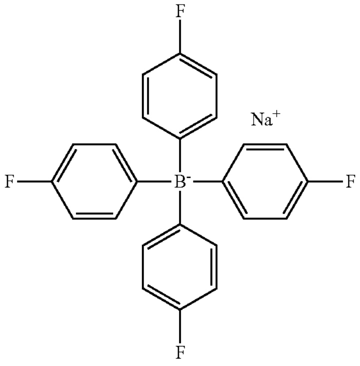

HOMO = -5.960 eV

B - 4

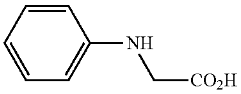

HOMO = -5.892 eV

[Polymerizable Compound]

M-1: The following compound

M-2: The following compound

M-3: Dipentaerythritol pentaacrylate, SR-399 manufactured by Sartomer Company Inc.

M-4: Urethane acrylate, U-15HA manufactured by SHIN-NAKAMURA CHEMICAL CO., LTD.

M-5: Monomer synthesized by the following synthesis method

M-1

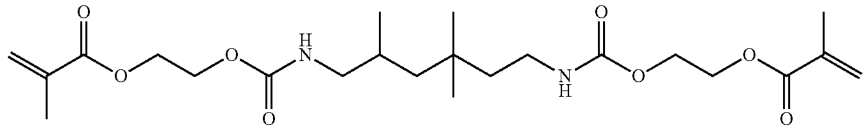

M-2

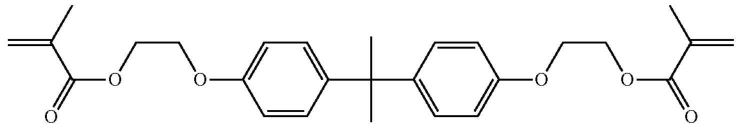

<Synthesis of M-5>

A mixed solution of TAKENATE D-160N (polyisocyanate trimethylolpropane adduct, manufactured by Mitsui Chemicals, Inc., 4.7 parts), ARONIX M-403 (manufactured by TOAGOSEI CO., LTD., amount yielding the ratio of NCO value of TAKENATE D-160N:hydroxyl number of ARONIX M-403=1:1), t-butylbenzoquinone (0.02 parts), and methyl ethyl ketone (11.5 parts) was heated at 65 °C. NEOSTANN U-600 (bismuth-based polycondensation catalyst, manufactured by NITTO KASEI CO., LTD., 0.11 parts) was added to the reaction solution, and the reaction solution was heated at 65 °C for 4 hours. The reaction solution was cooled to room temperature (25 °C), and methyl ethyl ketone was added thereto, thereby synthesizing a urethane acrylate solution having a solid content of 50% by mass. By using recycling GPC (instrument: LC908-C60, column: JAIGEL-1H-40 and 2H-40 (manufactured by Japan Analytical Industry Co., Ltd.)) and tetrahydrofuran (THF) as an eluent, molecular weight fractionation of the urethane acrylate (M-5) solution was performed. The weight-average molecular weight was 20,000.

[Binder Polymer]

P-1: Polyvinyl alcohol, S-LEC BX-5Z manufactured by SEKISUI CHEMICAL CO., LTD.

P-2: Polyvinyl alcohol, S-LEC BL10 manufactured by SEKISUI CHEMICAL CO., LTD.

P-3: Resin synthesized by the following synthesis method

<Synthesis of Binder Polymer P-3>

1-Methoxy-2-propanol (78.0 parts) was weighed, put into a three-neck flask, and heated to 70 °C under a nitrogen stream. A mixed solution consisting of BLEMMER PME-100 (methoxydiethylene glycol monomethacrylate, manufactured by NOF CORPORATION.): 52.1 parts, methyl methacrylate: 21.8 parts, methacrylic acid: 14.2 parts, hexakis(3-mercaptopropionic acid)dipentaerythritol: 2.15 parts, V-601 (dimethyl 2,2'-azobis(isobutyrate), manufactured by FUJIFILM Wako Pure Chemical Corporation): 0.38 parts, 1-methoxy-2-propanol: 54 parts was added dropwise to the reaction vessel for 2 hours and 30 minutes. After dropwise addition ended, the solution was heated to 80 °C, and the reaction was continued for 2 more hours. A mixed solution consisting of V-601: 0.04 parts and 1-methoxy-2-propanol: 4 parts was added to the aforementioned mixed solution, the obtained mixed solution was heated to 90 °C, and the reaction was continued for 2.5 hours. After the reaction ended, the reaction solution was cooled to room temperature.

1-Methoxy-2-propanol: 137.2 parts, 4-hydroxytetramethylpiperidine-N-oxide: 0.24 parts, glycidyl methacrylate: 26.0 parts, and tetraethylammonium bromide: 3.0 parts were added to the reaction solution, and the reaction solution was well stirred and heated at 90 °C.

After 18 hours, the reaction solution was cooled to room temperature (25 °C), and then 1-methoxy-2-propanol: 99.4 parts were added thereto for dilution.

The binder polymer P-3 obtained in this way had a concentration of solid contents of 23% by mass and a weight-average molecular weight of 35,000 measured by GPC and expressed in terms of polystyrene.

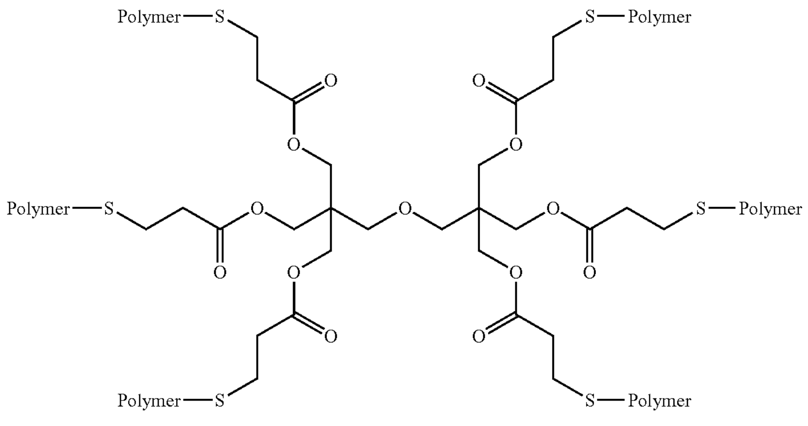

Polymer moiety

-continued
P-3
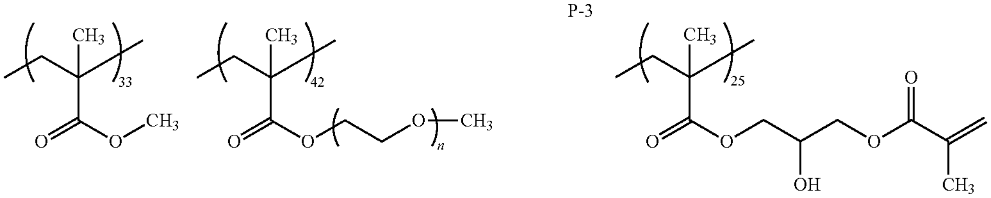
Binder polymer
n = 2
[Acid Chromogenic Agent]
S-1 to S-8: The following compounds
S-1
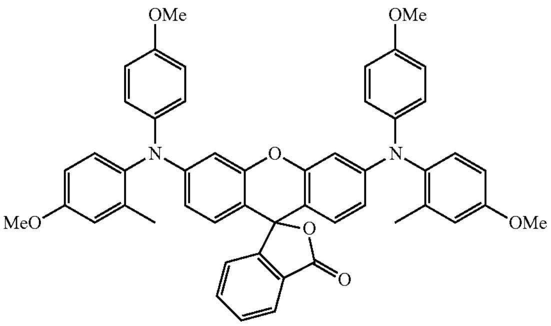
S-2
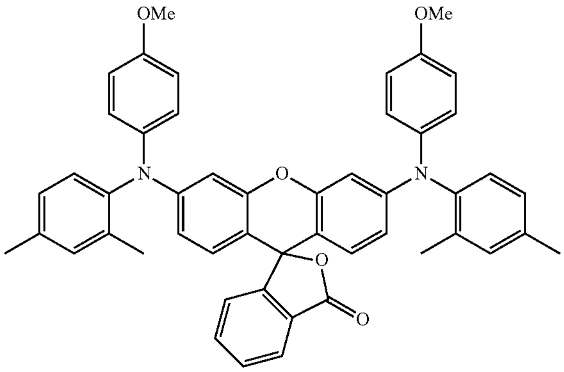
S-3
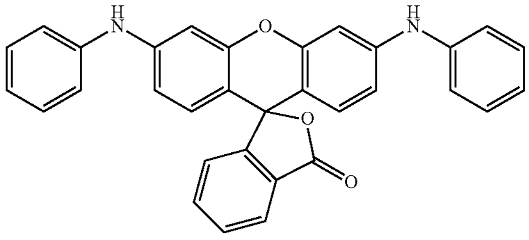
-continued
S-4
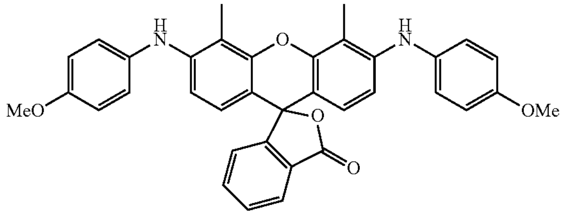
S-5
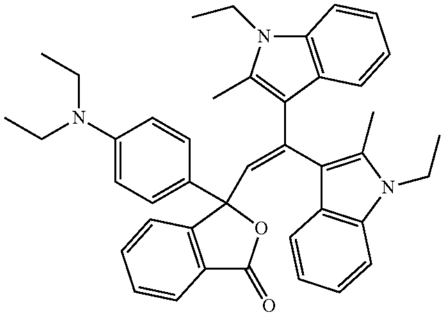
S-6
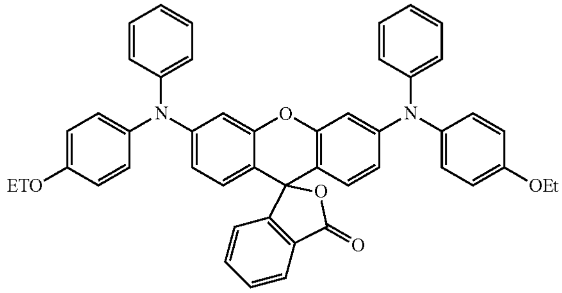
S-7
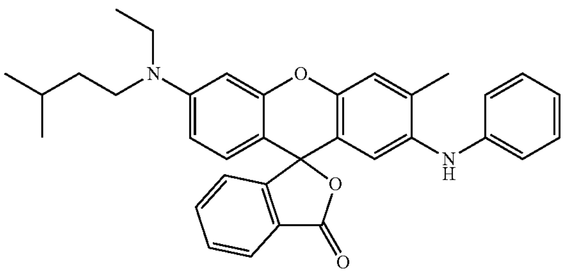

-continued

S-8

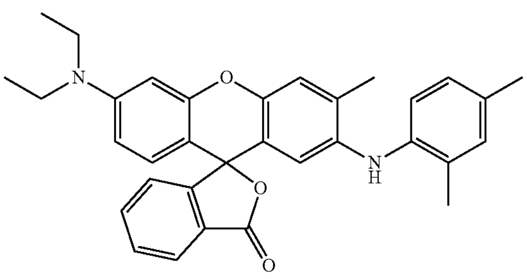

In addition, Me represents a methyl group, and Et represents an ethyl group.

[Coloring Compound]

Curcumin: the following compound

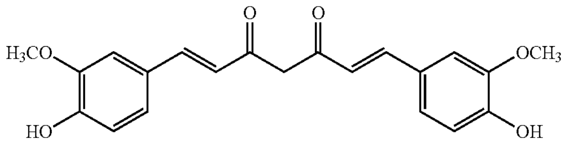 [SMILES: COc1cc(/C=C/C(=O)CC(=O)/C=C/c2ccc(O)c(OC)c2)ccc1O]

[Hydrophilic Compound]

T-1: Tris(2-hydroxyethyl) isocyanurate

T-2: Compound having the following structure

T-3: Hydroxypropyl cellulose, Klucel M, manufactured by Hercules, Inc.

T-2

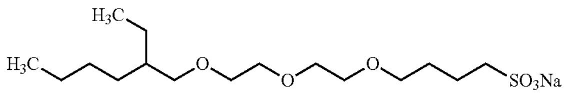

[Surfactant]

F-1: Anionic surfactant, RAPISOLA-80, manufactured by NOF CORPORATION

F-2: Fluorine-based surfactant, MEGAFACE F-781F (manufactured by DIC Corporation)

F-3: The following compound

F-3

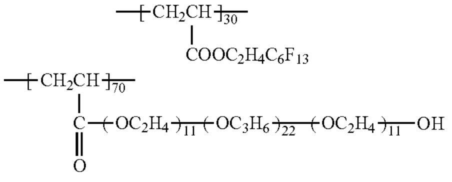

(Mw = 13,000)

[Polymer Particles]

<Preparation of Polymer Particles R-1>

Microgel (polymer particles R-1): 2.640 parts

Distilled water: 2.425 parts

The microgel was prepared by the following method.

—Preparation of Polyvalent Isocyanate Compound—

Bismuth tris(2-ethylhexanoate) (NEOSTAN U-600, manufactured by NITTO KASEI CO., LTD., 0.043 parts) was added to an ethyl acetate (25.31 g) suspension solution of 17.78 parts (80 molar equivalents) of isophorone diisocyanate and 7.35 parts (20 molar equivalents) of the following polyhydric phenol compound (1), and the obtained solution was stirred. The reaction temperature was set to 50 °C at a point in time when heat release subsided, and the solution was stirred for 3 hours, thereby obtaining an ethyl acetate solution of the polyvalent isocyanate compound (1) (50% by mass).

Polyhydric phenol compound (1)

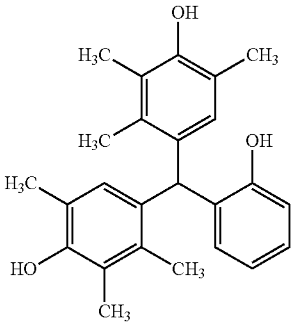

—Preparation of Microgel—

The following oil-phase components and water-phase components were mixed together and emulsified at 12,000 rpm for 10 minutes by using a homogenizer. The obtained emulsion was stirred at 45 °C for 4 hours, a 10% by mass aqueous solution of 5.20 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45 °C for 24 hours. Distilled water was added thereto such that the concentration of solid contents was adjusted to 20% by mass, thereby obtaining an aqueous dispersion of microgel. The average particle diameter thereof measured by a light scattering method was 0.20 μm.

—Oil-Phase Component—

(Component 1) ethyl acetate: 12.0 parts (Component 2) an adduct obtained by addition of trimethylolpropane (6 molar equivalents), xylene diisocyanate (18 molar equivalents), and polyoxyethylene having one methylated terminal (1 molar equivalent, the number of repeating oxyethylene units: 90) (50% by mass ethyl acetate solution, manufactured by Mitsui Chemicals, Inc.): 3.76 parts (Component 3) polyvalent isocyanate compound (1) (as 50% by mass ethyl acetate solution): 15.0 parts (Component 4) 65% by mass ethyl acetate solution of dipentaerythritol pentaacrylate (SR-399, manufactured by Sartomer Company Inc.): 11.54 parts (Component 5) 10% ethyl acetate solution of sulfonate type surfactant (PIONIN A-41-C, manufactured by TAKEMOTO OIL & FAT Co., Ltd.): 4.42 parts ~Water-Phase Component~

Distilled water: 46.87 parts

<Preparation of Polymer Particles R-2>

—Preparation of Oil-Phase Component—

A polyfunctional isocyanate compound (PM-200: manufactured by Wanhua Chemical Group Co., Ltd.: 6.66 g, a 50% by mass ethyl acetate solution of "TAKENATE (registered trademark) D-116N (adduct oftrimethylolpropane (TMP), m-xylylene diisocyanate (XDI), and polyethylene glycol monomethyl ether (EO90) (following structure)" manufactured by Mitsui Chemicals, Inc.: 5.46 g, a 65% by mass ethyl acetate solution of dipentaerythritol pentaacrylate (SR-399, manufactured by Sartomer Company Inc.): 11.24 g, ethyl acetate: 14.47 g, and PIONIN (registered trademark) A-41-C manufactured by TAKEMOTO OIL & FAT Co., Ltd.: 0.45 g were mixed together and stirred at room temperature (25 °C) for 15 minutes, thereby obtaining an oil-phase component.

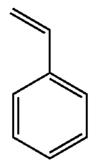

A-1

D-116N

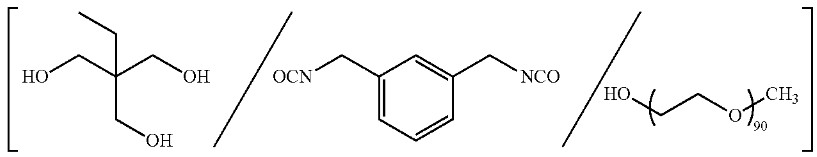

—Preparation of Water-Phase Component—

As a water-phase component, 47.2 g of distilled water was prepared.

—Microcapsule Forming Step—

The oil-phase component and the water-phase component were mixed together, and the obtained mixture was emulsified at 12,000 rpm for 16 minutes by using a homogenizer, thereby obtaining an emulsion.

Distilled water (16.8 g) was added to the obtained emulsion, and the obtained liquid was stirred at room temperature for 10 minutes.

After stirring, the liquid was heated at 45 °C, and stirred for 4 hours in a state of being kept at 45 °C such that ethyl acetate was distilled away from the liquid. Then, a 10% by mass aqueous solution of 5.12 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45 °C for 24 hours. Distilled water was added thereto such that the concentration of solid contents was adjusted to 20% by mass, thereby obtaining an aqueous dispersion of polymer particles R-2. R-2 had a volume average particle diameter of 165 nm that was measured using a laser diffraction/scattering-type particle diameter distribution analyzer LA-920 (manufactured by HORIBA, Ltd.).

<Preparation of Polymer Particles R-3>

Dispersion unit: the following compound B-1 (n=45): 10.0 parts, 85.0 parts of distilled water, and 240.0 parts of n-propanol were added to a four-neck flask, and the mixture was heated and stirred at 70 °C in a nitrogen atmosphere.

Then, a mixture of the following compound A-1: 20.0 parts, the following compound A-2: 70.0 parts, and 0.7 parts of 2,2'-azobisisobutyronitrile that were mixed together in advance was added dropwise for 2 hours to the four-neck flask.

After the dropwise addition ended, the reaction continued for 5 hours, then 0.5 parts of 2,2'-azobisisobutyronitrile was added thereto, and the solution was heated to 80 °C. The reaction was performed for a total of 19 hours by adding 0.4 parts of 2,2'-azobisisobutyronitrile every 6 hours.

The reaction solution was left to cool to room temperature (25 °C), thereby obtaining a dispersion (solid content 23%) of polymer particles R-3.

-continued

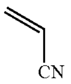

A-2

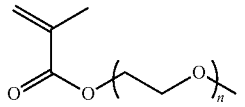

B-1

The polymer particles R-3 had a median diameter of 150 nm and a coefficient of variation of 23%.

Furthermore, the dispersibility of the polymer particles R-3 was checked by the method described above. As a result, the resin particles R-3 were found to be water-dispersible and organic solvent-dispersible particles.

<Preparation of Polymer Particles R-4>

Distilled water (350 parts), 50 parts of the compound A-1, 20 parts of the compound A-2, 20 parts of the compound A-3, and 10 parts of the compound B-1 (n=45) were added to a three-neck flask, and heated to 70 °C in a nitrogen atmosphere. Thereafter, 1.0 part of potassium persulfate (KPS) was added thereto, and the mixture was heated and stirred for 3 hours, then heated to 95 °C, and reacted for 4 hours. The reaction solution was left to cool to room temperature (25 °C), thereby obtaining an aqueous dispersion (solid content: 22%) of polymer particles R-4. The average particle diameter of the polymer particles R-4 was 142 nm.

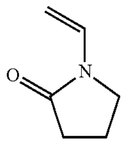

A-3

<Preparation of Polymer Particles R-5>

Deionized water (288 parts), 1.6 parts of sodium dodecylbenzenesulfonate, 0.5 parts of A-1, and 0.2 parts of A-2 were added to a three-neck flask, and the mixture was stirred and emulsified for 15 minutes at 75 °C and 200 rpm in a nitrogen atmosphere.

Potassium persulfate (KPS, 0.15 parts) and 7 parts of deionized water were added thereto, and the mixture was heated and stirred at 80 °C for 30 minutes.

A-1 (24.7 parts), 12.8 parts of A-2, and 6.7 parts of A-4 were added dropwise thereto for 3 hours, and then the mixture was continuously heated and stirred for 1 hour. The reaction solution was left to cool to room temperature (25 °C), thereby obtaining an aqueous dispersion (solid content: 13%) of polymer particles R-5. The average particle diameter of the polymer particles R-5 was 40 nm.

A-4

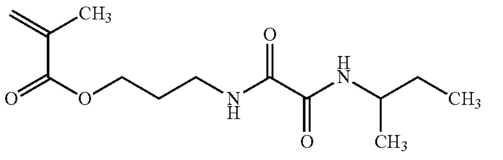

R-3

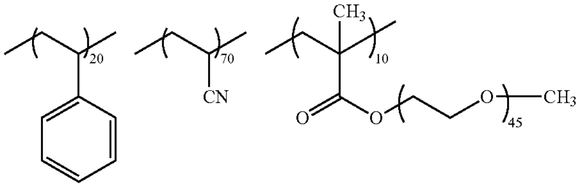

R-4

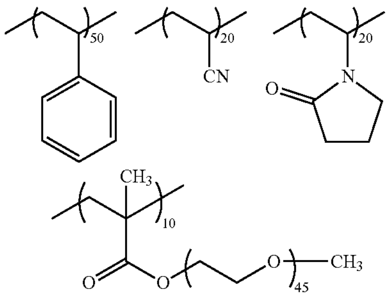

R-5

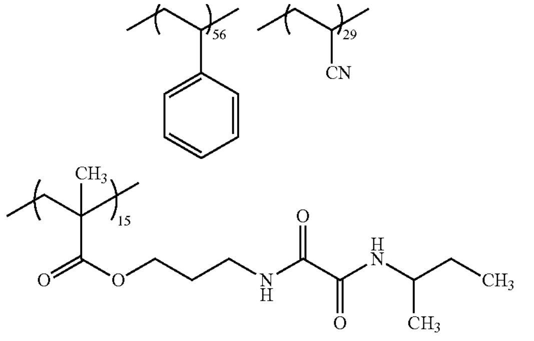

<Formation of Overcoat Layer>

The image-recording layer was bar-coated with the following coating solution (1) for an overcoat layer (here, the coating solution (1) for an overcoat layer contained the components described in Tables 5 to 8, and the solid content thereof was adjusted to 6% by mass by using deionized water), followed by drying in an oven at 120 °C for 60 seconds, thereby forming an overcoat layer having a dry coating amount described in Tables 5 to 8.

The method of preparing an inorganic lamellar compound dispersion used for the coating liquid (1) for an overcoat layer is described below.

<<Preparation of Inorganic Lamellar Compound Dispersion>>

Synthetic mica (SOMASIF ME-100 manufactured by Co-op Chemical Co., Ltd., 6.4 parts) was added to deionized water (193.6 parts) and was dispersed using a homogenizer until the average particle diameter (the laser scattering method) reached 3 μm. The aspect ratio of the obtained dispersed particles was 100 or higher.

[Color-Altering Compound]

wIR-1 to wIR-3: The following compounds wIR-1

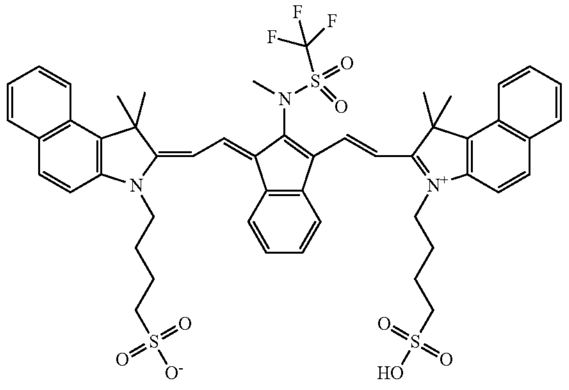

wIR-2

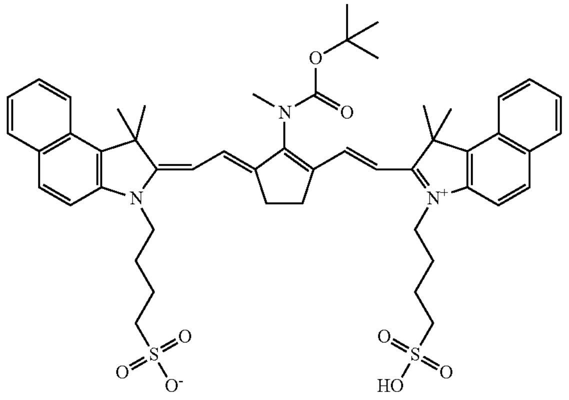

wIR-3

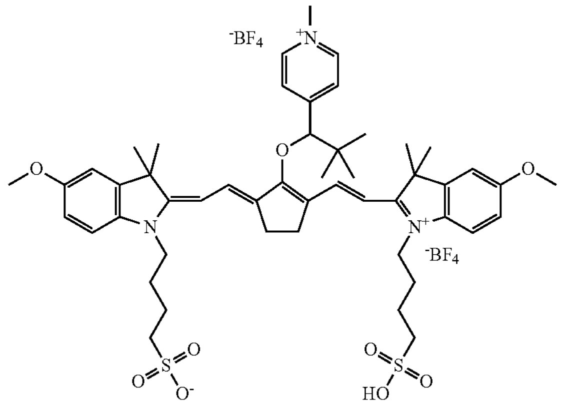

[Hydrophilic Polymer]

WP-1: Polyvinyl alcohol, manufactured by Sigma-Aldrich Co. LLC., Mowiol 4-88

WP-2: Polyvinyl alcohol, manufactured by Sigma-Aldrich Co. LLC., Mowiol 8-88

WP-3: The following resin

WP-4: Cellulose, Metrose 60SH-15 manufactured by Shin-Etsu Chemical Co., Ltd.

WP-5: Polyvinyl alcohol, GOHSENOL L-3266 manufactured by Mitsubishi Chemical Corporation, saponification degree of 86% to 89% or higher WP-6: Cellulose, Metrose SMO4 manufactured by Shin-Etsu Chemical Co., Ltd.

WP-7: The following resin (Mw: 30,000)

WP-3

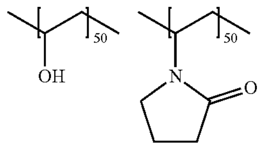

(Mw 52,000)

WP-7

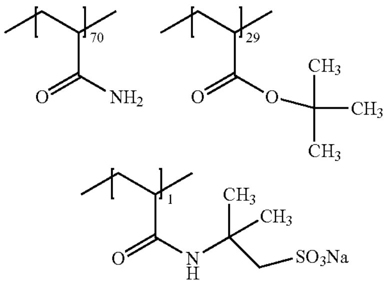

[Hydrophobic Polymer]

L-1: Aqueous polyvinylidene chloride dispersion, Diofan (registered trademark) A50 manufactured by Solvin S.A.

L-2: Styrene-acrylic resin, FS-201 manufactured by Nippon paint Industrial Coatings Co., LTD.

L-3: Styrene-acrylic resin, FS-102 manufactured by Nippon paint Industrial Coatings Co., LTD.

<Preparation of Planographic Printing Plate Precursor>

As shown in Tables 5 to 8, planographic printing plate precursors of Examples 1 to 38 and Comparative Examples 1 to 6 were prepared according to the methods of forming the support and each of the above layers.

<Evaluation of Planographic Printing Plate Precursor>

By using Magnus 800 Quantum manufactured by Kodak Japan Ltd. that was equipped with an infrared semiconductor laser, the planographic printing plate precursor prepared as above was exposed under the conditions of output of 27 W, an outer drum rotation speed of 450 rpm, and a resolution of 2,400 dots per inch (dpi, 1 inch is equal to 2.54 cm) (irradiation energy equivalent to 110 $mJ/cm^2$). The exposure images included a solid image, an amplitude modulation screen (AM screen) as a 3% halftone dot chart, and a frequency modulation screen (FM screen) as a 20% halftone dot chart.

[On-Press Developability]

The obtained exposed precursor was mounted on a Kikuban-sized cylinder of a printer SX-74 manufactured by Heidelberger Druckmaschinen AG without being developed. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T & K TOKA CO., LTD.) was used as printing ink. The dampening water and ink were supplied by a standard automatic printing start method, and then printing was performed on 500 sheets of TOKUBISHI art paper (ream weight: 76.5 kg, manufactured by MITSUBISHI PAPER MILLS LIMITED.) at a printing rate of 10,000 sheets/hour.

During the on-press development described above, the number of printing papers used until no ink was transferred to a non-image area was measured as the on-press developability. The measurement results are shown in Tables 5 to 8. It can be said that the smaller the number of printing papers, the better the on-press developability.

[Printing Durability Against Ultraviolet-Curable Ink (UV Printing Durability)]

After the on-press developability was evaluated as above, printing was continued. As the number of printing sheets increased, the image area gradually wore out, and thus the ink density on the printed matter decreased. For the AM screen 3% halftone dots in the printed matter, the area ratio of the 3% halftone dot AM screen was measured using a Gretag densitometer (manufactured by GretagMacbeth). The number of printing sheets at a point in time when the measured area ratio was 1% lower than the area ratio measured after 500 sheets were printed was adopted as the number of sheets of completed printing and used for evaluation of printing durability. The evaluation was based on relative printing durability to 100 which represents the printing durability of a planographic printing plate precursor capable of printing 50,000 sheets. The higher the numerical value, the better the printing durability. The evaluation results are shown in Tables 5 to 8.

Relative printing durability=(number of printing sheets obtained from subject planographic printing plate precursor)/50,000×100

[Receptivity (Receptivity for Special Color Ink)]

Printing was performed in the same manner as in the evaluation of UV printing durability, except that a special color ink Epple Pantone Blau 072C (an ink manufactured by Epple Druckfarben AG.) was used. The 10,000th printing sheet was sampled, and the ink density of the 20% FM half-tone dot portion was measured with a Gretag densitometer. Based on the measured density (the second decimal place was rounded off), the receptivity for a special color ink was evaluated, and the results are shown in Tables 5 to 8 by using the following indicators.

—Evaluation Standard—

A: The ink density is 1.8 to 1.9: the ink density does not decrease at all, and the ink receptivity is excellent.

B: The ink density is 1.5 to 1.7: there is a slight decrease in the ink density, but the decrease is at an acceptable level.

C: The ink density is 1.0 to 1.4: there is a marked decrease in the ink density, which is at an unacceptable level.

D: The ink density is 0.9 or less: the ink density markedly decreases and is poor.

[Dampening Water Turbidity Suppressiveness]

By using an adjustment plate (XP-F manufactured by FUJIFILM Corporation), water/ink balance was properly adjusted, and then 1,000 sheets were printed. The adjustment plate was then removed, and the blanket was washed. Subsequently, the ink pot key was set to zero. The dampening water used at the time of adjustment was discarded, and new dampening water was added. During this operation, the circulation system of dampening water was stopped, and the discharge port was closed with a rubber stopper.

Next, the following operations X1 to X3 were repeated 10 times.

X1: The prepared planographic printing plate precursor (non-exposed plate) was dampened 50 times by manual pre-damping.

X2: After 50 times of dampening, printing was performed on 100 sheets of SHIRAOI (high-quality paper, manufactured by NIPPON PAPER INDUSTRIES CO., LTD.)

X3: The plate was removed.

The printing conditions are shown below.

Printer: LITHRONE printer LS26/104 manufactured by KOMORI Corporation.

Ink: UV ink (UV CORE TYPE-AJ yellow manufactured by T & K TOKA CO., LTD.)

Dampening water: PRESSMAX S-Z1 2% (manufactured by FUJIFILM Corporation)

Pre-damping: 50 times

Then, the rubber stopper was pulled out, dampening water was collected, and the turbidity of the dampening water was evaluated based on the transparency of the dampening water. The transparency was measured according to JIS K0102 (2019) and evaluated according to the following standard. The evaluation results are shown in Tables 5 to 8.

—Evaluation Standard—

A: The transparency is 8 cm or more.

B: The transparency is 5 cm or more and less than 8 cm.

C: The transparency is less than 5 cm.

TABLE 5

| | | | Example 2 | Example 3 | Example 1 | Comparative Example 1 | Comparative Example 2 | Comparative Example 3 |
|---|---|---|---|---|---|---|---|---|
| Support | | Type | A | B | C | D | D | D |
| Undercoat layer | | Type | — | — | C | C | C | C |
| Image-recording layer | Electron-accepting polymerization initiator | Type | Int-1 | Int-1 | Int-3 | Int-3 | Int-3 | Int-3 |
| | | LUMO (eV) | −3.180 | −3.180 | −3.078 | −3.078 | −3.078 | −3.078 |
| | | Added amount | 60 | 60 | 109 | 109 | 109 | 109 |
| | Infrared absorber | Type | IR-5 | IR-10 | IR-2 IR-3 | IR-2 IR-3 | IR-2 IR-3 | IR-2 IR-3 |
| | | LUMO (eV) | −3.851 | −3.791 | −3.751 −3.777 | −3.751 −3.777 | −3.751 −3.777 | −3.751 −3.377 |
| | | HOMO (eV) | −5.469 | −5.315 | −5.352 −5.311 | −5.352 −5.311 | −3.352 −5.311 | −5.352 −5.311 |
| | | Added amount | 26 | 26 | 17.5 1.3 | 17.5 1.3 | 17.5 1.3 | 17.5 1.3 |
| | Electron-donating polymerization initiator | Type | B-1 | B-1 | B-1 | B-1 | B-1 | B-1 |
| | | HOMO (eV) | −5.903 | −5.903 | −5.903 | −5.903 | −5.903 | −5.903 |
| | | Added amount | 50 | 50 | 25 | 25 | 25 | 25 |
| | Polymerizable compound | Type | M-1/M-2 | M-1/M-2 | M-4 | M-4 | M-4 | M-4 |
| | | Added amount | 250/250 | 250/250 | 212 | 212 | 212 | 212 |
| | Polymer particles (solid content) | Type | — | — | R-1 | R-1 | R-1 | R-1 |
| | | Added amount | — | — | 400 | 400 | 400 | 400 |
| | Binder polymer | Type | P-1 | P-2 | — | — | — | — |
| | | Added amount | 150 | 150 | — | — | — | — |
| | Color developing agent | Type | — | S-5 | S-7 | S-7 | S-7 | S-7 |
| | | Added amount | — | 30 | 40 | 40 | 40 | 40 |
| | Coloring compound | Type Added amount | — | — | 1 | 1 | 1 | 1 |
| | Hydrophilic compound | Type | — | — | T-2 | T-2 | T-2 | T-2 |
| | | Added amount | — | — | 6 | 6 | 6 | 6 |
| | Oil agent | Type | O-13 | O-13 | O-13 | — | — | — |
| | | Added amount | 12.5 | 12.5 | 12.5 | — | — | — |
| | Surfactant | Type | — | — | F-2 | F-2 | F-2 | F-2 |
| | | Added amount | — | — | 4.2 | 4.2 | 4.2 | 4.2 |
| | Dry coating amount ($g/m^2$) | | 0.9 | 0.9 | 0.7 | 0.7 | 0.7 | 0.7 |
| Overcoat layer | Discoloring compound | Type | wIR-1 | wIR-1 | — | — | — | — |
| | | Added amount | 20 | 20 | — | — | — | — |
| | Hydrophilic polymer | Type | WP-1/WP-2 | WP-1/WP-2 | WP-6 | WP-6 | — | WP-7/WP-5 |
| | | Added amount | 700/200 | 700/200 | 40 | 40 | — | 550/100 |
| | Hydrophobic polymer | Type | L-1 | — | L-3 | L-3 | — | — |
| | | Added amount | 200 | — | 40 | 40 | — | — |
| | Inorganic lamellar compound dispersion | | — | — | — | — | — | 50 |

TABLE 5-continued

| | | | | | | | | |
|---|---|---|---|---|---|---|---|---|
| | Surfactant (F-1) | | 5 | 5 | 5 | 5 | — | 5 |
| | Dry coating amount ($g/m^2$) | | 1.1 | 1.1 | 0.2 | 0.2 | — | 0.15 |
| | ΔE1(eV) | | 0.67 | 0.61 | 0.67 | 0.67 | 0.67 | 0.67 |
| | ΔE2(eV) | | 0.43 | 0.59 | 0.55 | 0.55 | 0.55 | 0.55 |
| Evaluation | UV printing durability | | 105 | 100 | 130 | 115 | 65 | 135 |
| | On-press developability | | 20 | 20 | 10 | 32 | 38 | 50 |
| | Dampening water turbidity suppressiveness | | A | A | A | C | A | C |
| | Receptivity | | A | A | A | C | A | D |

| | | | Comparative Example 4 | | Example 4 | | Example 5 | Example 6 | | Example 7 | | Example 8 | |
|---|---|---|---|---|---|---|---|---|---|---|---|---|---|
| Support | | Type | D | | D | | D | D | | D | | D | |
| Undercoat layer | | Type | C | | C | | C | C | | C | | C | |
| Image-recording layer | Electron-accepting polymerization initiator | Type | Int-3 | | Int-3 | | Int-3 | Int-3 | | Int-3 | | Int-3 | |
| | | LUMO (eV) | −3.078 | | −3.078 | | −3.078 | −3.078 | | −3.078 | | −3.078 | |
| | | Added amount | 109 | | 109 | | 109 | 109 | | 109 | | 109 | |
| | Infrared absorber | Type | IR-2 | IR-3 | IR-2 | IR-3 | IR-9 | IR-2 | IR-3 | IR-2 | IR-3 | IR-2 | IR-3 |
| | | LUMO (eV) | −3.751 | −3.777 | −3.751 | −3.777 | −3.700 | −3.751 | −3.777 | −3.751 | −3.777 | −3.751 | −3.777 |
| | | HOMO (eV) | −5.352 | −5.311 | −5.352 | −5.311 | −5.280 | −5.352 | −5.311 | −5.352 | −5.311 | −5.332 | −5.311 |
| | | Added amount | 17.5 | 1.3 | 17.5 | 1.3 | 17.5 | 17.5 | 1.3 | 17.5 | 1.3 | 20 | 1.3 |
| | Electron-donating polymerization initiator | Type | — | | B-1 | | B-1 | B-1 | | B-1 | | B-1 | |
| | | HOMO (eV) | — | | −5.903 | | −5.903 | −5.903 | | −5.903 | | −5.903 | |
| | | Added amount | — | | 25 | | 20 | 10 | | 25 | | 50 | |
| | Polymerizable compound | Type | M-4 | | M-4 | | M-4 | M-3 | | M-4 | | M-4 | |
| | | Added amount | 212 | | 600 | | 212 | 300 | | 212 | | 400 | |
| | Polymer particles (solid content) | Type | R-1 | | — | | R-1 | R-3 | | R-4 | | R-5 | |
| | | Added amount | 400 | | — | | 400 | 400 | | 370 | | 270 | |
| | Binder polymer | Type | — | | — | | — | — | | P-1 | | — | |
| | | Added amount | — | | — | | — | — | | 70 | | — | |
| | Color developing agent | Type | S-7 | | S-7 | | S-7 | S-7 | | S-7 | | S-7 | |
| | | Added amount | 40 | | 40 | | 40 | 40 | | 20 | | 40 | |
| | Coloring compound | Type | 1 | | 1 | | 1 | 1 | | — | | 1 | |
| | | Added amount | | | | | | | | | | | |
| | Hydrophilic compound | Type | T-2 | | T-2 | | T-2 | T-2 | | T-1 | | T-2 | |
| | | Added amount | 6 | | 3 | | 6 | 20 | | 6 | | 35 | |
| | Oil agent | Type | — | | O-13 | | O-13 | O-1 | | O-2 | | O-3 | |
| | | Added amount | — | | 12.5 | | 12.5 | 12.5 | | 12.5 | | 12.5 | |
| | Surfactant | Type | F-2 | | F-2 | | F-2 | F-2 | | F-2 | | F-2 | |
| | | Added amount | 4.2 | | 4.2 | | 3 | 4.2 | | 4.2 | | 1 | |
| | Dry coating amount ($g/m^2$) | | 0.7 | | 0.7 | | 0.7 | 0.7 | | 0.7 | | 0.7 | |
| Overcoat layer | Discoloring compound | Type | — | | — | | — | — | | — | | — | |
| | | Added amount | — | | — | | — | — | | — | | — | |
| | Hydrophilic polymer | Type | WP-6 | | WP-6 | | WP-6 | WP-1 | | WP-2 | | WP-4 | |
| | | Added amount | 40 | | 40 | | 40 | 40 | | 40 | | 40 | |
| | Hydrophobic polymer | Type | L-3 | | L-3 | | L-3 | L-3 | | L-3 | | L-3 | |
| | | Added amount | 40 | | 40 | | 40 | 40 | | 60 | | 40 | |
| | Inorganic lamellar compound dispersion | | — | | — | | — | — | | — | | — | |

TABLE 5-continued

| | | | | | | | |
|---|---|---|---|---|---|---|---|
| | Surfactant (F-1) | 5 | 5 | 5 | 3 | 5 | 1 |
| | Dry coating amount (g/m$^2$) | 0.2 | 0.2 | 0.2 | 0.2 | 0.2 | 0.2 |
| | ΔE1(eV) | 0.67 | 0.67 | 0.62 | 0.67 | 0.67 | 0.67 |
| | ΔE2(eV) | — | 0.55 | 0.62 | 0.55 | 0.55 | 0.55 |
| Evaluation | UV printing durability | 50 | 90 | 100 | 131 | 129 | 130 |
| | On-press developability | 10 | 25 | 10 | 30 | 32 | 29 |
| | Dampening water turbidity suppressiveness | A | A | A | A | A | A |
| | Receptivity | A | A | A | A | A | A |

TABLE 6

| | | | Example 9 | | Example 10 | | Example 11 | | Example 12 | |
|---|---|---|---|---|---|---|---|---|---|---|
| Support | | Type | D | | D | | D | | A | |
| Undercoat layer | | Type | C | | C | | C | | — | |
| Image-recording layer | Electron-accepting polymerization initiator | Type | Int-3 | | Int-3 | | Int-3 | | Int-3 | |
| | | LUMO (eV) | −3.078 | | −3.078 | | −3.078 | | −3.078 | |
| | | Added amount | 109 | | 109 | | 109 | | 109 | |
| | Infrared absorber | Type | IR-2 | IR-3 | IR-2 | IR-3 | IR-2 | IR-3 | IR-2 | IR-3 |
| | | LUMO (eV) | −3.751 | −3.777 | −3.751 | −3.777 | −3.751 | −3.777 | −3.751 | −3.777 |
| | | HOMO (eV) | −5.352 | −5.311 | −5.352 | −5.311 | −5.352 | −5.311 | −5.352 | −5.311 |
| | | Added amount | 1.5 | 1.3 | 17.5 | 8 | 17.5 | 1.3 | 17.5 | 1.3 |
| | Electron-donating polymerization initiator | Type | B-1 | | B-1 | | B-1 | | B-1 | |
| | | HOMO (eV) | −5.903 | | −5.903 | | −5.903 | | −5.903 | |
| | | Added amount | 38 | | 25 | | 25 | | 25 | |
| | Polymerizable compound | Type | M-4 | | M-4 | | M-4 | | M-4 | |
| | | Added amount | 100 | | 350 | | 212 | | 212 | |
| | Polymer particles (solid content) | Type | R-1 | | R-2 | | R-1 | | R-1 | |
| | | Added amount | 550 | | 400 | | 400 | | 400 | |
| | Binder polymer | Type | — | | — | | P-3 | | — | |
| | | Added amount | — | | — | | 50 | | — | |
| | Color developing agent | Type | S-7 | | S-7 | | S-7 | | S-3 | |
| | | Added amount | 40 | | 40 | | 25 | | 40 | |
| | Coloring compound | Type | 1 | | 5 | | 1 | | 1 | |
| | | Added amount | | | | | | | | |
| | Hydrophilic compound | Type | T-3 | | T-2 | | T-2 | | T-2 | |
| | | Added amount | 6 | | 6 | | 6 | | 6 | |
| | Oil agent | Type | O-3/O-1 | | O-4 | | O-5 | | O-6 | |
| | | Added amount | 7.0/7.0 | | 12.5 | | 12.5 | | 12.5 | |
| | Surfactant | Type | F-2 | | F-2 | | F-2 | | F-2 | |
| | | Added amount | 4.2 | | 4.2 | | 4.2 | | 4.2 | |
| | Dry coating amount (g/m$^2$) | | 0.7 | | 0.7 | | 0.7 | | 0.7 | |

TABLE 6-continued

| | | | | | | | | | | |
|---|---|---|---|---|---|---|---|---|---|---|
| Overcoat layer | Discoloring compound | Type | — | | — | | — | | — | |
| | | Added amount | — | | — | | — | | — | |
| | Hydrophilic polymer | Type | WP-5 | | WP-6 | | WP-6 | | WP-3 | |
| | | Added amount | 400 | | 40 | | 40 | | 60 | |
| | Hydrophobic polymer | Type | L-1 | | L-3 | | L-3 | | L-2 | |
| | | Added amount | 20 | | 40 | | 40 | | 40 | |
| | Inorganic lamellar compound dispersion | | — | | — | | — | | — | |
| | Surfactant (F-1) | | 5 | | 4 | | 5 | | 5 | |
| | Dry coating amount ($g/m^2$) | | 0.6 | | 0.2 | | 0.2 | | 0.3 | |
| | ΔE1(eV) | | 0.67 | | 0.67 | | 0.67 | | 0.67 | |
| | ΔE2(eV) | | 0.55 | | 0.55 | | 0.55 | | 0.55 | |
| Evaluation | UV printing durability | | 132 | | 125 | | 120 | | 122 | |
| | On-press developability | | 11 | | 12 | | 35 | | 34 | |
| | Dampening water turbidity suppressiveness | | A | | A | | B | | A | |
| | Receptivity | | A | | B | | B | | B | |
| | | | Example 13 | | Example 14 | | Example 15 | | Example 16 | |
| Support | | Type | B | | C | | D | | D | |
| Undercoat layer | | Type | C | | C | | A | | B | |
| Image-recording layer | Electron-accepting polymerization initiator | Type | Int-3 | | Int-3 | | Int-3 | | Int-3 | |
| | | LUMO (eV) | −3.078 | | −3.078 | | −3.078 | | −3.078 | |
| | | Added amount | 109 | | 109 | | 90 | | 109 | |
| | Infrared absorber | Type | IR-2 | IR-3 | IR-2 | IR-3 | IR-2 | IR-3 | IR-2 | IR-3 |
| | | LUMO (eV) | −3.751 | −3.777 | −3.751 | −3.777 | −3.751 | −3.777 | −3.751 | −3.777 |
| | | HOMO (eV) | −5.352 | −5.311 | −5.352 | −5.311 | −5.352 | −5.311 | −5.352 | −5.311 |
| | | Added amount | 17.5 | 1.3 | 17.5 | 1.3 | 17.5 | 1.3 | 17.5 | 1.3 |
| | Electron-donating polymerization initiator | Type | B-1 | | B-1 | | B-1 | | B-1 | |
| | | HOMO (eV) | −5.903 | | −5.903 | | −5.903 | | −5.903 | |
| | | Added amount | 25 | | 25 | | 25 | | 25 | |
| | Polymerizable compound | Type | M-5 | | M-4 | | M-4 | | M-4 | |
| | | Added amount | 190 | | 212 | | 212 | | 212 | |
| | Polymer particles (solid content) | Type | R-1 | | R-1 | | R-1 | | R-1 | |
| | | Added amount | 400 | | 400 | | 400 | | 400 | |
| | Binder polymer | Type | — | | P-3 | | — | | — | |
| | | Added amount | — | | 100 | | — | | — | |
| | Color developing agent | Type | S-4 | | S-5 | | S-8 | | S-7 | |
| | | Added amount | 60 | | 40 | | 35 | | 40 | |
| | Coloring compound | Type | 1 | | 1 | | 1 | | 1 | |
| | | Added amount | | | | | | | | |
| | Hydrophilic compound | Type | T-2 | | T-2 | | T-2 | | T-2 | |
| | | Added amount | 6 | | 6 | | 6 | | 6 | |
| | Oil agent | Type | O-7 | | O-8 | | O-9 | | O-10 | |
| | | Added amount | 12.5 | | 12.5 | | 12.5 | | 12.5 | |
| | Surfactant | Type | F-2 | | F-3 | | F-2 | | F-2 | |
| | | Added amount | 4.2 | | 4.2 | | 4.2 | | 4.2 | |
| | Dry coating amount ($g/m^2$) | | 0.7 | | 0.7 | | 0.7 | | 0.7 | |

TABLE 6-continued

| | | | | | | |
|---|---|---|---|---|---|---|
| Overcoat layer | Discoloring compound | Type | — | — | — | — |
| | | Added amount | — | — | — | — |
| | Hydrophilic polymer | Type | WP-6 | WP-6 | WP-6 | WP-6 |
| | | Added amount | 40 | 40 | 40 | 500 |
| | Hydrophobic polymer | Type | L-3 | L-3 | L-3 | L-3 |
| | | Added amount | 30 | 40 | 40 | 40 |
| | Inorganic lamellar compound dispersion | | — | — | — | — |
| | Surfactant (F-1) | | 5 | 5 | 5 | 5 |
| | Dry coating amount (g/m$^2$) | | 0.2 | 0.2 | 0.1 | 1.2 |
| ΔE1(eV) | | | 0.67 | 0.67 | 0.67 | 0.67 |
| ΔE2(eV) | | | 0.55 | 0.55 | 0.55 | 0.55 |
| Evaluation | UV printing durability | | 110 | 113 | 116 | 132 |
| | On-press developability | | 33 | 33 | 28 | 9 |
| | Dampening water turbidity suppressiveness | | A | B | B | A |
| | Receptivity | | B | B | B | A |

| | | | Example 17 | | Example 18 | | Example 19 | Example 20 |
|---|---|---|---|---|---|---|---|---|
| Support | | Type | D | | D | | D | D |
| Undercoat layer | | Type | C | | C | | C | C |
| Image-recording layer | Electron-accepting polymerization initiator | Type | Int-3 | | Int-3 | | Int-2 | Int-3 |
| | | LUMO (eV) | −3.078 | | −3.078 | | −3.078 | −3.078 |
| | | Added amount | 150 | | 109 | | 90 | 100 |
| | Infrared absorber | Type | IR-2 | IR-3 | IR-2 | IR-3 | IR-4 | IR-6 |
| | | LUMO (eV) | −3.751 | −3.777 | −3.751 | −3.777 | −3.848 | −3.816 |
| | | HOMO (eV) | −5.352 | −5.311 | −5.352 | −5.311 | −5.425 | −5.420 |
| | | Added amount | 17.5 | 1.3 | 17.5 | 1.3 | 23 | 15 |
| | Electron-donating polymerization initiator | Type | B-1 | | B-1 | | B-1 | B-1 |
| | | HOMO (eV) | −5.903 | | −5.903 | | −5.903 | −5.903 |
| | | Added amount | 25 | | 25 | | 25 | 25 |
| | Polymerizable compound | Type | M-4 | | M-4 | | M-4 | M-4 |
| | | Added amount | 212 | | 212 | | 300 | 300 |
| | Polymer particles (solid content) | Type | R-1 | | R-1 | | R-1 | R-1 |
| | | Added amount | 400 | | 400 | | 400 | 400 |
| | Binder polymer | Type | — | | — | | — | — |
| | | Added amount | — | | — | | — | — |
| | Color developing agent | Type | S-7 | | S-7 | | S-1 | S-2 |
| | | Added amount | 40 | | 40 | | 60 | 60 |
| | Coloring compound | Type | 1 | | 1 | | — | — |
| | | Added amount | | | | | | |
| | Hydrophilic compound | Type | T-2 | | T-2 | | T-2 | T-2 |
| | | Added amount | 6 | | 6 | | 15 | 15 |
| | Oil agent | Type | O-11 | | O-12 | | O-10 | O-10 |
| | | Added amount | 12.5 | | 12.5 | | 8 | 8 |
| | Surfactant | Type | F-1 | | F-2 | | F-2 | F-2 |
| | | Added amount | 4.2 | | 4.2 | | 4.2 | 4.2 |
| | Dry coating amount (g/m$^2$) | | 0.7 | | 0.7 | | 0.9 | 0.9 |

TABLE 6-continued

| | | | | | | |
|---|---|---|---|---|---|---|
| Overcoat layer | Discoloring compound | Type | — | — | — | — |
| | | Added amount | — | — | — | — |
| | Hydrophilic polymer | Type | WP-6 | WP-6 | WP-6 | WP-6 |
| | | Added amount | 40 | 40 | 40 | 40 |
| | Hydrophobic polymer | Type | L-3 | L-3 | L-3 | L-1 |
| | | Added amount | 40 | 40 | 40 | 20 |
| | Inorganic lamellar compound dispersion | | — | — | — | — |
| | Surfactant (F-1) | | 5 | 5 | 2 | 2 |
| | Dry coating amount ($g/m^2$) | | 0.4 | 0.2 | 0.2 | 0.1 |
| | ΔE1(eV) | | 0.67 | 0.67 | 0.77 | 0.74 |
| | ΔE2(eV) | | 0.55 | 0.55 | 0.48 | 0.48 |
| Evaluation | UV printing durability | | 115 | 110 | 150 | 145 |
| | On-press developability | | 12 | 39 | 10 | 11 |
| | Dampening water turbidity suppressiveness | | A | B | A | A |
| | Receptivity | | A | C | A | A |

TABLE 7

| | | | Example 21 | Example 22 | Example 23 | Example 24 | | Example 25 |
|---|---|---|---|---|---|---|---|---|
| Support | | Type | D | D | E | D | | D |
| Undercoat layer | | Type | — | C | C | C | | C |
| Image-recording layer | Electron-accepting polymerization initiator | Type | Int-3 | Int-4 | Int-5 | Int-2 | | Int-2 |
| | | LUMO (eV) | −3.078 | −3.258 | −3.254 | −3.078 | | −3.078 |
| | | Added amount | 100 | 140 | 90 | 150 | | 90 |
| | Infrared absorber | Type | IR-7 | IR-8 | IR-4 | IR-1 | IR-3 | IR-2 |
| | | LUMO (eV) | −3.701 | −3.839 | −3.848 | −3.751 | −3.777 | −3.848 |
| | | HOMO (eV) | −5.290 | −5.429 | −5.425 | −5.352 | −5.311 | −5.425 |
| | | Added amount | 30 | 26 | 23 | 17.5 | 1.3 | 23 |
| | Electron-donating polymerization initiator | Type | B-2 | B-1 | B-1 | B-1 | | B-1 |
| | | HOMO (eV) | −5.769 | −5.903 | −5.903 | −5.903 | | −5.903 |
| | | Added amount | 25 | 10 | 25 | 25 | | 25 |
| | Polymerizable compound | Type | M-4 | M-4 | M-4 | M-4 | | M-4 |
| | | Added amount | 300 | 300 | 300 | 212 | | 300 |
| | Polymer particles (solid content) | Type | R-1 | R-1 | R-1 | R-1 | | R-1 |
| | | Added amount | 400 | 400 | 400 | 400 | | 400 |
| | Binder polymer | Type | — | — | — | — | | — |
| | | Added amount | — | — | — | — | | — |
| | Color developing agent | Type | S-1 | S-1 | S-6 | S-7 | | S-8 |
| | | Added amount | 60 | 45 | 30 | 40 | | 60 |
| | Coloring compound | Type Added amount | — | — | — | 1 | | — |
| | Hydrophilic compound | Type | T-3 | T-2 | T-1 | T-2 | | T-2 |
| | | Added amount | 15 | 15 | 15 | 6 | | 15 |
| | Oil agent | Type | O-10 | O-10 | O-10 | O-11 | | O-10 |
| | | Added amount | 8 | 8 | 8 | 12.5 | | 8 |

TABLE 7-continued

| | | | | | | | |
|---|---|---|---|---|---|---|---|
| | Surfactant | Type | F-2 | F-2 | F-2 | F-1 | F-2 |
| | | Added amount | 4.2 | 4.2 | 4.2 | 4.2 | 4.2 |
| | Dry coating amount $(g/m^2)$ | | 0.9 | 0.9 | 0.9 | 0.7 | 0.9 |
| Overcoat layer | Discoloring compound | Type | — | wIR-2 | wIR-3 | — | — |
| | | Added amount | — | 20 | 20 | — | — |
| | Hydrophilic polymer | Type | WP-6 | WP-6 | WP-6 | WP-6 | WP-6 |
| | | Added amount | 40 | 35 | 50 | 40 | 40 |
| | Hydrophobic polymer | Type | L-2 | L-3 | L-3 | L-3 | L-3 |
| | | Added amount | 60 | 40 | 40 | 40 | 40 |
| | Inorganic lamellar compound dispersion | | — | — | — | — | — |
| | Surfactant (F-1) | | 2 | 2 | 2 | 5 | 2 |
| | Dry coating amount $(g/m^2)$ | | 0.3 | 0.2 | 0.2 | 0.4 | 0.2 |
| | ΔE1(eV) | | 0.62 | 0.58 | 0.59 | 0.67 | 0.77 |
| | ΔE2(eV) | | 0.48 | 0.47 | 0.48 | 0.55 | 0.48 |
| Evaluation | UV printing durability | | 120 | 130 | 128 | 115 | 135 |
| | On-press developability | | 18 | 10 | 10 | 6 | 12 |
| | Dampening water turbidity suppressiveness | | A | A | A | A | A |
| | Receptivity | | A | A | A | A | A |

| | | | Example 26 | Example 27 | Comparative Example 5 | | Comparative Example 6 | |
|---|---|---|---|---|---|---|---|---|
| Support | | Type | D | D | D | | D | |
| Undercoat layer | | Type | C | C | C | | C | |
| Image-recording layer | Electron-accepting polymerization initiator | Type | Int-2 | Int-2 | Int-3 | | Int-3 | |
| | | LUMO (eV) | −3.078 | −3.078 | −3.078 | | −3.078 | |
| | | Added amount | 90 | 90 | 109 | | 109 | |
| | Infrared absorber | Type | IR-4 | IR-4 | IR-2 | IR-3 | IR-2 | IR-3 |
| | | LUMO (eV) | −3.848 | −3.848 | −3.751 | −3.777 | −3.751 | −3.777 |
| | | HOMO (eV) | −5.425 | −5.425 | −5.352 | −5.311 | −5.352 | −5.311 |
| | | Added amount | 23 | 23 | 17.5 | 1.3 | 17.5 | 1.3 |
| | Electron-donating polymerization initiator | Type | B-3 | B-4 | B-1 | | B-1 | |
| | | HOMO (eV) | −5.960 | −5.892 | −5.903 | | −5.903 | |
| | | Added amount | 25 | 25 | 25 | | 25 | |
| | Polymerizable compound | Type | M-4 | M-4 | M-4 | | M-4 | |
| | | Added amount | 300 | 300 | 212 | | 212 | |
| | Polymer particles (solid content) | Type | R-1 | R-1 | R-1 | | R-1 | |
| | | Added amount | 400 | 400 | 400 | | 400 | |
| | Binder polymer | Type | — | — | — | | — | |
| | | Added amount | — | — | — | | — | |
| | Color developing agent | Type | S-8 | S-8 | S-7 | | S-7 | |
| | | Added amount | 60 | 60 | 40 | | 40 | |
| | Coloring compound | Type | — | — | 1 | | 1 | |
| | | Added amount | | | | | | |
| | Hydrophilic compound | Type | T-2 | T-2 | T-2 | | T-2 | |
| | | Added amount | 15 | 15 | 6 | | 6 | |
| | Oil agent | Type | O-10 | O-10 | O-13 | | O-13 | |
| | | Added amount | 8 | 8 | 12.5 | | 12.5 | |
| | Surfactant | Type | F-2 | F-2 | F-2 | | F-2 | |
| | | Added amount | 4.2 | 4.2 | 4.2 | | 4.2 | |
| | Dry coating amount $(g/m^2)$ | | 0.9 | 0.9 | 0.7 | | 0.7 | |

TABLE 7-continued

| | | | | | | |
|---|---|---|---|---|---|---|
| Overcoat layer | Discoloring compound | Type | — | — | — | — |
| | | Added amount | — | — | — | — |
| | Hydrophilic polymer | Type | WP-6 | WP-6 | — | WP-7/WP-5 |
| | | Added amount | 40 | 40 | — | 550/100 |
| | Hydrophobic polymer | Type | L-3 | L-3 | — | — |
| | | Added amount | 40 | 40 | — | — |
| | Inorganic lamellar compound dispersion | | — | — | — | 50 |
| | Surfactant (F-1) | | 2 | 2 | — | 5 |
| | Dry coating amount ($g/m^2$) | | 0.2 | 0.2 | — | 0.15 |
| | ΔE1(eV) | | 0.77 | 0.77 | 0.67 | 0.67 |
| | ΔE2(eV) | | 0.54 | 0.47 | 0.55 | 0.55 |
| Evaluation | UV printing durability | | 125 | 126 | 67 | 132 |
| | On-press developability | | 12 | 12 | 30 | 47 |
| | Dampening water turbidity suppressiveness | | A | A | A | C |
| | Receptivity | | A | A | A | D |

TABLE 8

| | | | Example 28 | | Example 29 | | Example 30 | | Example 31 | |
|---|---|---|---|---|---|---|---|---|---|---|
| Support | | Type | C | | C | | C | | C | |
| Undercoat layer | | Type | B | | B | | B | | B | |
| Image-recording layer | Electron-accepting polymerization initiator | Type | Int-3 | | Int-3 | | Int-3 | | Int-3 | |
| | | LUMO (eV) | −3.078 | | −3.078 | | −3.078 | | −3.078 | |
| | | Added amount | 109 | | 109 | | 109 | | 109 | |
| | Infrared absorber | Type | IR-2 | IR-3 | IR-2 | IR-3 | IR-2 | IR-3 | IR-2 | IR-3 |
| | | LUMO (eV) | −3.751 | −3.777 | −3.751 | −3.777 | −3.751 | −3.777 | −3.751 | −3.777 |
| | | HOMO (eV) | −5.352 | −5.311 | −5.352 | −5.311 | −5.352 | −5.311 | −5.352 | −5.311 |
| | | Added amount | 17.5 | 1.3 | 17.5 | 1.3 | 20 | 1.3 | 17.5 | 1.3 |
| | Electron-donating polymerization initiator | Type | B-1 | | B-1 | | B-1 | | B-1 | |
| | | HOMO (eV) | −5.903 | | −5.903 | | −5.903 | | −5.903 | |
| | | Added amount | 10 | | 25 | | 50 | | 25 | |
| | Polymerizable compound | Type | M-3 | | M-4 | | M-4 | | M-4 | |
| | | Added amount | 300 | | 212 | | 400 | | 212 | |
| | Polymer particles (solid content) | Type | R-3 | | R-4 | | R-5 | | R-1 | |
| | | Added amount | 400 | | 370 | | 270 | | 400 | |
| | Binder polymer | Type | — | | P-1 | | — | | — | |
| | | Added amount | — | | 70 | | — | | — | |
| | Color developing agent | Type | S-7 | | S-7 | | S-7 | | S-7 | |
| | | Added amount | 35 | | 20 | | 40 | | 40 | |
| | Coloring compound | Type | 1 | | — | | 1 | | 1 | |
| | Hydrophilic compound | Added amount | T-2 | | T-1 | | T-2 | | T-2 | |
| | | Type | 20 | | 10 | | 35 | | 6 | |
| | Oil agent | Added amount | O-1 | | O-2 | | O-3 | | O-2 | |
| | | Type | 12.5 | | 12.5 | | 12.5 | | 12.5 | |
| | Surfactant | Added amount | F-2 | | F-2 | | F-2 | | F-2 | |
| | | Type | 4.2 | | 4.2 | | 1 | | 4.2 | |
| | Dry coating amount ($g/m^2$) | | 0.8 | | 0.8 | | 0.8 | | 0.8 | |

TABLE 8-continued

| | | | | | | |
|---|---|---|---|---|---|---|
| Overcoat layer | Discoloring compound | Type | — | — | — | — |
| | | Added amount | — | — | — | — |
| | Hydrophilic polymer | Type | WP-1 | WP-2 | WP-4 | WP-6 |
| | | Added amount | 40 | 40 | 40 | 40 |
| | Hydrophobic polymer | Type | L-3 | L-3 | L-3 | L-3 |
| | | Added amount | 40 | 60 | 40 | 60 |
| | Inorganic lamellar compound dispersion | | — | — | — | — |
| | Surfactant (F-1) | | 3 | 5 | 1 | 5 |
| | Dry coating amount ($g/m^2$) | | 0.2 | 0.2 | 0.2 | 0.2 |
| | ΔE1(eV) | | 0.67 | 0.67 | 0.67 | 0.67 |
| | ΔE2(eV) | | 0.55 | 0.55 | 0.55 | 0.55 |
| Evaluation | UV printing durability | | 141 | 121 | 130 | 134 |
| | On-press developability | | 28 | 26 | 25 | 31 |
| | Dampening water turbidity suppressiveness | | A | A | A | A |
| | Receptivity | | A | A | A | A |

| | | | Example 32 | | Example 33 | | Example 34 | | Example 35 | |
|---|---|---|---|---|---|---|---|---|---|---|
| Support | | Type | C | | C | | C | | C | |
| Undercoat layer | | Type | B | | B | | B | | B | |
| image-recording layer | Electron-accepting polymerization initiator | Type | Int-3 | | Int-3 | | Int-3 | | Int-3 | |
| | | LUMO (eV) | −3.078 | | −3.078 | | −3.078 | | −3.078 | |
| | | Added amount | 109 | | 109 | | 109 | | 90 | |
| | Infrared absorber | Type | IR-2 | IR-3 | IR-2 | IR-3 | IR-2 | IR-3 | IR-2 | IR-3 |
| | | LUMO (eV) | −3.751 | −3.777 | −3.751 | −3.777 | −3.751 | −3.777 | −3.751 | −3.777 |
| | | HOMO (eV) | −5.352 | −5.311 | −5.352 | −5.311 | −5.352 | −5.311 | −5.352 | −5.311 |
| | | Added amount | 15 | 1.3 | 17.5 | 1.3 | 17.5 | 1.3 | 17.5 | 1.3 |
| | Electron-donating polymerization initiator | Type | B-1 | | B-1 | | B-1 | | B-1 | |
| | | HOMO (eV) | −5.903 | | −5.903 | | −5.903 | | −5.903 | |
| | | Added amount | 38 | | 25 | | 25 | | 25 | |
| | Polymerizable compound | Type | M-4 | | M-4 | | M-4 | | M-4 | |
| | | Added amount | 100 | | 212 | | 212 | | 190 | |
| | Polymer particles (solid content) | Type | R-1 | | R-1 | | R-1 | | R-1 | |
| | | Added amount | 550 | | 400 | | 400 | | 400 | |
| | Binder polymer | Type | — | | P-3 | | — | | — | |
| | | Added amount | — | | 100 | | — | | — | |
| | Color developing agent | Type | S-7 | | S-5 | | S-7 | | S-8 | |
| | | Added amount | 40 | | 40 | | 40 | | 35 | |
| | Coloring compound | Type | 1 | | 1 | | 1 | | 1 | |
| | Hydrophilic compound | Added amount | T-3 | | T-2 | | T-2 | | T-2 | |
| | | Type | 6 | | 6 | | 6 | | 6 | |
| | Oil agent | Added amount | O-3/O-1 | | O-8 | | O-10 | | O-9 | |
| | | Type | 7.0/7.0 | | 12.5 | | 12.5 | | 12.5 | |
| | Surfactant | Added amount | F-2 | | F-3 | | F-2 | | F-2 | |
| | | Type | 4.2 | | 4.2 | | 4.2 | | 4.2 | |
| | Dry coating amount ($g/m^2$) | | 0.8 | | 0.8 | | 0.8 | | 0.8 | |

TABLE 8-continued

| | | | | | | |
|---|---|---|---|---|---|---|
| Overcoat layer | Discoloring compound | Type | — | — | — | — |
| | | Added amount | — | — | — | — |
| | Hydrophilic polymer | Type | WP-5 | WP-6 | WP-6 | WP-6 |
| | | Added amount | 100 | 40 | 40 | 40 |
| | Hydrophobic polymer | Type | L-1 | L-3 | L-3 | L-3 |
| | | Added amount | 20 | 40 | 60 | 40 |
| | Inorganic lamellar compound dispersion | | — | — | — | — |
| | Surfactant (F-1) | | 5 | 5 | 5 | 5 |
| | Dry coating amount ($g/m^2$) | | 0.4 | 0.2 | 0.2 | 0.1 |
| | ΔE1(eV) | | 0.67 | 0.67 | 0.67 | 0.67 |
| | ΔE2(eV) | | 0.55 | 0.55 | 0.55 | 0.55 |
| Evaluation | UV printing durability | | 132 | 113 | 114 | 110 |
| | On-press developability | | 8 | 28 | 24 | 26 |
| | Dampening water turbidity suppressiveness | | A | B | A | B |
| | Receptivity | | A | B | A | B |

| | | | Example 36 | | Example 37 | | Example 38 | |
|---|---|---|---|---|---|---|---|---|
| Support | | Type | C | | C | | C | |
| Undercoat layer | | Type | B | | B | | B | |
| image-recording layer | Electron-accepting polymerization initiator | Type | Int-3 | | Int-3 | | Int-3 | |
| | | LUMO (eV) | −3.078 | | −3.078 | | −3.078 | |
| | | Added amount | 109 | | 109 | | 109 | |
| | Infrared absorber | Type | IR-2 | IR-3 | IR-2 | IR-3 | IR-2 | IR-3 |
| | | LUMO (eV) | −3.751 | −3.777 | −3.751 | −3.777 | −3.751 | −3.777 |
| | | HOMO (eV) | −5.352 | −5.311 | −5.352 | −5.311 | −5.352 | −5.311 |
| | | Added amount | 17.5 | 1.3 | 17.5 | 1.3 | 17.5 | 1.3 |
| | Electron-donating polymerization initiator | Type | B-1 | | B-1 | | B-1 | |
| | | HOMO (eV) | −5.903 | | −5.903 | | −5.903 | |
| | | Added amount | 25 | | 25 | | 25 | |
| | Polymerizable compound | Type | M-4 | | M-4 | | M-4 | |
| | | Added amount | 190 | | 190 | | 212 | |
| | Polymer particles (solid content) | Type | R-1 | | R-1 | | R-1 | |
| | | Added amount | 400 | | 400 | | 400 | |
| | Binder polymer | Type | — | | — | | — | |
| | | Added amount | — | | — | | — | |
| | Color developing agent | Type | S-7 | | S-7 | | S-7 | |
| | | Added amount | 40 | | 40 | | 35 | |
| | Coloring compound | Type | 1 | | 1 | | 1 | |
| | Hydrophilic compound | Added amount | T-2 | | T-2 | | T-2 | |
| | | Type | 6 | | 6 | | 6 | |
| | Oil agent | Added amount | O-10 | | O-10 | | O-13 | |
| | | Type | 12.5 | | 12.5 | | 12.5 | |
| | Surfactant | Added amount | F-2 | | F-2 | | F-2 | |
| | | Type | 4.2 | | 4.2 | | 4.2 | |
| | Dry coating amount ($g/m^2$) | | 0.8 | | 0.8 | | 0.8 | |
| Overcoat layer | Discoloring compound | Type | — | | — | | — | |
| | | Added amount | — | | — | | — | |
| | Hydrophilic polymer | Type | WP-6 | | WP-6 | | WP-6 | |
| | | Added amount | 500 | | 40 | | 40 | |
| | Hydrophobic polymer | Type | L-3 | | L-3 | | L-3 | |
| | | Added amount | 40 | | 60 | | 60 | |

TABLE 8-continued

| | | | | |
|---|---|---|---|---|
| | Inorganic lamellar compound dispersion | — | — | — |
| | Surfactant (F-1) | 5 | 5 | 5 |
| | Dry coating amount ($g/m^2$) | 0.2 | 0.2 | 0.2 |
| | $\Delta E1(eV)$ | 0.67 | 0.67 | 0.67 |
| | $\Delta E2(eV)$ | 0.55 | 0.55 | 0.55 |
| Evaluation | UV printing durability | 128 | 105 | 127 |
| | On-press developability | 8 | 20 | 22 |
| | Dampening water turbidity suppressiveness | A | A | A |
| | Receptivity | A | A | A |

$\Delta E1$ represents the value of LUMO of electron-accepting polymerization initiator −LUMO of infrared absorber, and $\Delta E2$ represents the value of HOMO of infrared absorber —HOMO of electron-donating polymerization initiator.

From the results shown in Tables 5 to 8, it has been confirmed that the planographic printing plate precursors according to examples have higher UV printing durability, higher on-press developability, and higher dampening water turbidity suppressiveness, compared to the planographic printing plate precursors according to comparative examples. In addition, it has been confirmed that a planographic printing plate obtained from the planographic printing plate precursor according to the present disclosure has excellent receptivity.

The entirety of the disclosure of Japanese Patent Application No. 2021-012032 filed on Jan. 28, 2021 and the disclosure of Japanese Patent Application No. 2021-061164 filed on Mar. 31, 2021 is incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

EXPLANATION OF REFERENCES

12*a*, 12*b*: aluminum support
14: undercoat layer
16: image-recording layer
18: aluminum plate
20*a*, 20*b*: anodic oxide film
22*a*, 22*b*: micropore
24: large diameter portion
26: small diameter portion
D: depth of large diameter portion
610: anodization treatment device
612: power supply tank
614: electrolytic treatment tank
616: aluminum plate
618, 26: electrolytic solution
620: power supply electrode
622, 628: roller
624: nip roller
630: electrolysis electrode
632: cell wall
634: direct current power source

What is claimed is:

1. An on-press development type planographic printing plate precursor comprising, in the following order:

a support;

an image-recording layer; and an overcoat layer, wherein a content of an inorganic compound in the overcoat layer is zero or is more than 0% by mass and less than 1% by mass with respect to a total mass of the overcoat layer, and the image-recording layer comprises an infrared absorber, a polymerization initiator, a polymerizable compound, and an oil agent and the polymerization initiator comprises an electron-donating polymerization initiator, and the electron-donating polymerization initiator is a borate compound.

2. The on-press development type planographic printing plate precursor according to claim 1, wherein the oil agent comprises an oil agent having a boiling point of 300 °C or higher.

3. The on-press development type planographic printing plate precursor according to claim 1, wherein the oil agent comprises two or more oil agents having different structures from each other.

4. The on-press development type planographic printing plate precursor according to claim 1, wherein a clog P value of the oil agent is 5.0 or more.

5. The on-press development type planographic printing plate precursor according to claim 1, wherein the oil agent comprises an oil agent having an aromatic ring.

6. The on-press development type planographic printing plate precursor according to claim 1, wherein the oil agent comprises an oil agent having a phosphorus atom.

7. The on-press development type planographic printing plate precursor according to claim 1, wherein the value calculated by [HOMO of the infrared absorber]−[HOMO of the electron-donating polymerization initiator] is 0.70 eV or less.

8. The on-press development type planographic printing plate precursor according to claim 1, wherein the polymerization initiator comprises an electron-accepting polymerization initiator, and the value calculated by [LUMO of the electron-accepting polymerization initiator]−[LUMO of the infrared absorber] is 0.70 eV or less.

9. The on-press development type planographic printing plate precursor according to claim 1, wherein the polymerizable compound comprises a polymerizable compound having functionalities of 7 or more.

10. The on-press development type planographic printing plate precursor according to claim 1, wherein the polymerizable compound comprises a polymerizable compound having functionalities of 10 or more.

11. The on-press development type planographic printing plate precursor according to claim 1, wherein the image-recording layer further comprises polymer particles.

12. The on-press development type planographic printing plate precursor according to claim 1, wherein the overcoat layer comprises a hydrophilic polymer.

13. The on-press development type planographic printing plate precursor according to claim 1, wherein the overcoat layer further comprises a color-altering compound.

14. The on-press development type planographic printing plate precursor according to claim 13, wherein the color-altering compound comprises a decomposable compound that decomposes due to exposure to infrared.

15. The on-press development type planographic printing plate precursor according to claim 13, wherein the color-altering compound is a cyanine dye.

16. The on-press development type planographic printing plate precursor according to claim 13, wherein the color-altering compound is a compound represented by Formula 1-1:

Formula 1-1

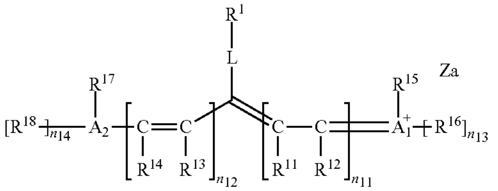

wherein in Formula 1-1, $R^1$ represents a group that is represented by any one of Formula 2-1 to Formula 4-1, $R^{11}$ to $R^{18}$ each independently represents a hydrogen atom, a halogen atom, —$R^a$, —$OR^b$, —$SR^c$, or —$NR^dR^e$, $R^a$ to $R^e$ each independently represents a hydrocarbon group, $A_1$, $A_2$, and a plurality of $R_{11}$ to $R_{18}$ may be linked to each other to form a monocyclic or polycyclic ring, $A_1$ and $A_2$ each independently represents an oxygen atom, a sulfur atom, or a nitrogen atom, $n_{11}$ and $n_{12}$ each independently represents an integer of 0 to 5, a sum of $n_{11}$ and $n_{12}$ is 2 or more, $n_{13}$ and $n_{14}$ each independently represents 0 or 1, L represents an oxygen atom, a sulfur atom, or —$NR^{10}$—, $R^{10}$ represents a hydrogen atom, an alkyl group, or an aryl group, and Za represents a counterion that neutralizes charge;

Formula 2-1

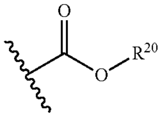

Formula 3-1

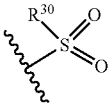

Formula 4-1

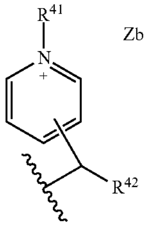

wherein in Formula 2-1 to Formula 4-1, $R^{20}$, $R^{30}$, $R^{41}$, and $R^{42}$ each independently represents an alkyl group or an aryl group, Zb represents a counterion that neutralizes charge, and a wavy line represents a bonding site with a group represented by L in Formula 1-1.

17. A method of preparing a planographic printing plate, comprising:

imagewise exposing the on-press development type planographic printing plate precursor according to claim 1; and supplying at least one selected from the group consisting of a printing ink and dampening water on a printer to remove the image-recording layer in a non-image area.

18. A planographic printing method comprising:

imagewise exposing the on-press development type planographic printing plate precursor according to claim 1;

supplying at least one selected from the group consisting of a printing ink and dampening water to remove the image-recording layer in a non-image area to prepare a planographic printing plate on a printer; and performing printing by using the obtained planographic printing plate.

* * * * *